(12) United States Patent
Nakano et al.

(10) Patent No.: US 6,701,202 B2
(45) Date of Patent: Mar. 2, 2004

(54) PERFORMANCE EVALUATION METHOD FOR PLASMA PROCESSING APPARATUS

(75) Inventors: Akira Nakano, Miyagi-ken (JP); Tadahiro Ohmi, Miyagi-ken (JP)

(73) Assignee: Alps Electric Co., Ltd, Tokyo (JP)

( * ) Notice: Subject to any disclaimer, the term of this patent is extended or adjusted under 35 U.S.C. 154(b) by 204 days.

(21) Appl. No.: 10/033,443

(22) Filed: Nov. 2, 2001

(65) Prior Publication Data

US 2002/0157608 A1 Oct. 31, 2002

(30) Foreign Application Priority Data

Nov. 6, 2000 (JP) .......................................... 2000-338246

(51) Int. Cl.⁷ ............................................... G06F 19/00
(52) U.S. Cl. ........................ 700/108; 700/109; 700/110; 700/123
(58) Field of Search .................................. 700/108, 109, 700/110, 119, 123; 324/658, 600

(56) References Cited

U.S. PATENT DOCUMENTS

| 5,472,561 A | 12/1995 | Williams et al. |
| 5,936,413 A | * 8/1999 | Booth et al. ................. 324/678 |

* cited by examiner

*Primary Examiner*—Leo Picard
*Assistant Examiner*—Michael D. Masinick
(74) *Attorney, Agent, or Firm*—Beyer Weaver & Thomas, LLP

(57) ABSTRACT

A plasma processing apparatus has a plasma processing chamber having a plasma excitation electrode, a radiofrequency generator connected to the plasma excitation electrode, and a matching circuit for matching the impedance between the plasma processing chamber and the radiofrequency generator. The loss capacitance $C_{X1}$ at a later time t1 after delivery is measured between the plasma excitation electrode and ground potential positions which are grounded. The performance is evaluated by whether or not the loss capacitance $C_{X1}$ is less than 26 times the plasma electrode capacitance $C_{e1}$ at the later time t1 between the plasma excitation electrode and a counter electrode which cooperate with each other.

10 Claims, 33 Drawing Sheets

FIG. 26

DETAILED MAINTENANCE PAGE  CP4 xxxx  K13

ELECTRICAL PERFORMANCE  K10

| $f_o$ ... | $f_e$ ... | Z ... | R ... | $C_e$ ... | $C_x$ ... |
|---|---|---|---|---|---|

MAINTENANCE HISTORY  K17

CHAMBER 1  xxxx  K13

| DATE | $f_o$ | $f_e$ | Z | R | $C_e$ | $C_x$ |
|---|---|---|---|---|---|---|
|  | MHz | MHz | Ω | Ω | pF | pF |
| 7/27 | 45.3 | 40.68 | 8 | 3.1 | 37 | 1800 |

CHAMBER 2  xxxx  K13

| $f_o$ | $f_e$ | Z | R | $C_e$ | $C_x$ |
|---|---|---|---|---|---|
| MHz | MHz | Ω | Ω | pF | pF |
| 45.3 | 40.68 | 8 | 3.1 | 37 | 1800 |

VARIATIONS  xxxx  K13

| $f_o$ | $f_e$ | Z | R | $C_e$ | $C_x$ |
|---|---|---|---|---|---|
| 0.04 | 0.05 | 0.4 | 0.3 | 0.09 | 0.02 |

PERFORMANCE EVALUATION METHOD FOR PLASMA PROCESSING APPARATUS

BACKGROUND OF THE INVENTION

1. Field of the Invention

The present invention relates generally to a plasma processing apparatus and system, a performance evaluation method therefor, a maintenance method therefor, a performance management system therefor, and a performance validation system therefor. More particularly, the present invention is directed to a technology suitable for ensuring that the plasma processing apparatus and system maintain the required level of performance even after the delivery of the apparatus and system to customers.

2. Description of the Related Art

FIG. 38 illustrates an example of a conventional dual-frequency excitation plasma processing apparatus which performs a plasma process such as a chemical vapor deposition (CVD) process, a sputtering process, a dry etching process, or an ashing process.

In the plasma processing apparatus shown in FIG. 38, a matching circuit 2A is connected between a radiofrequency generator 1 and a plasma excitation electrode 4. The matching circuit 2A matches the impedances of the radiofrequency generator 1 and the excitation electrode 4.

Radiofrequency power from the radiofrequency generator 1 is fed to the plasma excitation electrode 4 via the matching circuit 2A and a feed plate 3. The matching circuit 2A is accommodated in a matching box 2 which is a housing composed of a conductive material. The plasma excitation electrode 4 and the feed plate 3 are covered by a chassis 21 made of a conductor.

The plasma excitation electrode 4 is provided with a projection 4a at the bottom face thereof. A shower plate 5 having many holes 7 provided under the plasma excitation electrode 4 is in contact with the projection 4a. The plasma excitation electrode 4 and the shower plate 5 define a space 6. A gas feeding tube 17 composed of a conductive material is connected to the space 6. The gas feeding tube 17 is provided with an insulator 17a at the middle thereof so as to insulate the plasma excitation electrode 4 and the gas source.

Gas from the gas feeding tube 17 is fed inside a plasma processing chamber 60 comprising a chamber wall 10, via the holes 7 in the shower plate 5. An insulator 9 is disposed between the chamber wall 10 and the plasma excitation electrode 4 (cathode) to provide insulation therebetween. The exhaust system is omitted from the drawing.

A wafer susceptor (susceptor electrode) 8 which receives a substrate 16 and also serves as another plasma excitation electrode is installed inside the plasma processing chamber 60. A susceptor shield 12 is disposed under the wafer susceptor 8.

The susceptor shield 12 comprises a shield supporting plate 12A for supporting the susceptor electrode 8 and a supporting cylinder 12B extending downward from the center of the shield supporting plate 12A. The supporting cylinder 12B extends through a chamber bottom 10A, and the lower portion of the supporting cylinder 12B and the chamber bottom 10A are hermetically sealed with bellows 11.

The shaft 13 and the susceptor electrode 8 are electrically isolated from the susceptor shield 12 by a gap between the susceptor shield 12 and the susceptor electrode 8 and by insulators 12C provided around the shaft 13. The insulators 12C also serve to maintain high vacuum in the plasma processing chamber 60. The susceptor electrode 8 and the susceptor shield 12 can be moved vertically by the bellows 11 in order to control the distance between plasma excitation electrodes 4 and 8.

The susceptor electrode 8 is connected to a second radiofrequency generator 15 via the shaft 13 and a matching circuit accommodated in a matching box 14. The chamber wall 10 and the susceptor shield 12 have the same DC potential.

FIG. 39 illustrates another example of a conventional plasma processing apparatus. Unlike the plasma processing apparatus shown in FIG. 38, the plasma processing apparatus shown in FIG. 39 is of a single-frequency excitation type. In other words, a radiofrequency power is supplied only to the electrode 4 while the susceptor electrode 8 is grounded. Moreover, the matching box 14 and the second radiofrequency generator 15 shown in FIG. 38 are not provided. The susceptor electrode 8 and the chamber wall 10 have the same DC potential.

In these plasma processing apparatuses, power with a frequency of approximately 13.56 MHz is generally supplied in order to generate a plasma between the electrodes 4 and 8. A plasma process such as a plasma-enhanced CVD process, a sputtering process, a dry etching process, or an ashing process is then performed using the plasma.

The power consumption efficiency, i.e., the ratio of the power consumed in the plasma to the power supplied to the plasma excitation electrode 4, of these plasma processing apparatuses has been poor. Especially as the frequency supplied from the radiofrequency generator is elevated, the power consumption efficiency of the plasma processing apparatus has decreased significantly. Moreover, use of large size substrates has caused the power consumption efficiency to further decrease.

As a result, conventional plasma processing apparatuses have suffered from low deposition rate as a result of failing to increase the effective power consumed in the plasma space due to a low power consumption efficiency. When applied to a deposition process, for example, insulating layers with high isolation voltage can barely be formed.

The operation validation and performance evaluation of the above-described plasma processing apparatuses have been conducted by actually performing the process such as deposition and then evaluating the deposition characteristics thereof according to following Procedures:

Procedure (1) Deposition Rate and Planar Uniformity
  Step 1: Depositing a desired layer on a 6-inch substrate by a plasma-enhanced CVD process.
  Step 2: Patterning a resist layer.
  Step 3: Dry-etching the layer.
  Step 4: Removing the resist layer by ashing.
  Step 5: Measuring the surface roughness using a contact displacement meter to determine the layer thickness.
  Step 6: Calculating the deposition rate from the deposition time and the layer thickness.
  Step 7: Measuring the planar uniformity at 16 points on the substrate surface.

Procedure (2) BHF Etching Rate
  A resist mask is patterned as in Steps 1 and 2 in (1) above.
  Step 3: Immersing the substrate in a buffered hydrofluoric acid (BHF) solution for one minute to etch the layer.
  Step 4: Rinsing the substrate with deionized water, drying the substrate, and separating the resist mask using a mixture of sulfuric acid and hydrogen peroxide ($H_2SO_4+H_2O_2$).

Step 5: Measuring the surface roughness as in Step 5 in Procedure (1) to determine the layer thickness after the etching.

Step 6: Calculating the etching rate from the immersion time and the reduced layer thickness.

Procedure (3) Isolation Voltage

Step 1: Depositing a conductive layer on a glass substrate by a sputtering method and patterning the conductive layer to form a lower electrode.

Step 2: Depositing an insulating layer by a plasma-enhanced CVD method.

Step 3: Forming an upper electrode as in Step 1.

Step 4: Forming a contact hole for the lower electrode.

Step 5: Measuring the current-voltage characteristics (I–V characteristics) of the upper and lower electrodes by using probes while applying a voltage up to approximately 200 V.

Step 6: Defining the isolation voltage as the voltage V at 100 pA corresponding 1 $\mu A/cm^2$ in a 100 $\mu m$ square electrode.

The plasma processing apparatus for use in manufacturing semiconductors and liquid crystal displays has been required to achieve a higher plasma processing rate (the deposition rate or the processing speed), increased productivity, and improved planar uniformity of the plasma processing (uniformity in the distribution of the layer thickness in a planar direction and uniformity in the distribution of the process variation in the planar direction). As the size of substrates has been increasing in recent years, the requirement of planar uniformity has become tighter.

Moreover, as the size of the substrate is increased, the power required is also increased to the order of kilowatts, thus increasing the power consumption. Accordingly, as the capacity of the power supply increases, both the cost for developing the power supply and the power consumption during the operation of the apparatus are increased. In this respect, it is desirable to reduce the operation costs.

Furthermore, an increase in power consumption leads to an increase in emission of carbon dioxide which places a burden on the environment. Since the power consumption is increased by the combination of increase in the size of substrates and a low power consumption efficiency, reduction of the carbon dioxide emission is desired.

The power consumption efficiency is known to be improved by increasing the plasma excitation frequency. For example, a frequency in the VHF band of 30 MHz or more can be used to improve the efficiency instead of the conventional 13.56 MHz. Thus, one possible way to improve the deposition rate of a deposition apparatus such as a plasma-enhanced CVD apparatus is to employ a higher plasma excitation frequency.

In a plasma processing apparatus having a plurality of the above-described plasma processing chambers, i.e., a multi-chamber plasma processing apparatus, variation in plasma processing among the plasma processing chambers is required to be reduced so that the plasma processing rate (deposition rate when applied to a deposition process), productivity, and uniformity in the plasma process in the planar direction of a workpiece (planar distribution in the layer thickness) can be made substantially the same among the workpieces plasma-treated in different plasma processing chambers.

The plasma processing apparatus is also required to yield substantially the same process results by applying the same process recipe specifying external parameters for respective plasma processing chambers such as gas flow, gas pressure, power supply, and process time.

During installation or maintenance of the plasma processing apparatus, reduction in the time required for adjusting the plasma processing apparatus to achieve substantially the same process results by applying the same recipe and eliminate the variation among the plurality of plasma processing chambers has been desired. Also, reduction in the cost required for such adjustment has been desired.

Furthermore, in a plasma processing system comprising a plurality of plasma processing apparatuses, improvement in the uniformity in plasma process results among the plasma processing chambers of the apparatuses has also been desired.

The above-described plasma processing chamber is designed to use power with a frequency of approximately 13.56 MHz and is not suited for power of higher frequencies. Specifically, radiofrequency characteristics such as capacitance, impedance, and resonant frequency characteristics of the plasma processing chamber as a whole have been neglected; consequently, no improvement in the electrical consumption efficiency has been achieved even when power of a frequency higher than approximately 13.56 MHz is employed, resulting in decrease in the deposition rate rather than improvement. Moreover, although the effective power consumed in the plasma space increases as the frequency increases, the effective power starts to decrease once its peak value is reached, eventually reaching a level at which glow-discharge is no longer possible, thus rendering further increases in frequency undesirable.

Conventional plasma processing apparatuses suffer from the following disadvantages.

Conventional plasma processing apparatuses and systems are not designed to eliminate the differences in electrical radiofrequency characteristics such as impedance and resonant frequency characteristics among the plasma processing chambers constituting the plasma processing apparatus or system. Thus, the effective power consumed in the plasma generating spaces of the plasma processing chambers varies between different plasma processing chambers.

As a consequence, uniformity in plasma process results are barely achieved even when the same process recipe is applied to these plasma processing chambers.

In order to obtain uniform plasma process results, external parameters such as gas flow, gas pressure, power supply, process time, and the like must be compared with the process results according to Procedures (1) to (3) described above for each of the plasma processing chambers so as to determine the correlation between them. However, the amount of data required in such a process is enormous and it is impossible to completely carry out the comparison.

Moreover, in order to validate and evaluate the operation of the plasma processing apparatus using Procedures (1) to (3) above, the plasma processing apparatus needs to be operated and deposited substrates need to be examined by an ex-situ inspecting method requiring many steps.

Such an inspection requires several days to several weeks to yield evaluation results, which is significantly long especially when the apparatus is still in development stage. Reduction in time required for obtaining the results has been desired.

Moreover, when Procedures (1) to (3) described above are employed to inspect the plasma processing units constituting the plasma processing apparatus or system, the time required for adjusting the plasma processing units so as to eliminate the difference in performance and variation in processing among the plasma processing chambers to achieve the same process results using the same process recipe may be months. The time required for such adjustment needs to be reduced. Also, the cost of substrates for inspection, the cost of processing the substrates for inspection, the labor cost for workers involved with the adjustment, and so forth are significantly high.

As described above, while the plasma processing apparatus is required to achieve a desired performance level, a multi-chamber plasma processing apparatus and a plasma processing system having the plurality of plasma processing chambers are required to eliminate the differences in the performance of plasma process among the plurality of plasma processing chambers.

Even if the plasma processing apparatus has once been optimized as above, the plasma processing apparatus is generally disassembled before the transfer and then reassembled at the customer site. Thus, it is possible that the performance is not maintained at the level maintained before the transfer due to the vibration during the transfer and inappropriate reassembly work.

Moreover, the performances of the plasma processing chambers would deviate from the required performance level and would exhibit variation in the performance among the plasma processing chambers as plasma processes are repeated in the plasma processing apparatus after reassembly of the plasma processing apparatus. Also, when an adjustment work such as overhaul, parts replacement, and assembly with alignment is performed, the plasma processing apparatus may not be maintained at a desired level due to inappropriate adjustment or the like.

When Procedures (1) to (3) described above are employed to evaluate whether the operation of the plasma processing apparatus and the difference among the plasma processing chambers are maintained within the required levels, it becomes necessary to actually operate the plasma processing apparatus and to examine the treated substrates using an ex-situ inspection method requiring a plurality of steps.

If the performance of the plasma processing apparatus does not satisfy the required levels, long series of cycle of adjusting the plasma processing apparatus, performing a plasma process on a substrate, and evaluating the processed substrate needs to be repeated, thereby extending the initialization process of the delivered plasma processing apparatus. The length of the time required to complete the initialization process of a production line directly affects the annual sales.

Thus, it is desired that the validation of the performance of the plasma processing apparatus be performed more easily and that the cycle of fault detection and performance of corrective action be performed in a shorter period of time, so as to shorten the initialization process of the plasma processing apparatus.

SUMMARY OF THE INVENTION

It is an object of the present invention to provide a method for easily and rapidly evaluating whether a plasma processing apparatus or system is maintained at a required level of performance.

Another object of the present invention is to provide a maintenance method for easily and rapidly correcting the plasma processing apparatus or system not maintained at the required level of the performance.

Still another object of the present invention is to provide a performance management system for a plasma processing apparatus or system which maintains the performance of the apparatus or system at the required level and provides rapid maintenance services when the performance thereof does not satisfy the required level.

Yet another object of the present invention is to provide a plasma processing apparatus capable of being readily maintained at the required level of performance.

According to an aspect of the present invention, in a performance evaluation method for a plasma processing apparatus, the plasma processing apparatus comprising: a plasma processing chamber including a plasma excitation electrode for exciting a plasma; a radiofrequency feeder, the plasma excitation electrode being connected to the output end of the radiofrequency feeder; a radiofrequency generator for supplying a radiofrequency voltage to the plasma excitation electrode; and a matching circuit having an input terminal and an output terminal, the input terminal being connected to the radiofrequency generator and the output terminal being connected to the input end of the radiofrequency feeder so as to achieve impedance matching between the plasma processing chamber and the radiofrequency generator, the method comprises calculating the absolute value of the difference $\Delta C_X$ between a loss capacitance $C_{X0}$ at a time $t_0$ and a loss capacitance $C_{X1}$ at a later time $t_1$ of the plasma processing chamber, the loss capacitances $C_{X0}$ and $C_{X1}$ being measured between the plasma excitation electrode and ground potential positions which are DC-grounded; and determining that the plasma processing apparatus maintains a required level of performance when the absolute value is less than an upper limit and that the plasma processing apparatus does not maintain the required level of performance when the absolute value is not less than the upper limit.

Preferably, the upper limit is 10% of the loss capacitance $C_{X0}$. More preferably, the upper limit is 3% of the loss capacitance $C_{X0}$.

According to another aspect of the present invention, a maintenance method for a plasma processing apparatus is provided, wherein, when the absolute value of the difference $\Delta C_X$ is not less than the upper limit in the above performance evaluation method, a corrective action for the loss capacitance $C_X$ is performed.

According to another aspect of the present invention, in a performance management system for at least one plasma processing apparatus, the plasma processing apparatus comprising: a plasma processing chamber including a plasma excitation electrode for exciting a plasma; a radiofrequency feeder, the plasma excitation electrode being connected to the output end of the radiofrequency feeder; a radiofrequency generator for supplying a radiofrequency voltage to the plasma excitation electrode; and a matching circuit having an input terminal and an output terminal, the input terminal being connected to the radiofrequency generator and the output terminal being connected to the input end of the radiofrequency feeder so as to achieve impedance matching between the plasma processing chamber and the radiofrequency generator, the performance management system comprises a server for storing a loss capacitance $C_{X0}$ at a time $t_0$ between the plasma excitation electrode and ground potential positions which are DC-grounded; and a customer I/O device linked to the server via a communication line, wherein the server receives a loss capacitance $C_{X1}$ at a later time $t_1$ between the plasma excitation electrode and the ground potential positions from the customer I/O device, calculates the absolute value of the difference $\Delta C_X$ between the loss capacitance $C_{X0}$ and loss capacitance $C_{X1}$, and transmits a signal indicating that a required level of performance is maintained when the absolute value is less than an upper limit and a signal indicating that the required level of performance is not maintained when the absolute value is not less than the upper limit to the customer I/O device.

According to another aspect of the present invention, in a performance management system for at least one plasma processing apparatus, the plasma processing apparatus comprising: a plasma processing chamber including a plasma excitation electrode for exciting a plasma; a radiofrequency feeder, the plasma excitation electrode being connected to the output end of the radiofrequency feeder; a radiofrequency generator for supplying a radiofrequency voltage to the plasma excitation electrode; and a matching circuit having an input terminal and an output terminal, the input terminal being connected to the radiofrequency generator and the output terminal being connected to the input end of the radiofrequency feeder so as to achieve impedance matching between the plasma processing chamber and the radiofrequency generator, the performance management system comprises a server for storing a loss capacitance $C_{X0}$ at a time $t_0$ between the plasma excitation electrode and ground potential positions which are DC-grounded and service engineer information according to fault levels each having a predetermined range; an output device for the server, the output device being located at a delivery site; and a customer I/O device linked to the server via a communication line, wherein the server receives a loss capacitance $C_{X1}$ at a later time $t_1$ between the plasma excitation electrode and the ground potential positions from the customer I/O device, calculates the absolute value of the difference $\Delta C_X$ between the loss capacitance $C_{X0}$ and the loss capacitance $C_{X1}$, and outputs a fault level, service engineer information corresponding to the fault level, and a maintenance command corresponding to the fault level, when the absolute value falls within the fault level with the predetermined range.

According to another aspect of the present invention, a plasma processing apparatus comprises a plasma processing chamber including a plasma excitation electrode for exciting a plasma; a radiofrequency feeder, the plasma excitation electrode being connected to the output end of the radiofrequency feeder; a radiofrequency generator for supplying a radiofrequency voltage to the plasma excitation electrode; and a matching circuit having an input terminal and an output terminal, the input terminal being connected to the radiofrequency generator and the output terminal being connected to the input end of the radiofrequency feeder so as to achieve impedance matching between the plasma processing chamber and the radiofrequency generator, wherein the absolute value of the difference $\Delta C_X$ between a loss capacitance $C_{X0}$ at a time $t_0$ and a loss capacitance $C_{X1}$ at a later time $t_1$ is maintained to be less than an upper limit wherein the loss capacitances $C_{X0}$ and $C_{X1}$ are measured between the plasma excitation electrode and ground potential positions which are DC-grounded.

According to another aspect of the present invention, a performance validation system for the above plasma processing apparatus comprises a customer terminal, an engineer terminal, and information providing means, wherein the customer terminal requests browsing of performance information at the time $t_0$ and the later time $t_1$ of the plasma processing apparatus to the information providing means via a public line, the performance information is uploaded by a maintenance engineer to the information providing means through the engineer terminal, and the information providing means provides the performance information uploaded from the engineer terminal to the customer terminal upon the request from the customer terminal.

In the above aspects, the following actions performed between the time $t_0$ and the later time $t_1$ may affect the loss capacitance $C_X$; workpiece is introduced into the plasma processing chamber to plasma-treat the workpiece; an adjustment work including overhaul, parts replacement, and assembly with alignment of the plasma processing chamber is performed; and disassembly, transfer, and reassembly of the plasma processing chamber are performed.

Preferably, in the above aspects regarding the performance management system, the server stores the loss capacitance $C_{X0}$ for the identification number of the plasma processing apparatus, receives the loss capacitance $C_{X1}$ with the identification number, and calculates the difference $\Delta C_X$.

Preferably, the performance management system according to one of the above aspects further comprises a measuring device for measuring the capacitance, the measuring device being connected to both the plasma processing apparatus and the customer I/O device so that the loss capacitance $C_{X1}$ is directly transmitted from the measuring device to the server.

Preferably, the server comprises an output device at a delivery site, the output device outputting a maintenance command when the absolute value of the difference $\Delta C_X$ is not less than the upper limit.

Preferably, the server transmits the fault level to the customer I/O device.

In the above plasma processing apparatus, the absolute value of the difference $\Delta C_X$ is preferably maintained to be less than the upper limit by performing a corrective action of the plasma electrode capacitance when the absolute value of the difference $\Delta C_X$ is not less than the upper limit.

In the above performance validation system, the performance information preferably includes the loss capacitance $C_X$. Furthermore, the performance information may be output as a catalog or specifications.

According to another aspect of the present invention, in a performance evaluation method for a plasma processing apparatus which is disassembled before transfer, is transported to a customer, and is reassembled at a customer site, the plasma processing apparatus comprising: a plasma processing chamber including a plasma excitation electrode for exciting a plasma; a radiofrequency feeder, the plasma excitation electrode being connected to the output end of the radiofrequency feeder; a radiofrequency generator for supplying a radiofrequency voltage to the plasma excitation electrode; and a matching circuit having an input terminal and an output terminal, the input terminal being connected to the radiofrequency generator and the output terminal being connected to the input end of the radiofrequency feeder so as to achieve impedance matching between the plasma processing chamber and the radiofrequency generator, the method comprises determining that the plasma processing apparatus maintains a required level of performance when a loss capacitance $C_{X1}$ of the plasma processing chamber after the delivery is less than 26 times a plasma electrode capacitance $C_{e1}$ and that the plasma processing apparatus does not maintain the required level of performance when the loss capacitance $C_{X1}$ is not less than 26 times the plasma electrode loss capacitance $C_{e1}$, wherein the loss capacitance $C_{X1}$ is measured between the plasma excitation electrode and ground potential positions which are DC-grounded and the plasma electrode capacitance $C_{e1}$ is measured between the plasma excitation electrode and a counter electrode which generate a plasma in cooperation with each other.

According to another aspect of the present invention, in a performance evaluation method for a plasma processing apparatus which is disassembled before transfer, is transported to a customer, and is reassembled at a customer site, the plasma processing apparatus comprising: a plurality of plasma processing chambers including plasma excitation electrodes for exciting plasma; radiofrequency feeders, each plasma excitation electrode being connected to the output end of the corresponding radiofrequency feeder; at least one radiofrequency generator for supplying a radiofrequency voltage to the plasma excitation electrodes; and at least one matching circuit having an input terminal and an output terminal, the input terminal being connected to the radiofrequency generator and the output terminal being connected to the input end of the radiofrequency feeder so as to achieve impedance matching between the plasma processing chambers and the radiofrequency generator, the method comprises determining that the plasma processing apparatus maintains a required level of performance when a variation $C_{e1r}$, defined by $(C_{e1max}-C_{e1min})/(C_{e1max}+C_{e1min})$, between the maximum capacitance $C_{e1max}$ and the minimum capacitance $C_{e1min}$ among plasma electrode capacitances $C_{e1}$ of the plurality of plasma processing chambers is less than an upper limit and that the plasma processing apparatus does not maintain the required level of performance when the variation is not less than the upper limit, wherein the plasma electrode capacitance $C_{e1}$ is measured between the plasma excitation electrode and a counter electrode which generate a plasma in cooperation with each other; and determining that the plasma processing apparatus maintains a required level of performance when a variation $C_{X1r}$, defined by $(C_{X1max}-C_{X1min})/(C_{X1max}+C_{X1min})$, between the maximum capacitance $C_{X1max}$ and the minimum capacitance $C_{X1min}$ among loss capacitances $C_{X1}$ of the plurality of plasma processing chambers is less than an upper limit and that the plasma processing apparatus does not maintain the required level of performance when the variation is not less than the upper limit, wherein the loss capacitance $C_{X1}$ is measured between the plasma excitation electrode and ground potential positions which are DC-grounded.

According to another aspect of the present invention, in a performance evaluation method for a plasma processing apparatus which is disassembled before transfer, is transported to a customer, and is reassembled at a customer site, the plasma processing apparatus comprising: a plurality of plasma processing chambers including plasma excitation electrodes for exciting plasma; radiofrequency feeders, each plasma excitation electrode being connected to the output end of the corresponding radiofrequency feeder; at least one radiofrequency generator for supplying a radiofrequency voltage to the plasma excitation electrodes; and at least one matching circuit having an input terminal and an output terminal, the input terminal being connected to the radiofrequency generator and the output terminal being connected to the input end of the radiofrequency feeder so as to achieve impedance matching between the plasma processing chambers and the radiofrequency generator, the method comprises determining that the plasma processing apparatus maintains a required level of performance when a variation $C_{e1r}$, defined by $(C_{e1max}-C_{e1min})/(C_{e1max}+C_{e1min})$, between the maximum capacitance $C_{e1max}$ and the minimum capacitance $C_{e1min}$ among plasma electrode capacitances $C_{e1}$ of the plurality of plasma processing chambers is less than an upper limit and that the plasma processing apparatus does not maintain the required level of performance when the variation is not less than the upper limit, wherein the plasma electrode capacitance $C_{e1}$ is measured between the plasma excitation electrode and a counter electrode which generate a plasma in cooperation with each other; and determining that the plasma processing apparatus maintains a required level of performance when a variation $C_{X1r}$, defined by $(C_{X1max}-C_{X1min})/(C_{X1max}+C_{X1min})$, between the maximum capacitance $C_{X1max}$ and the minimum capacitance $C_{X1min}$ among loss capacitances $C_{X1}$ of the plurality of plasma processing chambers is less than an upper limit and when all the loss capacitances $C_{X1}$ are less than 26 times the plasma electrode capacitance $C_{e1}$ and that the plasma processing apparatus does not maintain the required level of performance when the variation is not less than the upper limit or when one of the loss capacitances $C_{X1}$ is not less than 26 times the plasma electrode capacitance $C_{e1}$, wherein the loss capacitance $C_{X1}$ is measured between the plasma excitation electrode and ground potential positions which are DC-grounded.

According to another aspect of the present invention, in a performance evaluation method for a plasma processing system which is disassembled before transfer, is transported to a customer, and is reassembled at a customer site, the plasma processing system comprising a plurality of plasma processing apparatuses, each comprising: a plasma processing chamber including a plasma excitation electrode for exciting a plasma; a radiofrequency feeder, the plasma excitation electrode being connected to the output end of the radiofrequency feeder; a radiofrequency generator for supplying a radiofrequency voltage to the plasma excitation electrode; and a matching circuit having an input terminal and an output terminal, the input terminal being connected to the radiofrequency generator and the output terminal being connected to the input end of the radiofrequency feeder so as to achieve impedance matching between the plasma processing chamber and the radiofrequency generator, the method comprises determining that the plasma processing system maintains a required level of performance when a variation $C_{e1r}$, defined by $(C_{e1max}-C_{e1min})/(C_{e1max}+C_{e1min})$, between the maximum capacitance $C_{e1max}$ and the minimum capacitance $C_{e1min}$ among plasma electrode capacitances $C_{e1}$ of the plurality of plasma processing apparatuses is less than an upper limit and that the plasma processing system does not maintain the required level of performance when the variation is not less than the upper limit, wherein the plasma electrode capacitance $C_{e1}$ is measured between the plasma excitation electrode and a counter electrode which generate a plasma in cooperation with each other; and determining that the plasma processing system maintains a required level of performance when a variation $C_{X1r}$, defined by $(C_{X1max}-C_{X1min})/(C_{X1max}+C_{X1min})$, between the maximum capacitance $C_{X1max}$ and the minimum capacitance $C_{X1min}$ among loss capacitances $C_{X1}$ of the plurality of plasma processing apparatuses is less than an upper limit and that the plasma processing system does not maintain the required level of performance when the variation is not less than the upper limit, wherein the loss capacitance $C_{X1}$ is measured between the plasma excitation electrode and ground potential positions which are DC-grounded.

According to another aspect of the present invention, in a performance evaluation method for a plasma processing system which is disassembled before transfer, is transported to a customer, and is reassembled at a customer site, the plasma processing system comprising a plurality of plasma processing apparatuses, each comprising: a plasma processing chamber including a plasma excitation electrode for exciting a plasma; a radiofrequency feeder, the plasma excitation electrode being connected to the output end of the radiofrequency feeder; a radiofrequency generator for supplying a radiofrequency voltage to the plasma excitation electrode; and a matching circuit having an input terminal and an output terminal, the input terminal being connected to the radiofrequency generator and the output terminal being connected to the input end of the radiofrequency feeder so as to achieve impedance matching between the plasma processing chamber and the radiofrequency generator, the method comprises determining that the plasma processing system maintains a required level of performance when a variation $C_{e1r}$, defined by $(C_{e1max}-C_{e1min})/(C_{e1max}+C_{e1min})$, between the maximum capacitance $C_{e1max}$ and the minimum capacitance $C_{e1min}$ among plasma electrode capacitances $C_{e1}$ of the plurality of plasma processing apparatuses is less than an upper limit and that the plasma processing system does not maintain the required level of performance when the variation is not less than the upper limit, wherein the plasma electrode capacitance $C_{e1}$ is measured between the plasma excitation electrode and a counter electrode which generate a plasma in cooperation with each other; and determining that the plasma processing apparatus maintains a required level of performance when a variation $C_{X1r}$, defined by $(C_{X1max}-C_{X1min})/(C_{X1max}+C_{X1min})$, between the maximum capacitance $C_{X1max}$ and the minimum capacitance $C_{X1min}$ among loss capacitances $C_{X1}$ of the plurality of plasma processing chambers is less than an upper limit and when all the loss capacitances $C_{X1}$ are less than 26 times the plasma electrode capacitance $C_{e1}$ and that the plasma processing apparatus does not maintain the required level of performance when the variation is not less than the upper limit or when one of the loss capacitances $C_{X1}$ is not less than 26 times the plasma electrode capacitance $C_{e1}$, wherein the loss capacitance $C_{X1}$ is measured between the plasma excitation electrode and ground potential positions which are DC-grounded.

According to another aspect of the present invention, in a performance management system for a plasma processing apparatus which is disassembled before transfer, is transported to a customer, and is reassembled at a customer site, the plasma processing apparatus comprising: a plasma processing chamber including a plasma excitation electrode for exciting a plasma; a radiofrequency feeder, the plasma excitation electrode being connected to the output end of the radiofrequency feeder; a radiofrequency generator for supplying a radiofrequency voltage to the plasma excitation electrode; and a matching circuit having an input terminal and an output terminal, the input terminal being connected to the radiofrequency generator and the output terminal being connected to the input end of the radiofrequency feeder so as to achieve impedance matching between the plasma processing chamber and the radiofrequency generator, the performance management system comprises a server; and a customer I/O device linked to the server via a communication line, wherein the server receives a loss capacitance $C_{X1}$ and a plasma electrode capacitance $C_{e1}$ after the delivery from the customer I/O device and transmits a signal indicating that a required level of performance is maintained when the loss capacitance $C_{X1}$ is less than 26 times the plasma electrode capacitance $C_{e1}$ and a signal indicating that the required level of performance is not maintained when the loss capacitance $C_{X1}$ is not less than 26 times the plasma electrode capacitance $C_{e1}$ to the customer I/O device, wherein the loss capacitance $C_{X1}$ is measured between the plasma excitation electrode and ground potential positions which are DC-grounded and the plasma electrode capacitance $C_{e1}$ is measured between the plasma excitation electrode and a counter electrode which generate a plasma in cooperation with each other.

According to another aspect of the present invention, in a performance management system for a plasma processing apparatus which is disassembled before transfer, is transported to a customer, and is reassembled at a customer site, the plasma processing apparatus comprising: a plurality of plasma processing chambers including plasma excitation electrodes for exciting plasma; radiofrequency feeders, each plasma excitation electrode being connected to the output end of the corresponding radiofrequency feeder; at least one radiofrequency generator for supplying a radiofrequency voltage to the plasma excitation electrodes; and at least one matching circuit having an input terminal and an output terminal, the input terminal being connected to the radiofrequency generator and the output terminal being connected to the input end of the radiofrequency feeder so as to achieve impedance matching between the plasma processing chambers and the radiofrequency generator, the system comprises a server; and a customer I/O device linked to the server via a communication line, wherein the server receives a loss capacitance $C_{X1}$ and a plasma electrode capacitance $C_{e1}$ after the delivery of each plasma processing chamber from the customer I/O device and transmits a signal indicating that a required level of performance is maintained when the loss capacitance $C_{X1}$ is less than 26 times the plasma electrode capacitance $C_{e1}$ and a signal indicating that the required level of performance is not maintained when the loss capacitance $C_{X1}$ is not less than 26 times the plasma electrode capacitance $C_{e1}$ to the customer I/O device, wherein the loss capacitance $C_{X1}$ is measured between the plasma excitation electrode and ground potential positions which are DC-grounded and the plasma electrode capacitance $C_{e1}$ is measured between the plasma excitation electrode and a counter electrode which generate a plasma in cooperation with each other.

According to another aspect of the present invention, in a performance management system for a plasma processing apparatus which is disassembled before transfer, is transported to a customer, and is reassembled at a customer site, the plasma processing apparatus comprising: a plurality of plasma processing chambers including plasma excitation electrodes for exciting plasma; radiofrequency feeders, each plasma excitation electrode being connected to the output end of the corresponding radiofrequency feeder; at least one radiofrequency generator for supplying a radiofrequency voltage to the plasma excitation electrodes; and at least one matching circuit having an input terminal and an output terminal, the input terminal being connected to the radiofrequency generator and the output terminal being connected to the input end of the radiofrequency feeder so as to achieve impedance matching between the plasma processing chambers and the radiofrequency generator, the system comprises a server comprising an output device; and a customer I/O device linked to the server via a communication line, wherein the server receives data of identification numbers and plasma electrode capacitances $C_{e1}$ of the plasma processing chambers after the delivery from the customer I/O device, and outputs the identification numbers and a maintenance command through the output device when a variation $C_{e1r}$, defined by $(C_{e1max}-C_{e1min})/(C_{e1max}+C_{e1min})$, between the maximum capacitance $C_{e1max}$ and the minimum capacitance $C_{e1min}$ among capacitances $C_{e1}$ is not less than an upper limit, wherein each capacitance $C_{e1}$ is measured between the plasma excitation electrode and a counter electrode which generate a plasma in cooperation with each other, and wherein the server receives data of identification numbers and loss capacitances $C_{X1}$ of the plasma processing chambers after the delivery from the customer I/O device, and outputs the identification numbers and a maintenance command through the output device when a variation $C_{X1r}$, defined by $(C_{X1max} - C_{X1min})/(C_{X1max} + C_{X1min})$, between the maximum capacitance $C_{X1max}$ and the minimum capacitance $C_{X1min}$ among loss capacitances $C_{X1}$ is not less than an upper limit, wherein each loss capacitance $C_{X1}$ is measured between the plasma excitation electrode and ground potential positions which are DC-grounded.

According to another aspect of the present invention, in a performance management system for a plasma processing system which is disassembled before transfer, is transported to a customer, and is reassembled at a customer site, the plasma processing system comprising a plurality of plasma processing apparatuses, each comprising: a plasma processing chamber including a plasma excitation electrode for exciting a plasma; a radiofrequency feeder, the plasma excitation electrode being connected to the output end of the radiofrequency feeder; a radiofrequency generator for supplying a radiofrequency voltage to the plasma excitation electrode; and a matching circuit having an input terminal and an output terminal, the input terminal being connected to the radiofrequency generator and the output terminal being connected to the input end of the radiofrequency feeder so as to achieve impedance matching between the plasma processing chamber and the radiofrequency generator, the performance management system comprises a server; and a customer I/O device linked to the server via a communication line, wherein the server receives a loss capacitance $C_{X1}$ and a plasma electrode capacitance $C_{e1}$ after the delivery from the customer I/O device and transmits a signal indicating that a required level of performance is maintained when the loss capacitance $C_{X1}$ is less than 26 times the plasma electrode capacitance $C_{e1}$ and a signal indicating that the required level of performance is not maintained when the loss capacitance $C_{X1}$ is not less than 26 times the plasma electrode capacitance $C_{e1}$ to the customer I/O device, wherein the loss capacitance $C_{X1}$ is measured between the plasma excitation electrode and ground potential positions which are DC-grounded and the plasma electrode capacitance $C_{e1}$ is measured between the plasma excitation electrode and a counter electrode which generate a plasma in cooperation with each other.

According to another aspect of the present invention, in a performance management system for a plasma processing system which is disassembled before transfer, is transported to a customer, and is reassembled at a customer site, the plasma processing system comprising a plurality of plasma processing apparatuses, each comprising: a plasma processing chamber including a plasma excitation electrode for exciting a plasma; a radiofrequency feeder, the plasma excitation electrode being connected to the output end of the radiofrequency feeder; a radiofrequency generator for supplying a radiofrequency voltage to the plasma excitation electrode; and a matching circuit having an input terminal and an output terminal, the input terminal being connected to the radiofrequency generator and the output terminal being connected to the input end of the radiofrequency feeder so as to achieve impedance matching between the plasma processing chamber and the radiofrequency generator, the performance management system comprises: a server; and a customer I/O device linked to the server via a communication line, wherein the server receives data of identification numbers and plasma electrode capacitances $C_{e1}$ of the plasma processing chambers after the delivery from the customer I/O device, and outputs the identification numbers and a maintenance command through the output device when a variation $C_{e1r}$, defined by $(C_{e1max} - C_{e1min})/(C_{e1max} + C_{e1min})$, between the maximum capacitance $C_{e1max}$ and the minimum capacitance $C_{e1min}$ among capacitances $C_{e1}$ is not less than an upper limit, wherein each capacitance $C_{e1}$ is measured between the plasma excitation electrode and a counter electrode which generate a plasma in cooperation with each other; and wherein the server receives data of identification numbers and loss capacitances $C_{X1}$ of the plasma processing chambers after the delivery from the customer I/O device, and outputs the identification numbers and a maintenance command through the output device when a variation $C_{X1r}$, defined by $(C_{X1max} - C_{X1min})/(C_{X1max} + C_{X1min})$, between the maximum capacitance $C_{X1max}$ and the minimum capacitance $C_{X1min}$ among loss capacitances $C_{X1}$ is not less than an upper limit, wherein each loss capacitance $C_{X1}$ is measured between the plasma excitation electrode and ground potential positions which are DC-grounded.

According to another aspect of the present invention, a performance validation system for a plasma processing apparatus comprises a customer terminal, an engineer terminal, and information providing means, wherein the customer terminal requests browsing of performance information to the information providing means via a public line, the performance information including the operational state of the plasma processing apparatus which is disassembled before transfer, is transported to a customer, and is reassembled at a customer site and which is controlled by the above-mentioned performance management system, the performance information is uploaded by a maintenance engineer to the information providing means through the engineer terminal, and the information providing means provides the performance information uploaded from the engineer terminal to the customer terminal upon the request from the customer terminal.

Preferably, in the above aspects, both the upper limits for the variation $C_{e1r}$ and the variation $C_{X1r}$ are 0.1. More preferably, both the upper limits for the variation $C_{e1r}$ and the variation $C_{X1r}$ are 0.03.

In the performance management system for a plasma processing apparatus according to one of the above aspects, the server preferably comprises an output device at a delivery site, the output device outputting a maintenance command when the loss capacitance $C_{X1}$ is not less than 26 times the plasma electrode capacitance $C_{e1}$ in any one of the plurality of the plasma processing chamber.

In the performance validation system according to one of the above aspects, the performance information preferably includes the plasma electrode capacitance $C_e$ and the loss capacitance $C_X$. Furthermore, the performance information may be output as a catalog or specifications.

According to the performance evaluation method for a plasma processing apparatus or system of this invention, whether the plasma processing apparatus or system exhibits a required performance level can be readily and rapidly inspected after the reassembly of the plasma processing apparatus previously disassembled for the purpose of transfer, after performance of plasma treatments, or after adjustment works such as overhaul, parts replacement, and assembly with alignment.

According to a maintenance method for the plasma processing apparatus of this invention, a defective plasma processing apparatus can be readily and rapidly corrected to the desired performance level.

According to the performance management system for the plasma processing apparatus or system of this invention, the plasma processing apparatus can be managed to be at the required performance level from the delivery site as well as the customer site. Thus, a manufacturer or a maintenance company can provide better maintenance service to customers.

Furthermore, the plasma processing apparatus of this invention can be easily maintained to be at the required performance level so as to continuously perform satisfactory plasma processes.

BRIEF DESCRIPTION OF THE DRAWINGS

FIG. 26 shows an output form of a subpage CP4 in accordance with the performance validation system of the plasma processing apparatus of the present invention;

DESCRIPTION OF THE PREFERRED EMBODIMENTS

Figure 1:
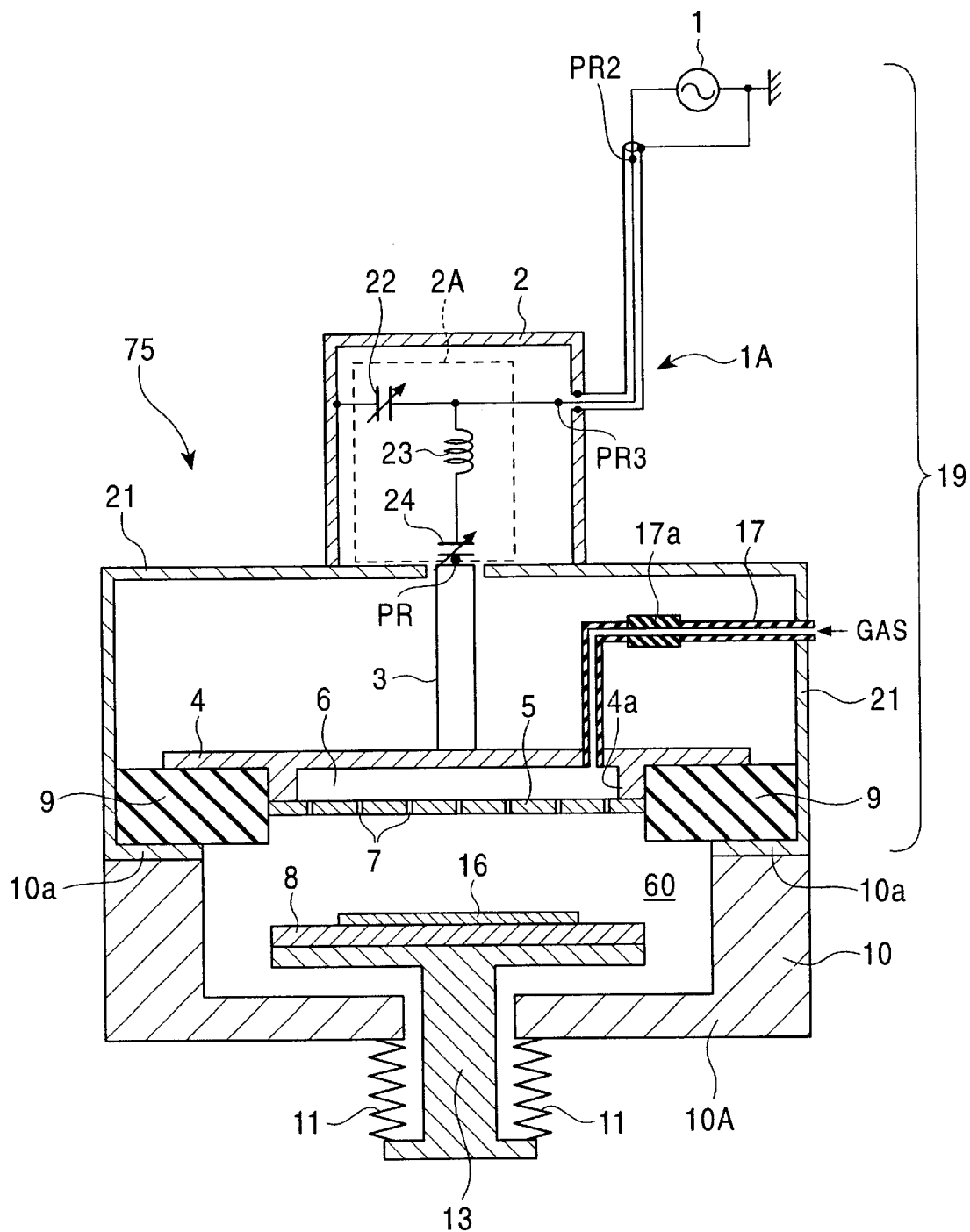
FIG. 1 is a cross-sectional view of the outline of the structure of a plasma processing apparatus according to the first embodiment.

The present invention will now be described in detail.

In the present invention, the loss capacitance $C_X$ between the plasma excitation electrode connected to a radiofrequency generator and ground potential positions which are DC-grounded is used as an evaluation parameter. The loss capacitance $C_X$ has a close connection with performance of the plasma processing apparatus, for example, effective power consumption in a plasma space and significantly varies by misalignment in assembling or reassembling and contamination during operation of the apparatus. Furthermore, the loss capacitance $C_X$ significantly varies by vibration during transportation.

The present inventors have found that the absolute value of the difference $\Delta C_X$ between a loss capacitance $C_{X1}$ at a later time t1 and a loss capacitance $C_{X0}$ at a time $t_0$ has a close connection with the variation in the performance of the plasma processing apparatus and that this variation falls within a certain range when the absolute value is less than a certain value. Thus, the plasma processing apparatus can be evaluated by comparing the absolute value of the difference $\Delta C_X$ with the certain value.

Accordingly, the comparison of the absolute value of the difference $\Delta C_X$ with the certain value can evaluate whether or not the plasma processing chamber maintains a required level of performance in installation, use, and overhauling and inspection of the plasma processing apparatus and whether or not a plurality of plasma processing chambers in the plasma processing apparatus has a small difference in performance.

Since the loss capacitance $C_X$ can be readily measured, the evaluation can be achieved with a significantly reduced measurement time compared with conventional inspection methods by actual deposition onto substrates. Moreover, this measurement method has high productivity with reduced expenses for substrates used in the inspection, processing of these substrates, and labor during the inspection operations.

Accordingly, the performance evaluation method in accordance with the present invention can rapidly evaluate the performance of a plasma processing apparatus with reduced cost. When the plasma processing apparatus includes a plurality of plasma processing chambers, the same layer deposition is achieved using the same process recipe in these plasma processing chambers under the control of the loss capacitance $C_X$. When layers are continuously formed in these plasma processing chambers, these layers can have substantially the same characteristics, e.g., the thickness, the isolation voltage, and the etching rate.

Moreover, this performance evaluation method does not require a large evaluation cost; hence, the performance evaluation can be performed at a required time and the results can be immediately fed back to a corrective action.

The performance evaluation method in accordance with the present invention can also rapidly evaluate the performance of a plasma processing system with reduced cost. Since the plasma processing system includes a plurality of plasma processing chambers, the same layer deposition is achieved using the same process recipe in these plasma processing chambers under the control of the loss capacitance $C_X$. When layers are continuously formed in these plasma processing chambers, these layers can have substantially the same characteristics, e.g., the thickness, the isolation voltage, and the etching rate.

According to the performance management system for the plasma processing apparatus or system of the present invention, customers can readily obtain the results of the performance evaluation from a server which is controlled by the manufacturer. Moreover, the customers can readily obtain the information about differences in characteristics between plasma processing chambers of the plasma processing system.

Since the plasma processing apparatus is maintained at a satisfactory level by the loss capacitance $C_X$ which can be easily measured at any time, the plasma treatment will be satisfactorily achieved.

According to the performance validation system for the plasma processing apparatus of the present invention, customers can obtain the operational statuses of their own plasma processing apparatuses from a server controlled by a maintenance engineer.

Thus, in the present invention, the plasma processing apparatus can be maintained at a satisfactory level by a corrective action which is performed before the plasma processing apparatus yields problematic results.

Moreover, substantially the same results can always be obtained by the same process recipe for the plasma processing chamber. When layers are continuously deposited in the processing chamber, these layers will have substantially the same characteristics, e.g., the thickness, the isolation voltage, and the etching rate.

When the plasma processing apparatus or system includes a plurality of plasma processing chambers, each plasma processing chamber can be controlled using the loss capacitance $C_X$ thereof.

In the present invention, the loss capacitance $C_X$ is set such that the loss capacitance $C_X$ is less than 26 times the plasma electrode capacitance $C_e$ between two electrodes. Since the shunt component of the current from the radiofrequency generator is reduced, the input power can be effectively consumed in the plasma chamber. Thus, the effective power consumption in the plasma space is achieved compared with conventional plasma processing apparatuses when the same frequency is supplied. In a layer deposition process, the deposition rate will be improved.

Supposing the imaginary unit being j ($j^2=-1$) and the angular frequency being $\omega$ ($\omega=2\pi f_e$ wherein $f_e$ is a power frequency), the impedance Z ($\Omega$) is represented by relationship (11):

$$Z \propto -j/\omega C \qquad (11)$$

wherein C is the capacitance. Thus, the impedance can be determined by defining the capacitance. Since the current I is in inverse proportion to the impedance Z ($\Omega$), the plasma current $I_e$ flowing in the plasma space can be increased due to an increased impedance for the ground potential positions when a radiofrequency power of 13.56 MHz or more is used.

Since the loss capacitance $C_X$ is radiofrequency characteristics mainly depending on the mechanical structure, the individual plasma processing chambers have different values. By controlling the loss capacitance $C_X$ to the above-described conditions, the overall radiofrequency characteristics of the plasma processing chambers can be optimized, achieving stable plasma generation. As a result, an increase in the loss current $I_x$ relative to the plasma current $I_e$ can be suppressed, preventing power consumption loss and decreased plasma density in the plasma space.

Accordingly, the loss capacitance $C_X$ is useful as a parameter for evaluating the stability of the plasma generated in the plasma space and the uniformity of the operation.

Preferably, the loss capacitance $C_X$ is set such that the loss capacitance $C_X$ is less than 7 times the plasma electrode capacitance $C_e$ in the present invention. Since the shunt component of the current to the ground potential positions is further reduced, the input power can be more effectively consumed in the plasma chamber, resulting in an improved processing rate. In the layer deposition process, layers having improved characteristics can be formed at improved deposition rates. For example, an insulating layer deposited in the present invention exhibits a high isolation voltage. Since the radiofrequency current is concentrated between the two electrodes, the radiofrequency power is more effectively consumed in the plasma space. Thus, the resulting layer has planar uniformity, namely, reduced variations in thickness and isolation voltage in the planar direction.

More preferably, the loss capacitance $C_X$ is set such that the loss capacitance $C_X$ is less than 5 times the plasma electrode capacitance $C_e$ in the present invention. Since the shunt component of the current to the ground potential positions is further reduced, the input power can be more effectively consumed in the plasma chamber, resulting in reduced power consumption and operational cost. In the layer deposition process, layers having improved characteristics can be formed at improved deposition rates. In the layer deposition, the resulting layer has planar uniformity, namely, reduced variations in thickness and isolation voltage in the planar direction.

The loss capacitance $C_X$ will now be described.

Figure 8:
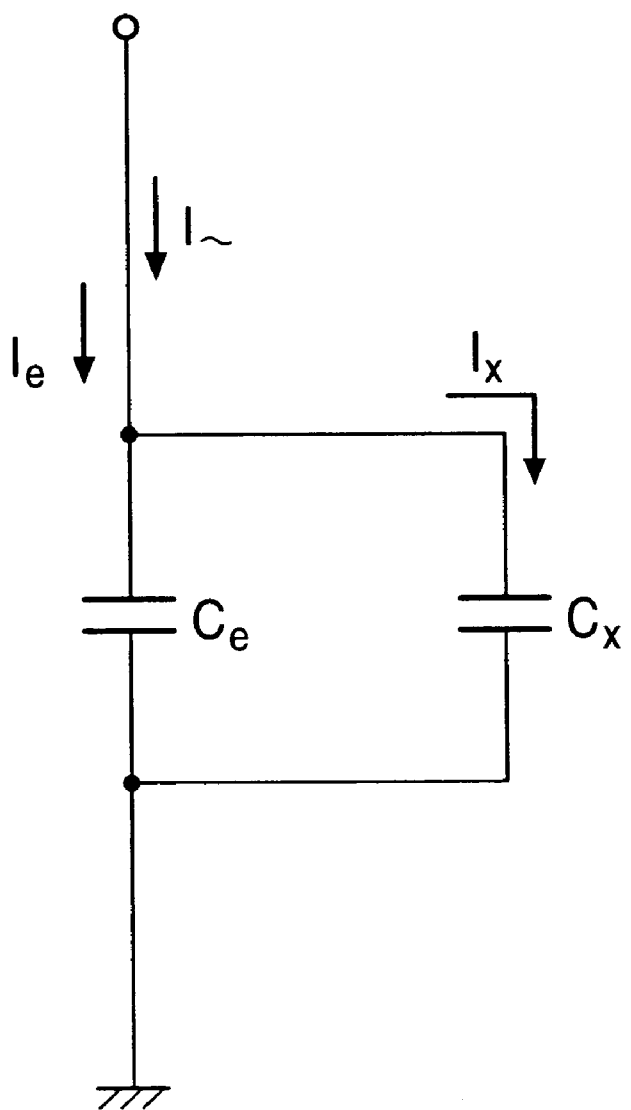
FIG. 8 is a circuit diagram illustrating the relationship between a supplied current $I_-$, a plasma current $I_e$, and a loss current $I_x$.

As shown in FIG. 8, the current $I_\_$ supplied from a radiofrequency generator is divided into a plasma current $I_e$ which flows in a plasma space formed between the parallel plate electrodes constituting the plasma electrode capacitance $C_e$ and a loss current $I_x$ which is a shunt component flowing into the other portions. In other words, the loss capacitance $C_X$ is the sum of the capacitance components which are generated between the plasma excitation electrode connected to the radiofrequency generator and the ground potential positions and does not include the plasma electrode capacitance $C_e$.

The range for measuring the loss capacitance $C_X$ will now be described.

As shown in FIG. 1, the plasma electrode capacitance $C_e$ is measured between parallel plate electrodes 4 and 8, and the loss capacitance $C_X$ of the plasma processing chamber 95 means that of an upper component 19 which is measured at the output terminal position PR.

Figure 2:
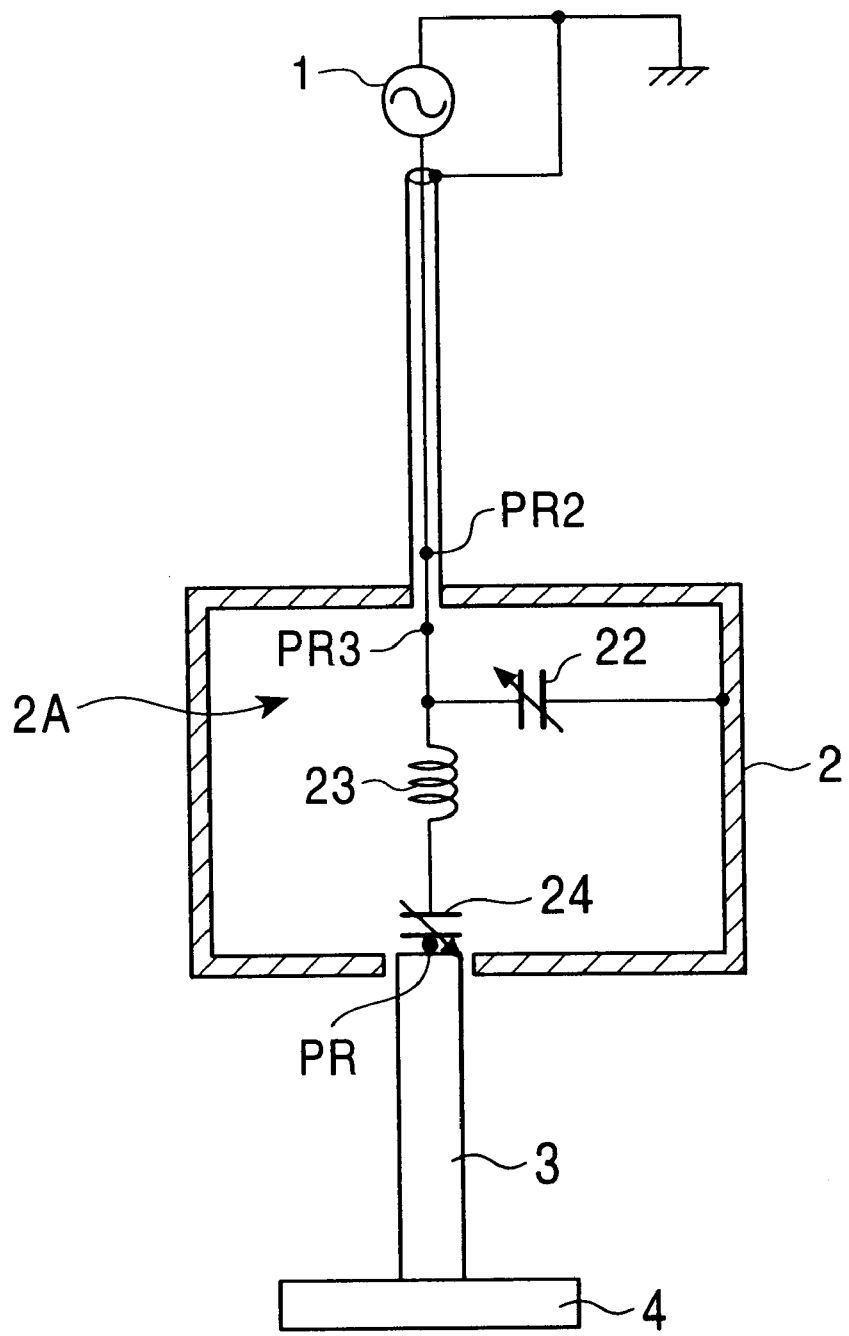
FIG. 2 is a schematic view of a matching circuit of the plasma processing apparatus shown in FIG. 1.

FIG. 2 shows a matching circuit 2A. A coil 23 and a tuning capacitor 24 are arranged in series between a radiofrequency generator 1 and a plasma excitation electrode 4, and a load capacitor 22 is arranged in parallel to the radiofrequency generator 1. The other end of the matching circuit 2A is grounded. When the loss capacitance $C_X$ of the plasma processing chamber is measured, the matching circuit 2A is disconnected from the plasma excitation electrode 4 at a position PR which corresponds to the output terminal of the tuning capacitor 24.

Figure 4:
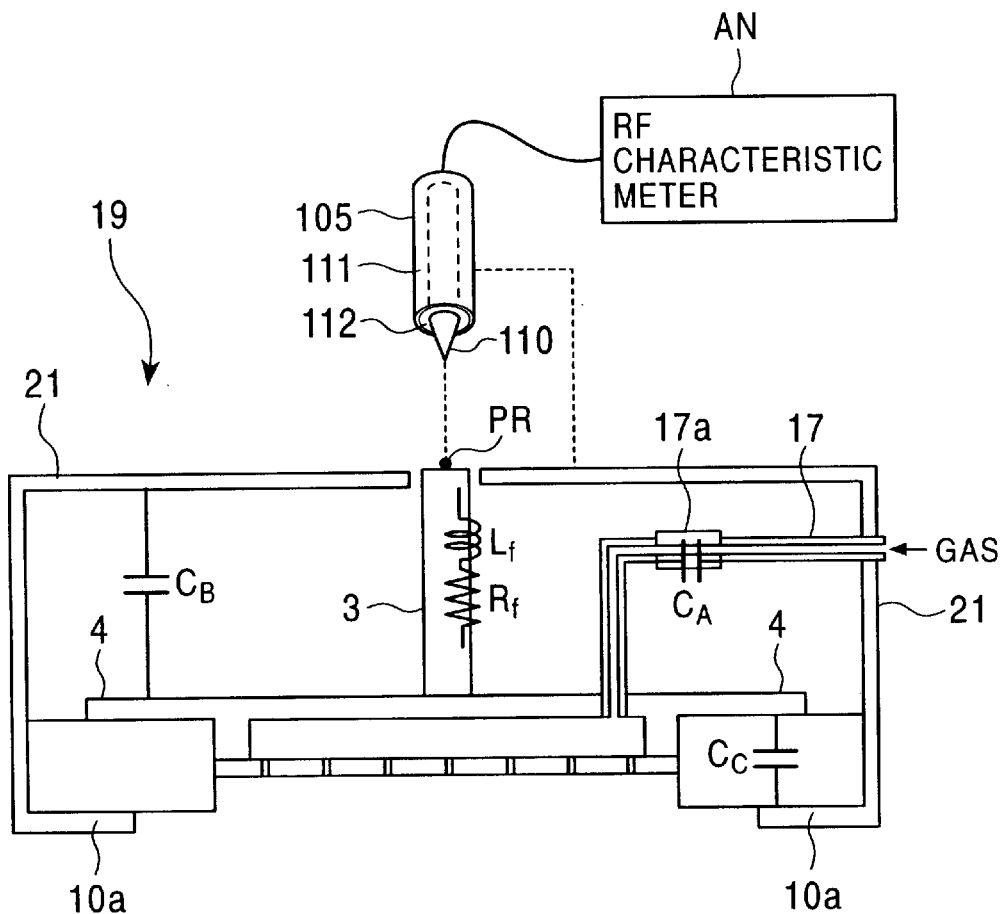
FIG. 4 is a schematic view explaining the loss capacitance $C_X$ of the upper component of the plasma processing chamber shown in FIG. 3.

FIG. 4 is a schematic view of an upper component when the loss capacitance $C_X$ is measured.

Figure 5:
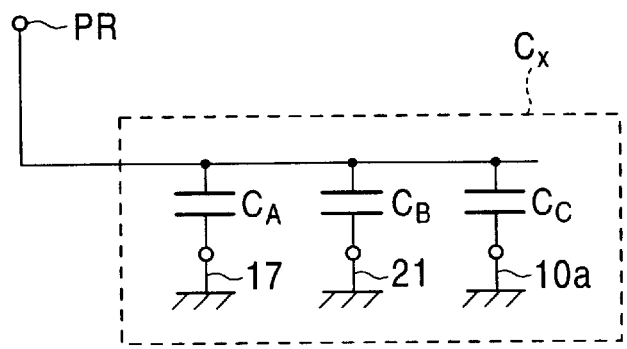
FIG. 5 is an equivalent circuit diagram illustrating the loss capacitance $C_X$ of the upper component shown in FIG. 4.

When the entire capacitance of the upper component is measured, the upper component is detached from the plasma processing chamber and the capacitance component of the plasma excitation electrode 4 is measured at the output terminal position PR to determine the loss capacitance $C_X$. The loss capacitance $C_X$ is the sum of the capacitances $C_A$, $C_B$, and $C_C$ as shown in FIG. 5.

Instead of the above-described measuring point, as shown in FIG. 1, a measuring point PR2 which corresponds to the input end of the radiofrequency feed line may be employed to define the measuring region. In this case, the measuring range includes a radiofrequency feed line, the matching circuit, the radiofrequency feed plate, and the plasma excitation electrode side of the plasma processing chamber.

Instead of the above-described measuring point, as shown in FIG. 1, a measuring point PR3 which corresponds to the input terminal of the matching circuit 2A connected to the feed line 1A may be employed to define the measuring region of the plasma processing chamber. In this case, the measuring region includes the matching circuit, the radiofrequency feed plate, and the plasma excitation electrode side of the plasma processing chamber.

In the present invention, the absolute value of the difference $\Delta C_X$ between the loss capacitance $C_{X0}$ at the time $t_0$ and the loss capacitance $C_{X1}$ at the later time t1 is less than an upper limit. The upper limit is not limited in the present invention and is preferably 10% of the loss capacitance $C_{X0}$. In such a case, a plasma enhanced CVD apparatus has a variation in deposition rate of ±5% or less and a variation in layer characteristics of ±5% in the planar direction of the layer, wherein the layer characteristics include the layer thickness and the isolation voltage.

More preferably, the upper limit is ±3% of the loss capacitance $C_{X0}$. In such a case, a plasma enhanced CVD apparatus has a variation in deposition rate of ±2% or less and a variation in layer characteristics of ±2% in the planar direction of the layer, wherein the layer characteristics include the layer thickness and the isolation voltage.

In the present invention, an evaluation standard (Evaluation Standard 1) is whether or not the loss capacitance $C_{X1}$ after the delivery is less than 26 times the plasma electrode capacitance $C_{e1}$.

When the loss capacitance $C_{X1}$ is less than 26 times the plasma electrode capacitance $C_{e1}$, the shunt component other than a current flowing between the electrodes can be reduced, thus effectively introducing radiofrequency power into the plasma space. When the same frequency is supplied, the plasma processing apparatus of the present invention more effectively consumes the electrical power in the plasma space than conventional apparatuses. In a layer deposition process, the deposition rate is increased.

As described above, the loss capacitance $C_X$ are radiofrequency characteristics mainly depending on the mechanical structure; hence, the individual plasma processing chambers have different values. By evaluating the performance based on the loss capacitance $C_X$, the overall radiofrequency characteristics of the plasma processing chambers can be optimized, achieving stable plasma generation. Thus, the performance evaluation method and the performance management system can maintain high operational stability of the plasma processing apparatus. Such a performance evaluation method has not been considered in conventional processes.

In the present invention, another evaluation standard (Evaluation Standard 2) is whether or not the variation $C_{e1r}$ between the plasma electrode capacitances $C_{e1}$ after delivery is less than the upper limit and whether or not the variation $C_{X1r}$ between the loss capacitances $C_{X1}$ after delivery is less than the upper limit.

The plasma electrode capacitance $C_{e1}$ is measured for each of a plurality of plasma processing chambers to determine the maximum $C_{e1max}$ and the minimum $C_{e1min}$. The variation $C_{e1r}$ is defined by the following equation:

$$C_{e1r} = (C_{e1max} - C_{e1min})/(C_{e1max} + C_{e1min})$$

When the variation $C_{e1r}$ is less than the upper limit, these plasma chambers have substantially the same radiofrequency characteristics such as the plasma electrode capacitance $C_e$. Since these plasma processing chambers can be controlled within a predetermined range, these chambers consume substantially the same electrical power in the plasma spaces thereof.

The loss capacitance $C_X$ is also measured for each of a plurality of plasma processing chambers to determine the maximum $C_{X1max}$ and the minimum $C_{X1min}$. The variation $C_{X1r}$ is defined by the following equation:

$$C_{X1r} = (C_{X1max} - C_{X1min})/(C_{X1max} + C_{X1min})$$

When the variation $C_{X1r}$ is less than the upper limit, these plasma chambers have substantially the same radiofrequency characteristics such as the plasma electrode capacitance $C_X$. Since these plasma processing chambers can be controlled within a predetermined range, these chambers consume substantially the same electrical power in the plasma spaces thereof.

As a result, substantially the same results can be obtained by the same process recipe for these plasma processing chambers. When layers are deposited in these processing chambers, these layers will have substantially the same characteristics, e.g., the thickness, the isolation voltage, and the etching rate.

In the present invention, Standard Evaluations 1 and 2 may be used in combination. In this case, the performance evaluation method allows the plasma processing apparatus to maintain at a highly stable operation state. Moreover, the performance evaluation method maintains reduced differences in radiofrequency characteristics such as the plasma electrode capacitance $C_e$ and the loss capacitance $C_X$ between the different plasma processing chambers.

In this case, the upper limit of the variation $C_{e1r}$ in the plasma electrode capacitances $C_{e1}$ after the delivery may be any value, for example, 0.1. Also, the upper limit of the variation $C_{X1r}$ in the loss capacitances $C_{X1}$ after the delivery may be any value, for example, 0.1. When the upper limit is 0.1, the variation in layer thickness can be controlled within ±5%, resulting in uniform plasma deposition.

When the upper limit is 0.03, the different plasma processing chambers have substantially the same radiofrequency characteristics such as the plasma electrode capacitance $C_e$ and the loss capacitance $C_X$. These plasma processing chambers can be controlled within a predetermined level using the impedance characteristics, consuming substantially the same power in the plasma spaces thereof.

As a result, substantially the same results can be obtained by the same process recipe for these plasma processing chambers. When layers are formed in these processing chambers, these layers can have substantially the same characteristics, e.g., the thickness, the isolation voltage, and the etching rate. When the upper limit is 0.03, the variation in layer thickness can be controlled within ±2%, resulting in uniform plasma deposition.

The performance management system for the plasma processing apparatus or system of the present invention evaluates whether or not the plasma processing apparatus or system is maintained at a time $t_0$ after the apparatus or system is disassembled at the delivery site, transferred to the customer site, and reassembled and used at the customer site and at a later time t1 in use in order to control the performance of the apparatus or system.

A server used in this system is controlled by a delivery site, for example, a manufacturer, a distributor, or a maintenance engineer. The server may be placed at any site. The server stores the loss capacitance $C_{X0}$ before disassembly of the loss capacitance $C_X$. Using the loss capacitance $C_X$, the performance of the plasma processing apparatus at the customer site is evaluated. Preferably, the server also stores the plasma electrode capacitance $C_{e0}$ before disassembly of the plasma electrode capacitance $C_e$. In such a case, the performance of the plasma processing apparatus at the customer site is evaluated using the plasma electrode capacitance $C_{e0}$.

The loss capacitance $C_{X0}$ may be a standard loss capacitance $C_X$ which is controlled by the manufacturer. Alternatively, the loss capacitance $C_{X0}$ and the plasma electrode capacitance $C_{e0}$ may be stored for the identification number of each plasma processing chamber to more precisely evaluate each plasma processing chamber at the customer site. In such a case, the performance management system becomes more precise.

The identification number of the plasma processing chamber may be of any form and may include numerals and characters. In a plasma processing apparatus having one plasma processing chamber, the serial number of the plasma processing apparatus may be used as the identification number of the plasma processing chamber.

The server is linked to an I/O device installed at the customer site via a communication line. The communication line may be of any form which can perform transmitting/receiving of signals between the server and the I/O device which are distant from each other. Examples of communication lines are communication media, such as cables, optical fiber lines, satellite circuits, telephone lines, and the Internet. The I/O devices located at the customer site are also not limited and are selected from personal computers, dedicated terminals, telephones, etc. according to the type of the communication line used. In the performance management system using Evaluation Standard 2, the I/O device at the delivery site must have an input function and may have an output function.

The server receives data of the loss capacitance $C_{X1}$ and the plasma electrode capacitance $C_{e1}$ after the delivery or reassembly from the customer I/O device. The server may receive the identification number of the corresponding plasma processing apparatus or chamber, if necessary. Herein, "after the delivery" includes "immediately after reassembly" and "in use" after the reassembly. Accordingly, the server can continually receives data of the loss capacitance $C_{X1}$ and the plasma electrode capacitance $C_{e1}$ which reflect the performance of the plasma processing apparatus or system at the customer site anytime. In the performance management system using Evaluation Standard 1, the server stores data of the plasma electrode capacitance $C_e$ (particularly, the plasma electrode capacitance $C_{e0}$) and the loss capacitance $C_X$ (particularly, the loss capacitance $C_{x0}$) which evaluate the performance of the plasma processing apparatus at the customer site. The server may receive data of the loss capacitance $C_{X1}$ after the delivery and the plasma electrode capacitance $C_{e1}$ after the delivery of the plasma electrode capacitance $C_{e1}$ together with the identification number of the plasma processing apparatus or chamber from the I/O device at the delivery site, if necessary.

In the transmission of values of the loss capacitance $C_{X1}$, the plasma electrode capacitance $C_{e1}$, and the identification number of the plasma processing apparatus or chamber to the server, the user or a maintenance engineer may manually input these values through the customer I/O device. The input operation can be automated or simplified. For example, a meter for measuring the capacitance is connected to both the plasma processing apparatus or chamber and the customer I/O device to directly transmit the data of the loss capacitance $C_{X1}$ and the like to the server. In the case of a plasma processing apparatus having a single plasma processing chamber, the identification number of the plasma processing chamber is preliminarily stored in the customer I/O device and no input operation for the identification number is required for subsequent procedures.

The server calculates the absolute value of the difference $\Delta C_X$ using the loss capacitance $C_{X0}$ and the plasma electrode capacitance $C_{e0}$ in the internal arithmetic processing unit. The server transmits to the I/O device at the customer a signal indicating that a required level of performance is maintained when the absolute value is less than the upper limit and a signal indicating that the required level of performance is not maintained when the absolute value is not less than the upper limit. Moreover, the server compares the loss capacitance $C_{X1}$ after the delivery with the plasma electrode capacitance $C_{e1}$ in the internal arithmetic processing unit and transmits to the I/O device at the customer site a signal indicating that the required level of performance is maintained when the loss capacitance $C_{X1}$ is less than 26 times the plasma electrode capacitance $C_{e1}$ and a signal indicating that the required level of performance is not maintained when the loss capacitance $C_{X1}$ is not less than 26 times the plasma electrode capacitance $C_{e1}$. Thus, the performance of the plasma processing apparatus or chamber can be evaluated at the customer site based on the evaluation information transmitted from the server. The customer I/O device outputs the results of the performance evaluation in any form, for example, display, print, or alarm signal.

The server is preferably provided with an output device at the delivery site to output a maintenance command therefrom when the absolute value of the difference $\Delta C_X$ is not less than the upper limit. In this case, the identification number of the corresponding plasma processing chamber is preferably output so as to rapidly detect the defect of the corresponding plasma processing chamber at the delivery site and to promptly start maintenance services. The output device provided to the server may output a maintenance command when the loss capacitance $C_{X1}$ is not less than 26 times the plasma electrode capacitance $C_{e1}$.

If the server is not located at the delivery site, the server and the output device may be linked via any communication line.

In the case of providing the evaluation information from the server to both the output device at the customer site and the output device at the delivery site, the upper limits for these two output devices are not necessarily the same. For example, an upper limit of 10% for the loss capacitance $C_X$ is set to the I/O device at the customer site and a signal indicating that the required level of the performance is not maintained when the loss capacitance $C_{X1}$ is not less than the upper limit. On the other hand, an upper limit of 3% for the loss capacitance $C_X$ is set to the output device at the delivery site and a maintenance command is output when the loss capacitance $C_{X1}$ is not less than the upper limit of 3%. Since the maintenance command is output to the output device at the delivery site based on the severer evaluation standard, a maintenance engineer can provide maintenance service before the performance of the plasma processing apparatus significantly varies, namely, preventive service.

The performance management system for the plasma processing apparatus according to another embodiment of the present invention also evaluates whether or not the plasma processing apparatus maintains a required level of performance at a later time t1 after a time $t_0$ when the apparatus is reassembled at a customer site or used at the customer site.

In this performance management system, the server stores maintenance engineer information which includes performance levels, such as fault levels, which correspond to predetermined ranges, and maintenance engineer's names which are registered in response to the fault levels. Moreover, the server has an output device at the delivery site. When the absolute value of the difference $\Delta C_X$ falls within one of the fault levels, the server outputs a maintenance command with the information on the service engineer which is registered according to the fault level.

This performance management system outputs the fault level and the information of a service engineer having a skill which is suitable for the fault level, in addition to a maintenance command at the delivery site Thus, the fault level of the plasma processing apparatus placed at the customer site can be readily evaluated at the delivery site according to this performance management system. A maintenance engineer having skill which is suitable for the fault level is thereby sent to the customer site, thus providing rapid and adequate maintenance services with an efficient engineer distribution. Accordingly, the maintenance system after installation becomes rationalized.

In the performance management system using Evaluation Standard 2, the server has an output device. The output device may be placed anywhere, and preferably is placed at a site which provides maintenance services, for example, the delivery site, the manufacturer site, or a maintenance center. If the server is distant from the output device, these may be linked via any communication line.

The server evaluates the performance of the plasma processing apparatus at the customer site by Standard Evaluation 2 and outputs a maintenance command and the identification numbers of the plasma processing chambers having the maximum $C_{e1max}$, minimum $C_{e1min}$, the maximum $C_{e1max}$, and minimum $C_{e1min}$ when the results are not desirable.

The server receives data of the loss capacitance $C_{X1}$ and the plasma electrode capacitance $C_{e1}$ after the deliver from the customer I/O device before the evaluation based on Evaluation Standard 2. Herein, "after the delivery" includes "immediately after reassembly" and "in use" after the reassembly. Accordingly, the server can continually receives data of the plasma electrode capacitance $C_{e1}$ and the loss capacitance $C_{X1}$ which reflect the performance of the plasma processing apparatus or system at the customer site anytime.

The server also receives the identification numbers of the plasma processing chambers having the plasma electrode capacitance $C_{e1}$ and the loss capacitance $C_{X1}$.

The server receives data of the loss capacitances $C_{X1}$ of all plasma processing chambers included in the plasma processing apparatus or system and specifies the maximum $C_{X1max}$, the minimum $C_{X1min}$, and the identification numbers of the plasma processing chambers having the maximum or minimum. Next, the server calculates the variation $C_{X1r}$ according to the equation:

$$C_{X1r}=(C_{X1max}-C_{X1min})/(C_{X1max}+C_{X1min})$$

When the variation $C_{X1r}$ is not less than the upper limit, the output device outputs a maintenance command and the identification numbers of the plasma processing chambers having the maximum $C_{X1max}$ or minimum $C_{X1min}$.

Also, the server receives data of the plasma electrode capacitances $C_{e1}$ of all plasma processing chambers included in the plasma processing apparatus or system and specifies the maximum $C_{e1max}$, the minimum $C_{e1min}$, and the identification numbers of the plasma processing chambers having the maximum or minimum. Next, the server calculates the variation $C_{e1r}$ according to the equation:

$$C_{e1r}=(C_{e1max}-C_{e1min})/(C_{e1max}+C_{e1min})$$

When the variation $C_{e1r}$ is not less than the upper limit, the output device outputs a maintenance command and the identification numbers of the plasma processing chambers having the maximum $C_{e1max}$ or minimum $C_{e1min}$.

The defect of the plasma processing apparatus or system at the customer site can be rapidly detected at the maintenance engineer site, prompting maintenance services.

In the performance validation system for the plasma processing apparatus in accordance with the present invention, the customer can view the performance information which represents the operation performance of the plasma processing chambers uploaded by the maintenance engineer on an information terminal via a public line. In other words, the maintenance engineer rapidly provides the operation performance and maintenance information of the plasma processing apparatus in use to the customer. Since the performance information includes data of the loss capacitance $C_X$ and the plasma electrode capacitance $C_e$, the customer can evaluate the performance of the plasma processing apparatus. The performance information may be output as a catalog or specifications.

First Embodiment

A plasma processing apparatus according to a first embodiment of the present invention will now be described with reference to the drawings.

Figure 3:
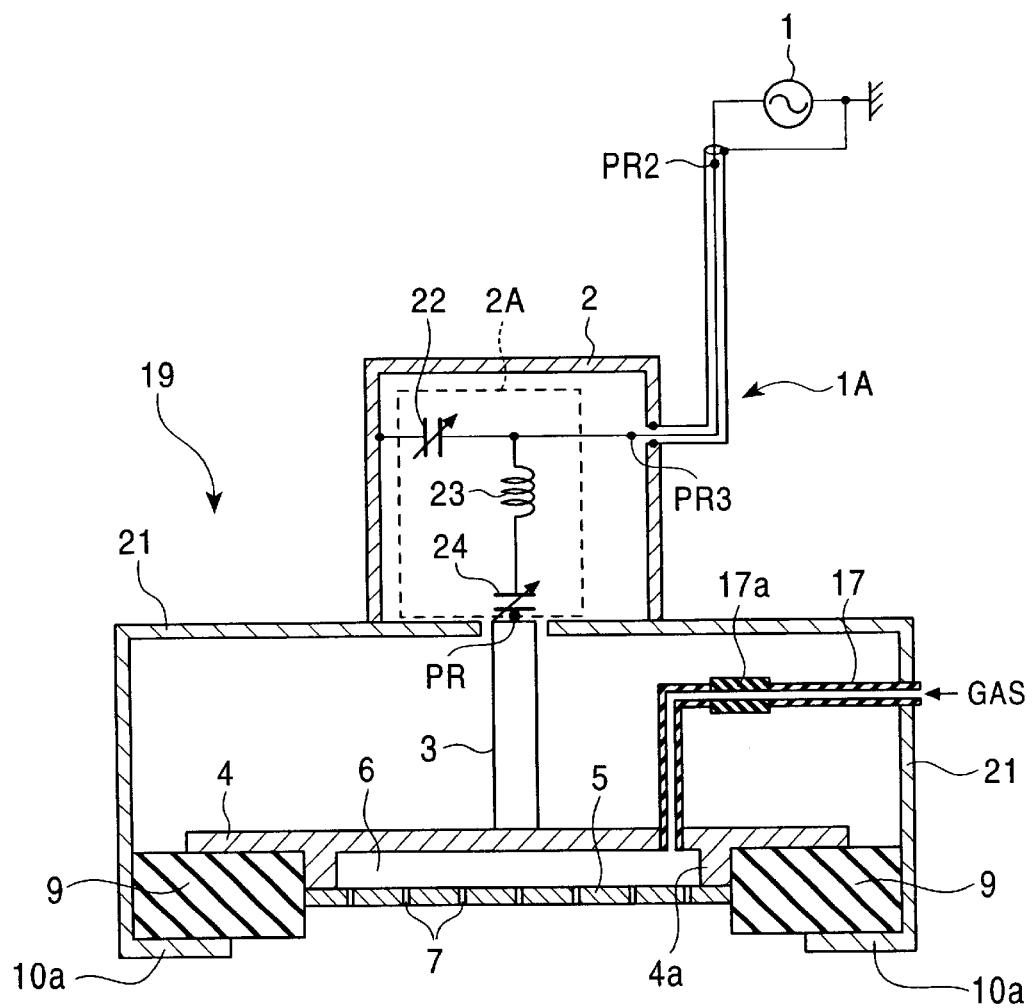
FIG. 3 is a cross-sectional view of the upper component of the plasma processing apparatus shown in FIG. 1.

FIG. 1 is a cross-sectional view showing the general structure of a plasma processing apparatus 75 according to the first embodiment. FIG. 2 illustrates a matching circuit 2A of the plasma processing apparatus 75 shown in FIG. 1. FIG. 3 is a cross-sectional view of an upper component of the plasma processing apparatus 75 shown in FIG. 1.

The plasma processing apparatus 75 of this embodiment is of a single-frequency excitation type and performs plasma processing such as plasma-enhanced chemical vapor deposition (CVD), dry etching, ashing, and the like. Referring to FIG. 1, the plasma processing apparatus 75 comprises a plasma processing chamber 60 having parallel plate electrodes 4 and 8, namely, a plasma excitation electrode (cathode) 4 for exciting a plasma and a susceptor electrode (counter electrode) 8, a radiofrequency generator 1 connected to the plasma excitation electrode 4, and a matching circuit 2A for matching the impedance between the plasma processing chamber 60 and the radiofrequency generator 1.

In this plasma processing apparatus 75, 26 times the plasma electrode capacitance $C_e$ between the parallel plate electrodes 4 and 8 is larger than the loss capacitance $C_X$ between the plasma excitation electrode 4 and ground potential positions which are DC-grounded. The absolute value of the difference $\Delta C_X$ between a loss capacitance $C_{X0}$ measured at a time $t_0$ and a loss capacitance $C_{X1}$ measured at a later time $t_1$ after reassembly of the plasma processing apparatus once disassembled for the purpose of transfer or during the subsequent period of use is maintained at a value less than 10% of $C_{X0}$.

The plasma processing apparatus 75 of this embodiment will now be described in greater detail. As shown in FIGS. 1 to 3, a shower plate 5 and the plasma excitation electrode 4 connected to the radiofrequency generator 1 are arranged on the plasma processing chamber 60. The susceptor electrode 8 for receiving a substrate 16 opposes the shower plate 5 in the plasma processing chamber 60. The plasma excitation electrode 4 is connected to the radiofrequency generator 1 via a feed plate (radiofrequency feeder) 3, the matching circuit 2A, and a feed line (radiofrequency supplier) 1A. The plasma excitation electrode 4 and the feed plate 3 are covered by a chassis 21, and the matching circuit 2A is housed inside a matching box 2 made of a conductor.

A silver-plated copper plate 50 to 100 mm in width, 0.5 mm in thickness, and 100 to 300 mm in length may be used as the feed plate 3, for example. The input end of the feed plate 3 is screwed to the output terminal of the matching circuit 2A, and the output end of the feed plate 3 is screwed to the plasma excitation electrode 4.

The plasma excitation electrode 4 has a projection 4a at the bottom face thereof. The shower plate 5 having many holes 7 is provided under the plasma excitation electrode 4 contacting the projection 4a. The plasma excitation electrode 4 and the shower plate 5 define a space 6. A gas feeding tube 17 is connected to the space 6.

The gas feeding tube 17 is connected to the space 6. The gas feeding tube 17 is composed of a conductor, and is provided with an insulator 17a in a midway thereof to insulate between the plasma excitation electrode 4 and the gas supply source.

The gas fed from the gas feeding tube 17 flows into a plasma processing chamber 60 comprising a chamber wall 10 via the holes 7 of the shower plate 5. The chamber wall 10 and the plasma excitation electrode (cathode) 4 are isolated from each other by an insulator 9. The exhaust system is omitted from the drawing.

The susceptor electrode (wafer susceptor) 8 of a plate type which receives the substrate 16 and functions as another plasma excitation electrode is provided in the plasma processing chamber 60.

An upper chamber wall 10a is provided on the entire top of the chamber wall 10 and is separable from the chamber wall 10. A sealing means such as an O-ring (not shown in the drawing) is provided between the upper chamber wall 10a and the chamber wall 10 to secure hermetic sealing therebetween. The upper chamber wall 10a is integrated with the bottom of the side wall of the chassis 21, thus the upper chamber wall 10a and the chassis 21 having the same DC potential.

Referring to FIG. 3, the upper chamber wall 10a, the plasma excitation electrode 4, the shower plate 5, the insulator 9, the chassis 21, and the gas feeding tube 17 constitute the upper component 19. The upper component 19 is separable from the lower structure including the chamber wall 10, the susceptor electrode 8 and the like. The upper component 19 can turn on a stator such as a hinge (not shown in the drawing) provided on the chamber wall 10 to open the plasma processing chamber 60.

The susceptor electrode 8 is connected to a shaft 13 extending through a chamber bottom 10A at the center of the bottom face. The bottom end portion of the shaft 13 and the central portion of the chamber bottom 10A are hermetically sealed by a bellows 11. The susceptor electrode 8 and the shaft 13 are vertically movable by the bellows 11 to adjust the distance between the plasma excitation electrode 4 and the susceptor electrode 8.

The susceptor electrode 8 is connected to the shaft 13, and the shaft 13 is connected to the bellows 11 which is connected to the chamber wall 10. Thus, the susceptor electrode 8, the shaft 13, the bellows 11, the chamber bottom 10A, the chamber wall 10, and the upper chamber wall 10a have the same DC potential. Because the chamber wall 10, the upper chamber wall 10a, and the chassis 21 are connected to each other, the chamber wall 10, the upper chamber wall 10a, the chassis 21, and the matching circuit 2A have the same DC potential.

Herein, the matching circuit 2A is provided with a plurality of passive elements in many cases in order to adjust the impedance of the plasma processing chamber 60 in response to a change in the state of the plasma.

Referring to FIGS. 1 and 2, the matching circuit 2A has passive elements, namely, a coil 23 and a tuning capacitor 24 connected in series between the radiofrequency generator 1 and the feed plate 3, and a load capacitor 22 connected in parallel with the coil 23 and the tuning capacitor 24. One end of the load capacitor 22 is coupled to the matching box 2. The tuning capacitor 24 is connected to the plasma excitation electrode 4 via the feed plate 3.

The matching box 2 is connected to a shielding line of a feed line 1A of a coaxial cable, and the shielding line is DC-grounded. Thus, the susceptor electrode 8, the shaft 13, the bellows 11, the chamber bottom 10A, the chamber wall 10, the chassis 21, and the matching box 2 are set to a ground potential. Also, one end of the load capacitor 22 is grounded.

The plasma electrode capacitance $C_e$ and the loss capacitance $C_X$ in the plasma processing apparatus 75 of this embodiment will now be described. FIG. 4 is a schematic view explaining the loss capacitance $C_X$ of the upper component of the plasma processing apparatus 75, and FIG. 5 is an equivalent circuit diagram of the upper component shown in FIG. 4.

The plasma electrode capacitance $C_e$ is a capacitance between the parallel plate electrodes 4 and 8, namely, the plasma excitation electrode 4 and the susceptor electrode 8, and is defined by the areas of and the distance between these electrodes 4 and 8.

The loss capacitance $C_X$ is the sum of the capacitance components for currents which flow in regions other than the path from the plasma excitation electrode 4 to the susceptor electrode 8. That is, the loss capacitance $C_X$ is the sum of the capacitance components between the plasma excitation electrode 4 and individual ground potential positions which are DC grounded. Herein, the ground potential positions represent all elements of the plasma processing apparatus 75 at the ground potential except the susceptor electrode 8. That is, the ground potential positions include the shaft 13, the bellows 11, the chamber bottom 10A, the chamber wall 10, the upper chamber wall 10a, the chassis 21, the matching box 2, and the gas feeding tube 17. In determining the loss capacitance $C_X$, only the gas feeding tube 17, the chassis 21, the upper chamber wall 10a opposing the plasma excitation electrode 4 are considered as the ground potential positions, as shown in FIG. 4.

The loss capacitance $C_X$ is defined as the sum of the capacitance $C_A$ between the plasma excitation electrode 4 and the gas feeding tube 17 across the insulator 17a, the capacitance $C_B$ between the plasma excitation electrode 4 and the chassis 21, and the capacitance $C_C$ between the plasma excitation electrode 4 and the upper chamber wall 10a.

In other words, as shown in FIG. 4, the loss capacitance $C_X$ can be regarded equal to the sum of the capacitance components for the electrical currents flowing from the plasma excitation electrode 4 into the regions other than the susceptor electrode 8 in the upper component 19 electrically separated from the plasma processing chamber 60.

In practice, as shown in FIG. 3, the loss capacitance $C_X$ of the upper component 19 separated from the chamber wall 10 (a separated state) is measured at a point PR corresponding to the output terminal of the matching circuit 2A. Herein, the separated state represents the state in which the plasma processing chamber 60 is opened by rotating the upper component 19 on a hinge or the like. In the separated state, the upper component 19 is physically separated from the chamber wall 10, and the capacitance between the plasma excitation electrode 4 and the susceptor electrode 8 is not measurable.

In measuring the loss capacitance $C_X$ of the upper component 19 in this embodiment, the matching circuit 2A is first separated from the upper component 19 at the output terminal of the passive element located at the last stage of the matching circuit 2A. As shown in FIG. 4, the matching circuit 2A is separated from the upper component 19 at the output the point PR of corresponding to the output terminal of the tuning capacitor by removing the screws connecting the feed plate 3 and the matching circuit 2A to measure the loss capacitance $C_X$ of the upper component 19.

Next, as shown by broken lines in FIG. 4, a probe 105 of an RF characteristic meter AN is connected to the point PR and a grounded position, for example, the chassis 21 of the upper component 19. The probe 105 includes a lead wire 110, an insulating sheath 112 shielding the lead wire 110, and an outer conductor 111 covering the insulating sheath 112, as shown in FIG. 4. The probe 105 is connected to the RF characteristic meter (impedance meter) AN via a coaxial cable. The lead wire 110 of the probe 105 is connected to the point PR, and the outer conductor 111 is connected to the grounded position in the upper center of the chassis 21. The RF characteristic meter may be an LCR meter measured at a fixed frequency or a tester provided with a capacitance measuring unit.

Referring to FIG. 5, the following radiofrequency components are thereby measured as the loss capacitance $C_X$:

The capacitance $C_A$ between the plasma excitation electrode 4 and the gas feeding tube 17 separated by the insulator 17a;

The capacitance $C_B$ between the plasma excitation electrode 4 and the chassis 21; and The capacitance $C_C$ between the plasma excitation electrode 4 and the upper chamber wall 10a.

In the plasma processing apparatus 75 of this embodiment, the plasma electrode capacitance $C_e$ and the loss capacitance $C_X$ are set such that 26 times the plasma electrode capacitance $C_e$ is larger than the loss capacitance $C_X$.

The plasma electrode capacitance $C_e$ and the loss capacitance $C_X$ can be adjusted to satisfy the above relationship, for example, as follows:

(1) Adjusting the distance between and the areas of the plasma excitation electrode 4 and the susceptor electrode 8;

(2) Adjusting the overlapping area of the plasma excitation electrode 4 and the upper chamber wall 10a;

(3) Adjusting the material characteristics of the plasma excitation electrode 4 and the upper chamber wall 10a;

(4) Adjusting the thickness of the insulator provided between the plasma excitation electrode 4 and the upper chamber wall 10a;

(5) Adjusting the distance between and the areas of the plasma excitation electrode 4 and the chassis 21;

(6) Adjusting the material characteristics of the insulator 17a in the gas feeding tube 17; and (7) Adjusting the length of the insulator 17a.

In generating a plasma using the plasma processing apparatus 75 of this embodiment, the upper component 19 is connected to the chamber wall 10; and the matching circuit 2A, the matching box 2, the radiofrequency power feed line 1A, and the radiofrequency generator 1 are arranged at predetermined positions. A power of 13.56 MHz or more, for example, 13.56 MHz, 27.12 MHz, or 40.68 MHz is supplied from the radiofrequency generator 1 to generate a plasma between the parallel plate electrodes 4 and 8. Using the plasma, a plasma treatment, such as a chemical vapor deposition (CVD) treatment, a sputtering treatment, a dry etching treatment, or an ashing treatment, is performed on the substrate 16 placed on the susceptor electrode 8.

The radiofrequency current supplied from the radiofrequency generator 1 flows through the coaxial cable of the radiofrequency power feed line 1A, the matching circuit 2A, the feed plate 3, and the plasma excitation electrode 4. The radiofrequency current further flows through the plasma processing chamber 60, the susceptor electrode 8, the shaft 13, the bellows 11, the chamber bottom 10A, the chamber wall 10, and the upper chamber wall 10a. The current then returns to the ground of the radiofrequency generator 1 via the chassis 21, the matching box 2, and the shielding line of the feed line 1A.

Figure 6:
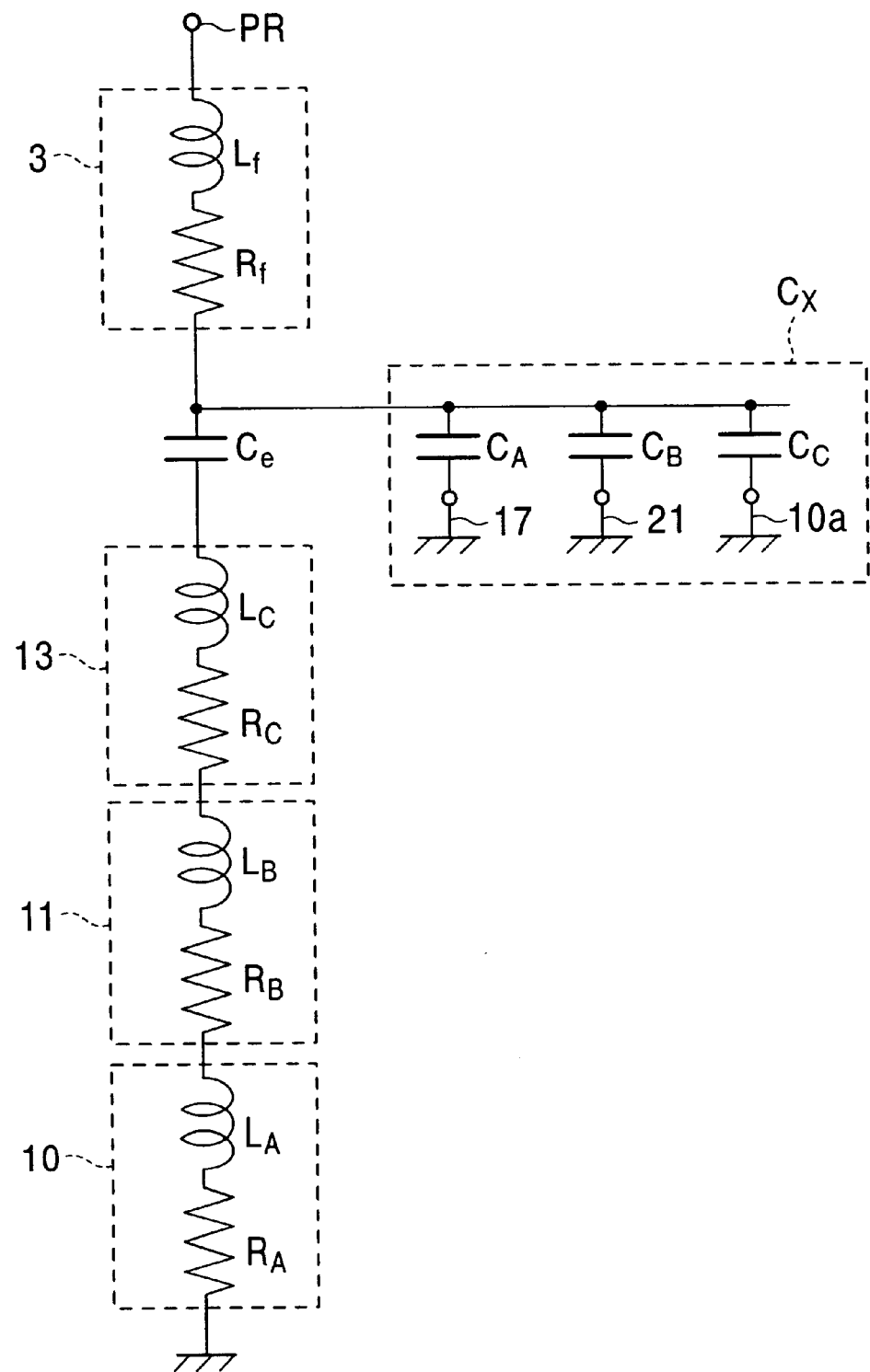
FIG. 6 is an equivalent circuit diagram illustrating the impedance characteristics of the plasma processing chamber shown in FIG. 1.
Figure 7:
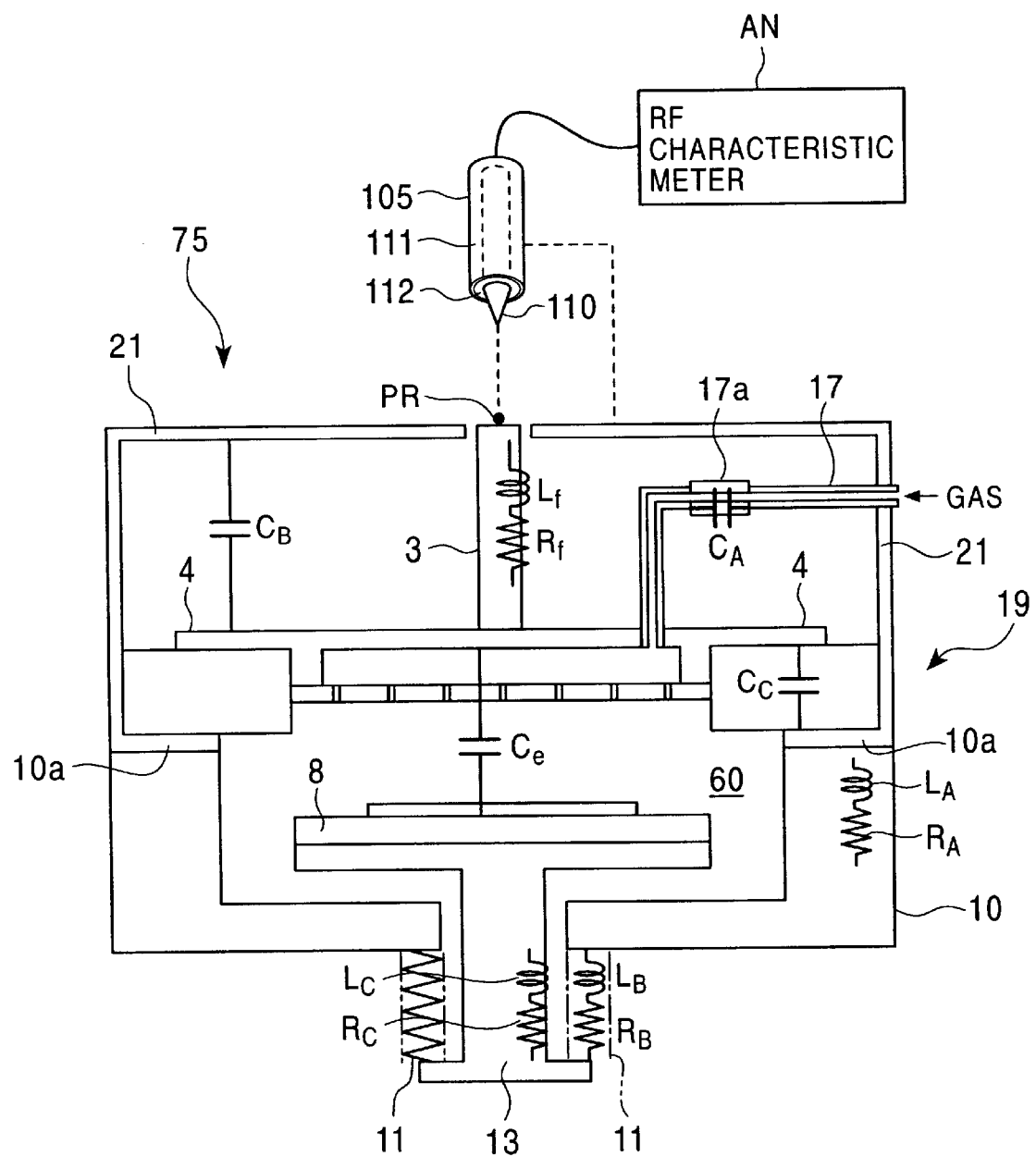
FIG. 7 is a schematic view of the plasma processing chamber for explaining the equivalent circuit diagram shown in FIG. 6.

Referring FIGS. 6 and 7, the following radiofrequency factors in the above measuring region will affect the circuit of the radiofrequency current which is supplied for plasma generation:

The inductance $L_f$ and resistance $R_f$ of the feed plate 3;

The plasma electrode capacitance $C_e$ between the plasma excitation electrode 4 and the susceptor electrode 8;

The inductance $L_C$ and resistance $R_C$ of the shaft 13;

The inductance $L_B$ and resistance $R_B$ of the bellows 11;

The inductance $L_A$ and resistance $R_A$ of the chamber wall 10;

The capacitance $C_A$ between the gas feeding tube 17 and the plasma excitation electrode 4 separated by the insulator 17a;

The capacitance $C_B$ between the plasma excitation electrode 4 and the chassis 21; and The capacitance $C_C$ between the plasma excitation electrode 4 and the upper chamber wall 10a.

As shown in FIG. 6, these radiofrequency factors are arranged to form an equivalent circuit so that the inductance $L_f$ and resistance $R_f$ of the feed plate 3, the plasma electrode capacitance $C_e$ between the plasma excitation electrode 4 and the susceptor electrode 8, the inductance $L_C$ and resistance $R_C$ of the shaft 13, the inductance $L_B$ and resistance $R_B$ of the bellows 11, and the inductance $L_A$ and resistance $R_A$ of the chamber wall 10 are connected in series in that order while the resistance $R_A$ is grounded. Moreover, the capacitance $C_A$, the capacitance $C_B$, and the capacitance $C_C$ are connected in parallel between the resistance $R_f$ and the plasma electrode capacitance $C_e$, one end of each being grounded. In this equivalent circuit, as shown in FIG. 8, the current $I_-$ supplied from the radiofrequency generator 1 is divided into a plasma current $I_e$ flowing between the parallel plate electrodes 4 and 8 constituting the plasma electrode capacitance $C_e$ and a loss current $I_x$ which is a shunt component flowing into the other portions.

$$I_- = I_e + I_x \quad (14)$$

Since 26 times the plasma electrode capacitance $C_e$ is greater than the loss capacitance $C_X$ in the circuit of the plasma processing chamber 75 as described above, the impedance between the plasma excitation electrode 4 and the ground potential positions 17, 21, and 10a becomes larger than the impedance between the plasma excitation electrode 4 and the susceptor electrode 8. Supposing the imaginary unit being j ($j^2 = -1$) and the angular frequency being $\omega$ ($\omega = 2\pi f_e$ wherein $f_e$ is a power frequency), the impedance Z ($\Omega$) is represented by relationship (11):

$$Z \propto -j/\omega C \quad (11)$$

wherein C is the capacitance. Thus, the impedance can be determined by defining the capacitance. Since the current I is in inverse proportion to the impedance Z ($\Omega$), an increase in the loss current $I_x$ relative to the plasma current $I_e$ can be suppressed.

Even when a power frequency $f_e$ which is higher than 13.56 MHz being a generally used frequency is supplied, the proportion of the plasma current $I_e$ fed in the plasma space is increased.

Since 26 times the plasma electrode capacitance $C_e$ is greater than the loss capacitance $C_X$, the shunt components other than the current flowing in the parallel plate electrodes 4 and 8 among the current $I_-$ supplied from the radiofrequency generator 1 can be controlled. Thus, the power can be effectively fed into the plasma generating space of the plasma processing chamber 60, and the effective power consumption in the plasma space can be increased compared with conventional plasma processing apparatuses when the same frequency is supplied. In a layer deposition process, the deposition rate will be improved. By setting the plasma electrode capacitance $C_e$ and the loss capacitance $C_X$ to the above-described range, the overall radiofrequency characteristics of the actual apparatus can be controlled. Since such a control generates a stable plasma, the plasma processing apparatus exhibits a stable operation.

Since the loss current $I_x$ is reduced, the effective power consumption in the plasma space is improved compared with conventional plasma processing apparatuses.

As the effective power consumed in the plasma space is increased, the uniformity in the plasma treatment on a workpiece in the planar direction can be improved. When applied to a deposition process, uniformity in the layer thickness can be achieved.

The improved power consumption in the plasma space also results in improvements of layer characteristics, such as isolation voltage, etching resistance to etching solutions, and density or hardness of the deposited layer. Herein, the layer density is represented by, for example, the etching resistance in a BHF solution.

Since the plasma processing apparatus of this embodiment exhibits an improved power consumption efficiency compared to conventional plasma processing apparatuses, the same process rate or layer characteristics can be obtained with less power when the same frequency as the frequency conventionally used is employed. Thus, the power loss can be decreased, the operating cost can be reduced, and the productivity can be increased. Furthermore, the reduction in processing time leads to reduction in carbon dioxide emission.

In designing and manufacturing the plasma processing apparatus of this embodiment, $C_{e0}$ is set to a such value that 26 times $C_{e0}$ is larger than a loss capacitance $C_{X0}$.

After reassembly of the plasma processing apparatus disassembled for the purpose of transfer, after an adjustment work such as overhaul, parts replacement, and assembly with alignment, or after plasma treatment of workpieces, a loss capacitance $C_{X1}$ between the plasma excitation electrode 4 and the ground potential positions measured at a later time $t_1$ is maintained at a such value that the absolute value of the difference $\Delta C_X$ between $C_{X0}$ and $C_{X1}$ is maintained to be less than 10% of $C_{X0}$. When the absolute value of $\Delta C_X$ is not less than 10% of $C_{X0}$, corrective action will be performed.

Examples of the corrective action for correcting $C_{X1}$ are as follows:

(1) Adjusting the distance between and the areas of the plasma excitation electrode 4 and the susceptor electrode 8;

(2) Adjusting the overlapping area of the plasma excitation electrode 4 and the upper chamber wall 10a;

(3) Adjusting the material characteristics of insulator provided between the plasma excitation electrode 4 and the upper chamber wall 10a;

(4) Adjusting the thickness of the insulator provided between the plasma excitation electrode 4 and the upper chamber wall 10a;

(5) Adjusting the distance between and the areas of the plasma excitation electrode 4 and the chassis 21;

(6) Adjusting the material characteristics of the insulator 17a in the gas feeding tube 17; and (7) Adjusting the length of the insulator 17a.

In the plasma processing apparatus of this embodiment, $C_{X1}$ is maintained at such a value that the absolute value of the difference $\Delta C_X$ between $C_{X1}$ and $C_{X0}$ is less than 10% of $C_{X0}$ even after reassembly of the plasma processing apparatus disassembled for the purpose of the transfer and after adjustment works. Accordingly, even when an event such as above which would affect the radiofrequency characteristics occurs at a certain time, the radiofrequency characteristics remain unchanged before and after that time. Thus, the plasma processing apparatus 75 can be maintained within a required level indicated by the loss capacitance $C_X$, and the effective power consumed in the plasma processing space can be maintained at the same level.

Consequently, the same plasma process results can be obtained by using the same process recipe before and after the occurrence of the event which would affect the radiofrequency characteristics. For example, when deposition processes are performed in the plasma processing apparatus 75 at a certain time interval, the same layer characteristics such as layer thickness, isolation voltage, and etching rate can be obtained despite the time interval. In particular, when the absolute value of $\Delta C_X$ described above is maintained at a value less than 10% of $C_X$, the variation in deposition rate can be kept within 5% and variation in the layer characteristics in the planar direction such as layer thickness and isolation voltage can also be kept within 5% under the same deposition conditions unaffected by the time interval, i.e., regardless of whether there had been reassembly of the plasma processing apparatus previously disassembled for the purpose of the transfer or performance of the adjustment works or regardless of the number of times used.

As a result, the overall radiofrequency characteristics of the plasma processing apparatus which have not been considered before can be adjusted, and plasmas can be more stably generated. Thus, the plasma processing apparatus 75 of this embodiment operates stably and uniformly.

Furthermore, when applied to a multi-chamber plasma processing apparatus having a plurality of plasma processing chambers 60 and a plasma process system having a plurality of plasma processing apparatuses 75, the plasma processing chambers 60 in these apparatus and system can be maintained to yield substantially the same plasma process results using the same process recipe.

Consequently, the process conditions can be determined without an examination of the correlation between the external parameters and the process results from the evaluation method requiring actual deposition on substrates using an enormous amount of data.

Since the plasma processing apparatus can be evaluated by measuring the loss capacitance $C_X$ between the plasma excitation electrode 4 and the grounded potential positions, the time of an adjustment work required to eliminate variation in the treatment and to achieve substantially the same process results using the same process recipe can be significantly reduced compared to when an inspection method requiring actual deposition on substrates is employed. Moreover, the plasma processing apparatus can be directly evaluated in situ in a shorter period of time instead of by a conventional two-stage evaluation requiring the steps of first depositing layers on substrates and then evaluating the operation of the plasma processing apparatus based on these substrates. Generally, when the plasma processing apparatus is first installed, the plasma processing apparatus is evaluated by the method requiring deposition on substrates to determine the process recipe for that plasma processing apparatus. Whereas conventional plasma processing apparatuses require evaluation of all the plasma processing chambers, such an evaluation needs to be performed in only one plasma processing chamber in this embodiment since the radiofrequency characteristics of that chamber and the other chambers are maintained to be the same.

Accordingly, in the evaluation method of this embodiment, a production line need not be shut down for several days to several weeks to check and evaluate the operation of the plasma processing apparatus. The production line, therefore, has high productivity, and the cost for substrates for inspection, cost for processing the substrates for inspection, and labor cost for the workers involved in the adjustment work can be reduced.

Figure 9:
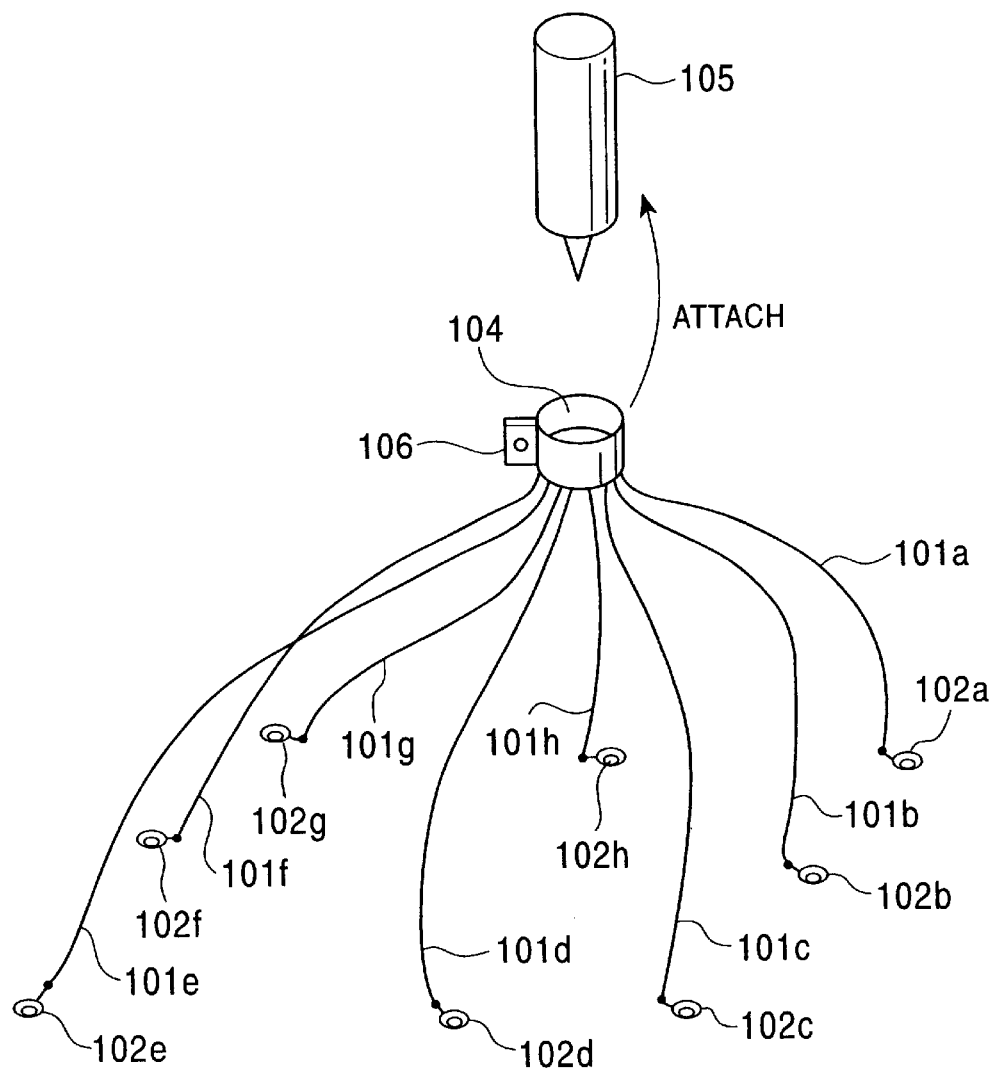
FIG. 9 is an isometric view of a probe of an impedance meter.

The loss capacitance $C_X$ as the radiofrequency characteristic of the upper component 19 of the plasma processing apparatus 75 may be measured using a fixture comprising a plurality of conductive wires 101a to 101h of matching impedance and a probe attachment 104 to which one end of each of the plurality of conductive wires 101a to 101h is attached, as shown in FIG. 9.

The probe attachment 104 is formed, for example, by shaping a 50 mm×10 mm×0.5 mm copper plate into a clamping portion 106 and a ring portion. The diameter of the ring portion is determined so that the ring portion is attachable to the circumference of the probe 105. One end of each of the conductive wires 101a to 101h is soldered to the probe attachment 104 to be electrically connected thereto.

Terminals (attachments) 102a to 102h which are attachable to and detachable from an object (upper component 19) to be measured are installed at the other ends of the conductive wires 101a to 101h.

Figure 10:
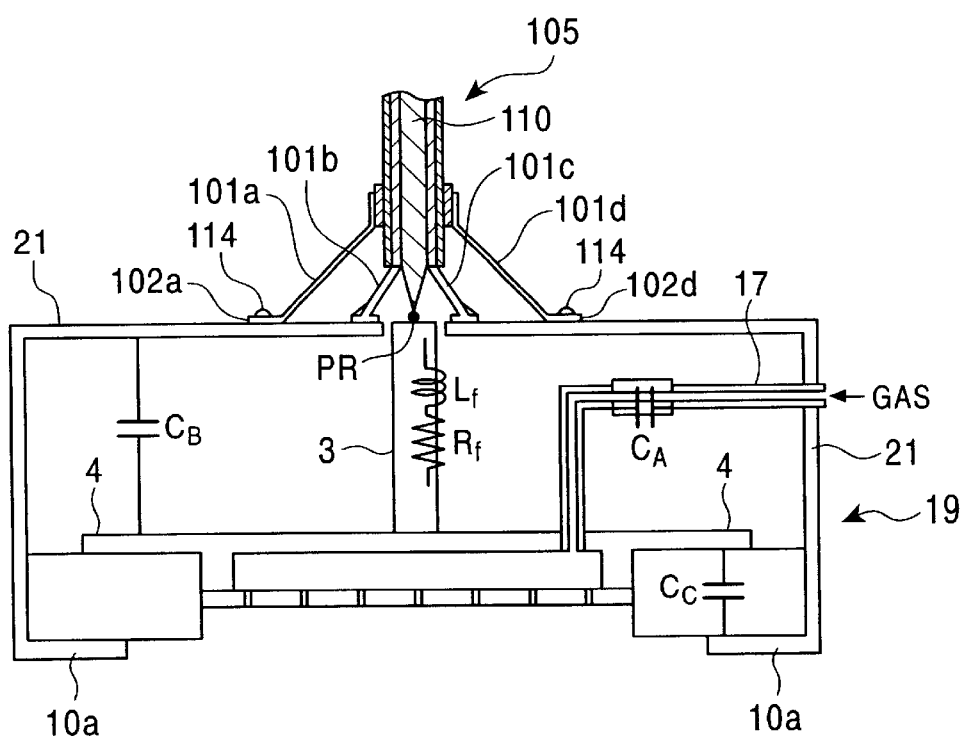
FIG. 10 is a schematic view showing a connection of the probe shown in FIG. 9.

In using this fixture, the probe 105 is inserted into the ring portion of the probe attachment 104, and the probe 105 and the probe attachment 104 are clamped by the clamping portion 106. The conductive wires 101a to 101h are detachably screwed to the measured object in a substantially symmetrical manner about a point through the terminals 102a to 102h, as shown in FIG. 10.

The conductive wires 101a to 101h may be made of, for example, aluminum, copper, silver, or gold, or may be plated by silver or gold having a thickness of 50 μm or more.

The method for measuring the loss capacitance $C_X$ using this fixture is now explained with reference to FIGS. 1, 9, and 10.

First, the radiofrequency generator 1 and the matching box 2 are removed from the rest of the plasma processing apparatus 75. Since the upper component 19 is the measured region, the upper component 19 is separated from the chamber wall 10. The conductive line 110 of the probe 105 of an impedance meter (RF characteristic meter) AN is then connected to the feed plate 3. The terminals 102a to 102h connected to the conductive wires 101a to 101h of the fixture are screwed to the chassis 21 of the plasma processing chamber 75 in a symmetrical manner about the feed plate 3 using screws 114. After the fixture is set as above, a measuring signal is fed to the conductive line 110 of the impedance meter AN to measure the impedance of the paths between the point PR and each of the grounded potential positions.

By using the fixture, a uniform current flows in the measured object regardless of the size of the measured object or the distance between two points to be measured. Moreover, by using the dedicated fixture, the impedance of the measured object can be measured accurately since the residual impedance due to probing affecting the impedance can be suppressed. Thus, the loss capacitance $C_X$ as the radiofrequency characteristic can be measured accurately.

Since only capacitance instead of general radiofrequency characteristics is measured in this plasma processing apparatus of this embodiment, an inexpensive meter can be used.

Although the substrate 16 is placed on the susceptor electrode 8 and the plasma electrode capacitance $C_e$ and the loss capacitance $C_X$ are set in relation to the plasma excitation electrode 4, the substrate 16 may be placed on the plasma excitation electrode 4 in the plasma processing apparatus of this embodiment.

Second Embodiment

A plasma processing apparatus in accordance with a second embodiment of the present invention will now be described with reference to the attached drawings.

Figure 11:
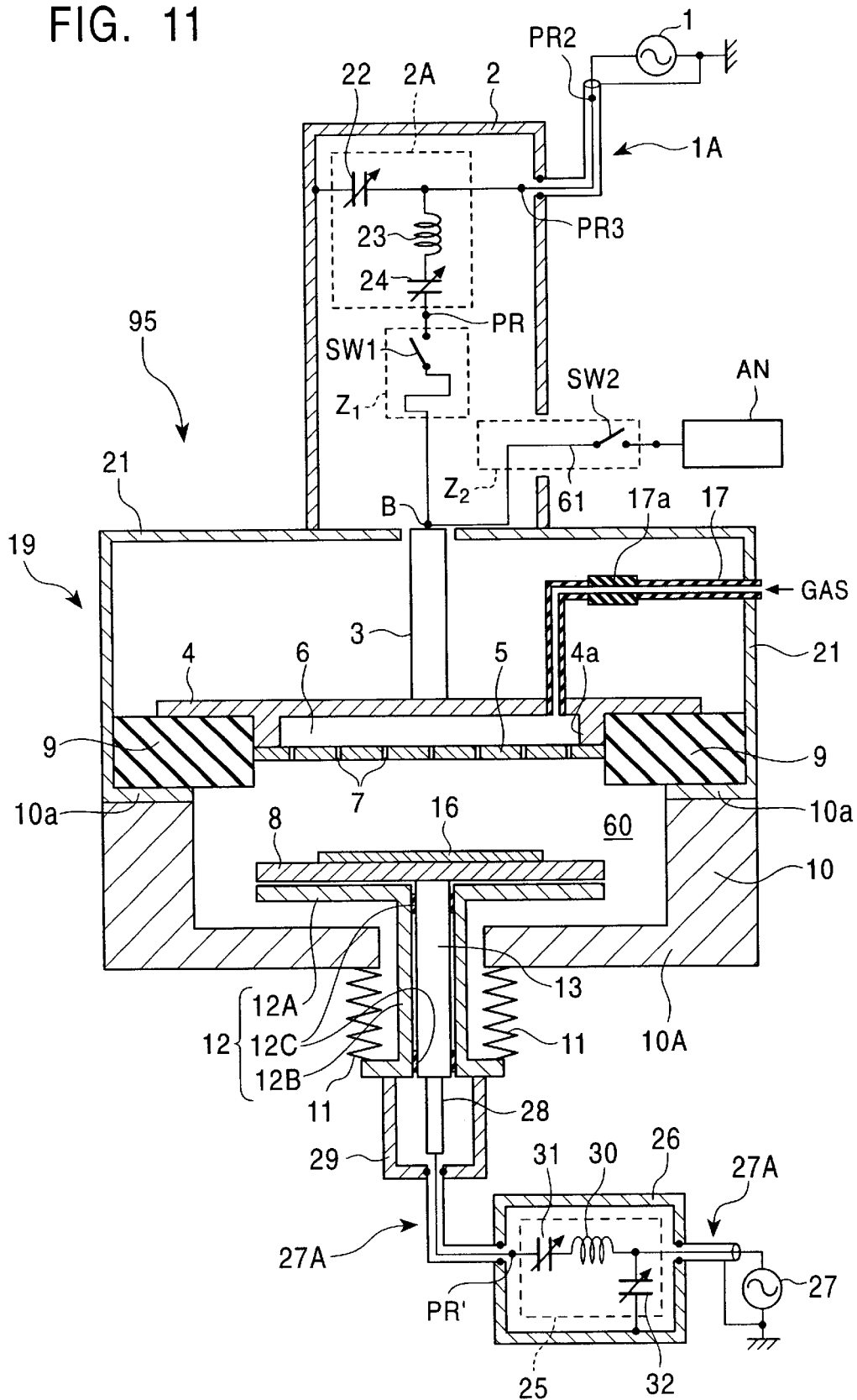
FIG. 11 is a schematic view of a plasma processing apparatus in accordance with a second embodiment of the present invention.
Figure 12:
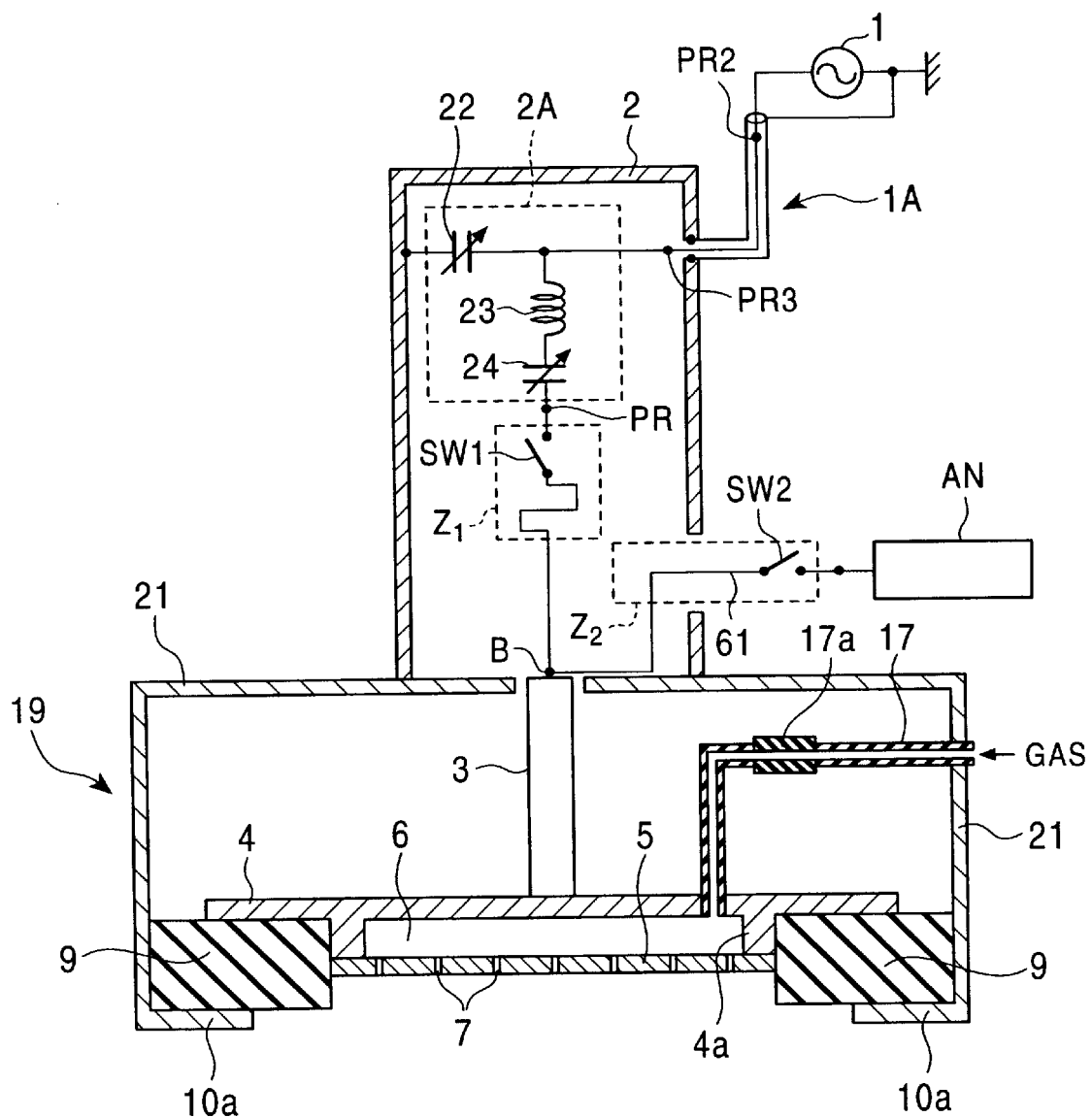
FIG. 12 is a cross-sectional view of the upper component of the plasma processing apparatus shown in FIG. 11.

FIG. 11 is a cross-sectional view illustrating an outline configuration of the plasma processing apparatus 95 of this embodiment, and FIG. 12 is a schematic view of an upper component 19 in FIG. 11.

The plasma processing chamber unit 95 of this embodiment is of a dual-frequency excitation type. This plasma processing apparatus 95 differs from the plasma processing chamber 75 of the first embodiment shown in FIG. 1 in that power is also supplied to the susceptor electrode 8 and that a measuring terminal 61 is provided. Another difference is the setting of the plasma electrode capacitance $C_e$ and the loss capacitance $C_X$. Other corresponding components are referred to as the same reference numerals and symbols and the description thereof is omitted.

Referring to FIG. 11, the plasma processing apparatus 95 of this embodiment has a susceptor shield 12 disposed under a susceptor electrode 8 and a bellows 11 for vertically moving the susceptor electrode 8 and the susceptor shield 12. The distance between a plasma excitation electrode 4 and the susceptor electrode 8 is thereby adjustable. The shaft 13 and the susceptor electrode 8 are electrically isolated from the susceptor shield 12 by a gap between the susceptor shield 12 and the susceptor electrode 8 and by insulators 12C provided around the shaft 13. The insulators 12C also maintain high vacuum in the plasma chamber 60. The susceptor electrode 8 is connected to a second radiofrequency generator 27 through a feed plate 28 connected to the bottom end of a shaft 13 and a matching circuit 25 contained in a conductive matching box 26.

The feed plate 28 is covered by a chassis 29 connected to the bottom end of a cylindrical support 12B of the susceptor shield 12. The chassis 29 is connected to the matching box 26 by a shielding line of a feed line 27A which is a coaxial cable, and is grounded together with the matching box 26. Thus, the susceptor shield 12, the chassis 29, and the matching box 26 have the same DC potential.

The matching circuit 25 matches the impedance between the second radiofrequency generator 27 and the susceptor electrode 8. Referring to FIG. 11, the matching circuit 25 has passive elements such as a tuning coil 30 and a tuning capacitor 31 connected in series between the second radiofrequency generator 27 and the feed plate 28, and a load capacitor 32 connected in parallel with the tuning coil 30 and the tuning capacitor 31. One end of the load capacitor 32 is connected to the matching box 26. Accordingly, the matching circuit 25 has substantially the same configuration as that of the matching circuit 2A. The matching box 26 is set to a ground potential through the shielding line of the feed line 27A, thereby the end of the load capacitor 32 being grounded. Alternatively, another tuning coil may be con-nected in series to the tuning coil 30, and another load capacitor may be connected in parallel to the load capacitor 32.

The feed plate 28 may be identical to the feed plate 3. The input end of the feed plate 28 is screwed to a terminal extending from the matching circuit 25, and the output end is screwed to the shaft 13.

The plasma processing apparatus 95 is designed and produced so that five times the plasma electrode capacitance $C_{e0}$ between the parallel plate electrodes 4 and 8 is larger than the loss capacitance $C_{X0}$ at a time $t_0$.

Furthermore, the performance of the plasma processing apparatus 95 which is reassembled at a delivery site is maintained such that the absolute value of the difference $\Delta C_X$ between the loss capacitance $C_{X1}$ at a later time t1 and the loss capacitance $C_{X0}$ at the time t0 is less than 10% of the loss capacitance $C_{X0}$, wherein the loss capacitance $C_{X1}$ and the loss capacitance $C_{X0}$ are measured between the plasma excitation electrode connected to the radiofrequency generator and ground potential positions which are DC-grounded.

The measuring range in the plasma processing apparatus 95 of this embodiment includes the downstream side of the output terminal position PR shown in FIGS. 11 and 12 toward the plasma excitation electrode 4. An impedance measuring terminal 61 extends from a branch point B at the input terminal of the feed plate 3 to the exterior of the matching box 2.

A switch SW1 is provided between the matching circuit 2A and the feed plate 3 and in the vicinity of the output terminal position PR and a switch SW2 is provided between the impedance measuring terminal 61 and the feed plate 3.

The impedance characteristics from the impedance measuring terminal 61 side when the impedance measuring terminal 61 is connected by the switch SW2 and the impedance characteristics from the matching circuit 2A side when the matching circuit 2A is connected by the switch SW1 are set to be equal to each other. That is, as shown in FIG. 11, the impedance $Z_1$ measured in the vicinity of the switch SW1 and the impedance $Z_2$ measured in the vicinity of the switch SW2 are set to be equal to each other.

In other words, the impedance $Z_1$ from the output terminal position PR to the branch point B when the switch SW1 is closed and the switch SW2 is open is set to be equal to the impedance $Z_2$ from the impedance measuring terminal 61 to the branch point B when the switch SW2 is closed and the switch SW1 is opened.

A probe of an RF characteristic meter AN is detachably connected to the impedance measuring terminal 61. The probe is also detachably connected to the ground position, for example, a chassis 21 of the plasma processing apparatus 95.

In the plasma processing apparatus 95 of this embodiment, while closing the switch SW1 and opening the switch SW2, a substrate 16 to be treated is placed on the susceptor electrode 8, radiofrequency voltages are applied to the plasma excitation electrode 4 and the susceptor electrode 8 from a first radiofrequency generator 1 and the second radiofrequency generator 27, respectively, while a reactive gas is fed into a plasma chamber 60 through a gas feeding tube 17 and shower holes 7 to generate a plasma, and plasma processing such as deposition or the like is performed on the substrate 16. During this process, a radiofrequency voltage of approximately 13.56 MHz or more, for example, 13.56 MHz, 27.12 MHz, or 40.68 MHz, is supplied from the first radiofrequency generator 1. The second radiofrequency generator 27 may supply either the same radiofrequency power as does the first radiofrequency generator 1 or a different radiofrequency of, for example, 1.6 MHz.

The plasma electrode capacitance $C_e$ and the loss capacitance $C_X$ as radiofrequency characteristics of the plasma processing apparatus 95 of this embodiment are defined and measured as in the first embodiment. That is, the plasma electrode capacitance $C_e$ and the loss capacitance $C_X$ are defined as shown in FIGS. 5 and 13.

Figure 13:
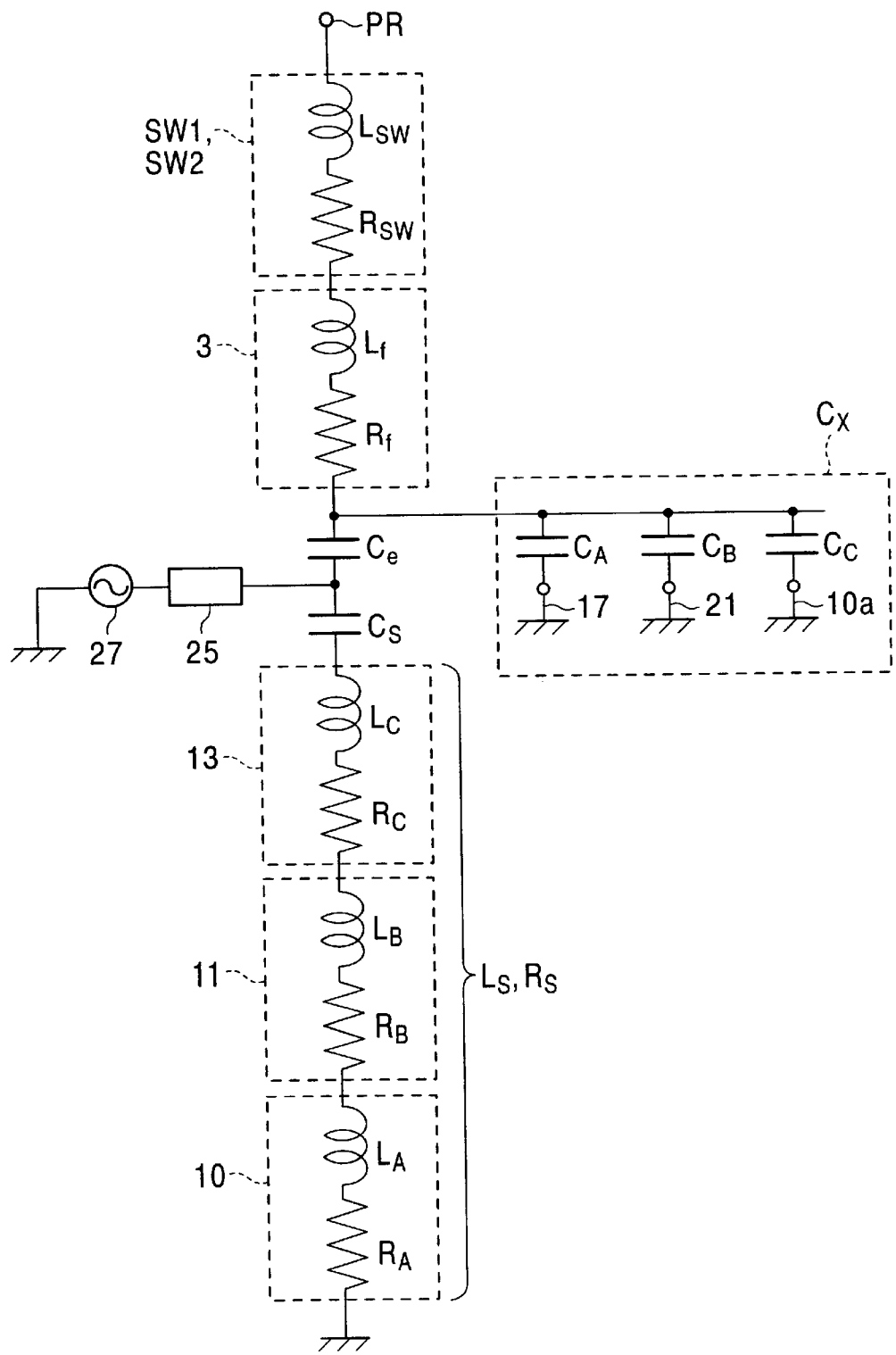
FIG. 13 is an equivalent circuit diagram of the plasma processing chamber shown in FIG. 11.

FIG. 13 is an equivalent circuit diagram for measuring the plasma electrode capacitance $C_e$ and the loss capacitance $C_X$ of the plasma processing chamber 15 shown in FIG. 11, and FIG. 5 is an equivalent circuit diagram for measuring the plasma electrode capacitance $C_e$ and the loss capacitance $C_X$ of the upper component 19 shown in FIG. 12.

In this embodiment, the loss capacitance $C_X$ of the plasma processing apparatus 95 means that of the upper component 19 which is measured at the output terminal position PR. As shown in FIG. 11, the impedance $Z_1$ in the vicinity of the switch SW1 is equal to the impedance $Z_2$ in the vicinity of the switch SW2. Thus, the radiofrequency characteristic (impedance) of the upper component 19 measured at the output terminal position PR is equal to the radiofrequency characteristic (impedance) thereof measured at the impedance measuring terminal 61.

In the first embodiment, the matching circuit 2A is mechanically detached when the radiofrequency characteristics are measured. In this embodiment, however, the matching circuit 2A is electrically disconnected from the measuring range by the switch SW1, as shown in FIGS. 11 and 12; hence, the radiofrequency characteristics of the upper component 19 can be readily measured without mechanically detaching the matching circuit 2A.

Referring to FIG. 13, the radiofrequency electrical factors affecting the above-described measuring region of the plasma processing apparatus 95 are as follows:

The inductance $L_{SW}$ and resistance $R_{SW}$ of the switch SW2;

The inductance $L_f$ and resistance $R_f$ of the feed plate 3;

The plasma electrode capacitance $C_e$ between the plasma excitation electrode 4 and the susceptor electrode 8;

The contribution of the matching circuit 25;

The capacitance $C_S$ between the susceptor electrode 8 and a susceptor shield 12;

The inductance $L_C$ and resistance $R_C$ of a cylindrical support 12B of the susceptor shield 12;

The inductance $L_B$ and resistance $R_B$ of a bellows 11;

The inductance $L_A$ and resistance $R_A$ of a chamber wall 10;

The capacitance $C_A$ between a gas feeding tube 17 and the plasma excitation electrode 4 via an insulator 17a;

The capacitance $C_B$ between the plasma excitation electrode 4 and the chassis 21; and The capacitance $C_C$ between the plasma excitation electrode 4 and the upper chamber wall 10a.

That is, the radiofrequency characteristics in the measuring mode include the contribution of the switch SW2 which corresponds to the switch SW1 closed in the operation mode. Since the impedance $Z_1$ is equal to the impedance $Z_2$, the radiofrequency characteristics measured at the impedance measuring terminal 61 precisely reflect the state of the radiofrequency circuit during plasma generation in the operation mode.

A probe 105 shown in FIG. 9 and connected to the RF characteristic meter AN is connected to the impedance measuring terminal 61 and a ground position, for example, the chassis 21 of the plasma processing apparatus 95. While closing switch SW2 and opening the switch SW1, the loss capacitance $C_X$ as the radiofrequency characteristic of the upper component 19 is measured with the RF characteristic meter AN.

As shown in FIG. 12, the loss capacitance $C_X$ represents the capacitance component generated for the plasma excitation electrode 4 in the upper component 19 which is electrically disconnected from the plasma processing apparatus 95.

The loss capacitance $C_X$ is the sum of the capacitance components for currents which flow in regions other than the path from the plasma excitation electrode 4 to the susceptor electrode 8. That is, the loss capacitance $C_X$ is the sum of the capacitance components between the plasma excitation electrode 4 and individual ground potential positions which are DC grounded. Herein, the individual ground potential positions indicate chamber components at the ground potential other than the susceptor electrode 8 of the plasma processing apparatus 95. That is, the individual ground potential positions include the susceptor shield 12, the cylindrical support 12B, the shaft 13, the bellows 11, the chamber bottom 10A, the chamber wall 10, the upper chamber wall 10a, the chassis 21, the matching box 2, the gas feeding tube 17 at the gas supply side from the insulator 17a, and the sheath line of the radiofrequency power feed line 1A. Specifically, as in the first embodiment shown in FIG. 4, the gas feeding tube 17, the chassis 21, the upper chamber wall 10a are taken into consideration as the loss capacitance $C_X$. That is, the ground potential positions include the susceptor shield 12, the cylindrical support 12B, the shaft 13, the bellows 11, the chamber bottom 10A, the chamber wall 10, the upper chamber wall 10a, the chassis 21, the matching box 2, the gas feeding tube 17 at the gas source side rather than the insulator 17a, and the sheath line of the radiofrequency power feed line 1A. Specifically, as shown in FIG. 4, the gas feeding tube 17, the chassis 21, the upper chamber wall 10a are taken into consideration as the loss capacitance $C_X$ at the portions opposing the plasma excitation electrode 4.

The loss capacitance $C_X$ is defined by the sum of the capacitance $C_A$ between the plasma excitation electrode 4 and the gas feeding tube 17 separated by the insulator 17a, the capacitance $C_B$ between the plasma excitation electrode 4 and the chassis 21, and the capacitance $C_C$ between the plasma excitation electrode 4 and the upper chamber wall 10a.

The plasma electrode capacitance $C_e$ between the parallel plate electrodes 4 and 8 is determined by the areas of (the sizes of) and the distance between the plasma excitation electrode 4 and the susceptor electrode 8.

In the plasma processing apparatus 95 of this embodiment, the loss capacitance $C_X$ is less than 5 times the plasma electrode capacitance $C_e$.

The plasma electrode capacitance $C_e$ and the loss capacitance $C_X$ may be set according to methods (1) to (7) described in the first embodiment.

Moreover, in this embodiment, the plasma electrode capacitance $C_e$ between the plasma excitation electrode 4 and the susceptor electrode 8 is set according to an effective interelectrode distance δ in the plasma space.

Figure 14:
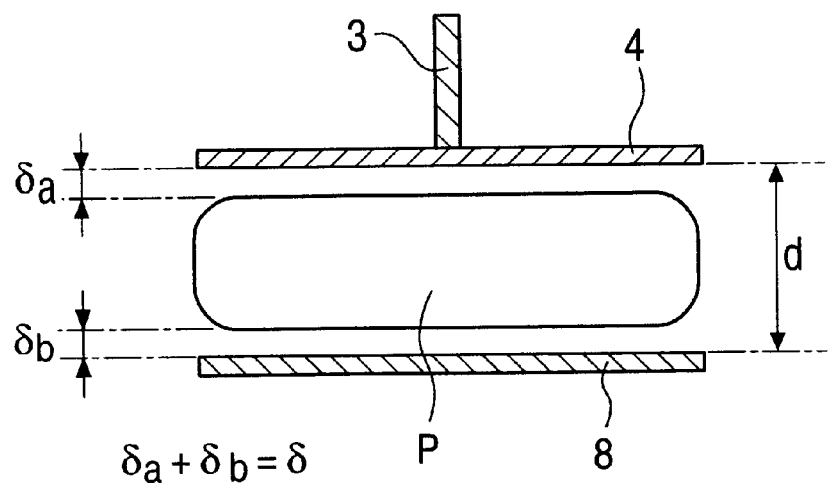
FIG. 14 is a schematic view of the state of the space between two electrodes when a plasma is generated.

FIG. 14 is a schematic view of the state of the space between two electrodes when a plasma is generated.

The plasma excitation electrode 4 and the susceptor electrode 8 are of a parallel plate type and have a distance d. The sum of the distance $δ_a$ between the plasma excitation electrode 4 and a plasma region P, which can be visually recognized during plasma emission, and the distance $\delta_b$ between the susceptor electrode 8 and the plasma region P is represented by $\delta$. In other words, the distance $\delta_a$ of the nonplasma region between the plasma excitation electrode 4 and the plasma region P and the distance $\delta_b$ of the nonplasma region between the plasma region P and the susceptor electrode 8 satisfy relationship (6):

$$\delta_a + \delta_b = \delta \tag{6}$$

An apparent capacitance $C_e''$ between the electrodes 4 and 8 during plasma emission will be derived from the distance d between the electrodes 4 and 8 and the sum $\delta$ of the distances $\delta_a$ and $\delta_b$ of the nonplasma regions between the electrodes 4 and 8, as follows.

The plasma region P functions as a conductor during plasma emission; hence, the distance between the electrodes 4 and 8 can be regarded as $\delta$ during the plasma emission. The apparent capacitance $C_e''$ between the parallel plate electrodes 4 and 8 during plasma emission is inversely proportional to the effective distance $\delta$ between the electrodes 4 and 8, and the actual interelectrode capacitance $C_e$ when the plasma is not emitted is inversely proportional to the actual distance d between the electrodes 4 and 8. Thus, the apparent capacitance $C_e''$ during plasma emission becomes $d/\delta$ times the actual interelectrode capacitance $C_e$ as shown in relationship (7):

$$C_e \propto 1/d$$
$$C_e'' \propto 1/\delta$$
$$\therefore C_e'' \propto d/\delta \cdot C_e \tag{7}$$

Accordingly, in this embodiment, five times the actual interelectrode capacitance $C_e$ may be greater than the loss capacitance $C_X$. That is, the actual interelectrode capacitance $C_e$ may be set such that $5 \times d/\delta$ times the actual interelectrode capacitance $C_e$ is greater than the loss capacitance $C_X$. Power consumption during plasma emission is thereby further improved.

The plasma electrode capacitance $C_{e0}$ is designed such that the 5 times the plasma electrode capacitance $C_e''$ during the plasma emission mode ($5 \times d/\delta$ times the plasma electrode capacitance $C_e$) is larger than the loss capacitance $C_X$ defined as above. After reassembling the apparatus at a customer site, plasma-treating workpieces using the apparatus, and performing adjustment works such as overhauling, parts replacement, assembly with alignment and the like, the plasma processing apparatus is maintained such that the difference $\Delta C_X$ between the loss capacitance $C_{X1}$ at the later time t1 is less than 10% of the loss capacitance $C_{X0}$ at the time $t_0$. If the difference $\Delta C_X$ is not less than 10% of the loss capacitance $C_{X0}$, a corrective action is performed.

The loss capacitance $C_X$ may be corrected, for example, according to methods (1) to (7) described in the first embodiment.

The plasma processing apparatus of this embodiment has substantially the same advantages as those in the first embodiment. Moreover, the detachable RF characteristic meter AN is connected to the impedance measuring terminal 61 and the switches SW1 and SW2 having impedances $Z_1$ and $Z_2$, respectively, which are equal to each other, are provided. Thus, the radiofrequency characteristics such as the plasma electrode capacitance $C_e$ and the loss capacitance $C_X$ can be determined only by changing the switches SW1 and SW2 without detaching the plasma processing chamber from the matching circuit 2A.

Moreover, in this embodiment, the loss capacitance $C_X$ is less than 5 times the plasma electrode capacitance $C_e$. Thus, the electrical power which is required for the uniformity in the processing rate (deposition rate), the layer thickness, and layer characteristics, such as isolation voltage, in the planar direction can be reduced, resulting in reduced operational costs.

In this embodiment, the two switches SW1 and SW2 are provided. Since the essential feature in this embodiment is that the impedance from the branch to the measuring point PR is equal to the impedance from the branch to the probe, this requirement may be satisfied using one switch.

In addition to the plasma processing apparatus using the parallel plate type electrodes 4 and 8, the present invention can be applied to an inductive coupled plasma (ICP) excitation type plasma processing apparatus, a radial line slot antenna (RLSA) type plasma processing apparatus, and a reactive ion etching (RIE) type processing apparatus.

Target components may be provided in place of the parallel plate electrodes 4 and 8 to perform plasma sputtering.

Third Embodiment

A performance management system for a plasma processing apparatus according to a third embodiment of the present invention will now be explained with reference to the drawings.

Figure 15:
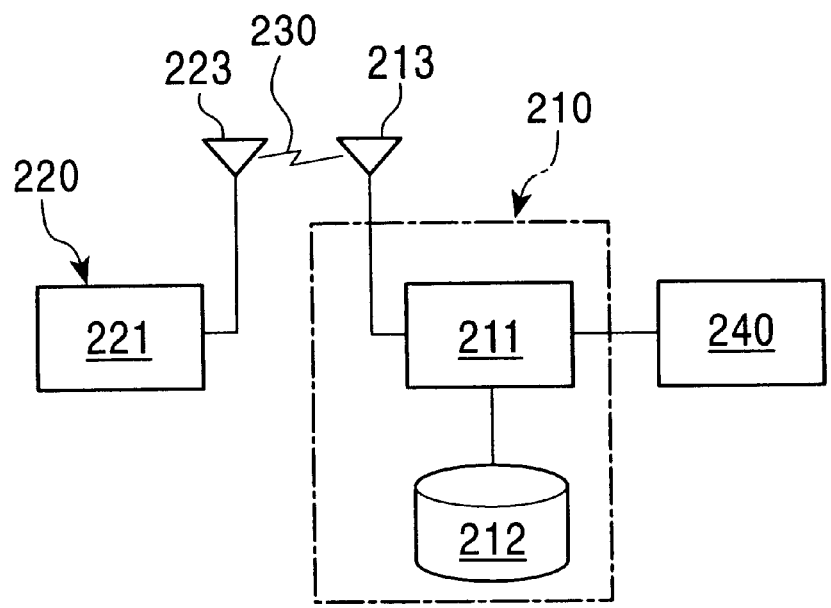
FIG. 15 is a block diagram of a performance management system for a plasma processing apparatus in accordance with a third embodiment of the present invention.
Figure 16:
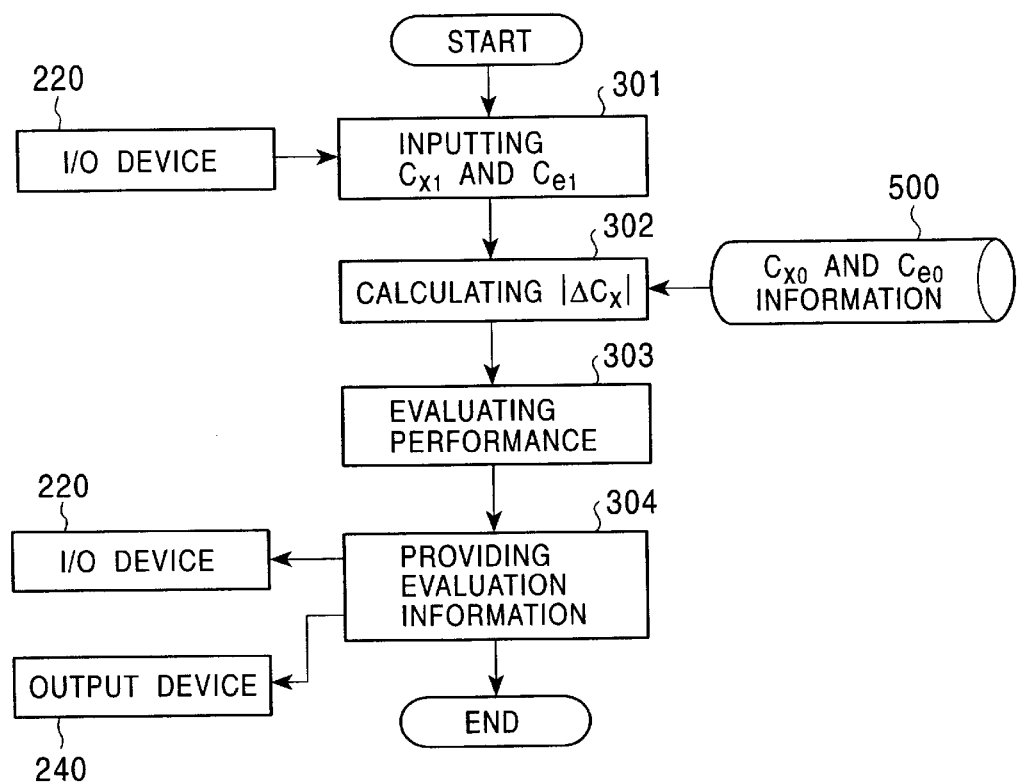
FIG. 16 is a flowchart illustrating a method for providing evaluation information which is prepared by the performance management system shown in FIG. 15.

FIG. 15 is a schematic diagram showing the configuration of a performance management system for a plasma processing apparatus according to a third embodiment of the present invention. FIG. 16 is a flowchart illustrating steps of providing evaluation information in this performance management system.

The performance management system shown in FIG. 15 includes a server 210, a customer I/O device 220, a communication line 230 for linking the server 210 and the customer I/O device 220, and an output device 240 at a delivery site, the output device 240 being linked to the server 210.

The server 210 is under control of a supplier, for example, a manufacturer of the plasma processing apparatus, a distributor, or a maintenance company and is preferably located at the site of the supplier. The server 210 is preferably provided with a high-speed computer for simultaneously providing services to a plurality of customer I/O devices 220 and a high-capacity memory unit for storing information regarding a variety of services and plasma processing apparatuses at customer sites. Examples of such machines are large computers and high-performance workstations.

The server 210 includes a computer 211, a memory unit 212 linked to the computer 211, and a transmitter/receiver 213 linked to the communication line 230. The server 210 is linked to the output device 240 at the delivery site.

The customer I/O device 220 is used by the customer and a maintenance engineer visiting the customer. The customer I/O device 220 may be installed at the customer site or may be a portable device. Any type of the customer I/O device 220 can be used as long as the device can transmit/receive signals to/from the server 210 via the communication line 230. Examples of such devices are personal computers, dedicated terminals, and telephone machines.

The customer I/O device 220 includes a body 221 and a transmitter/receiver 223 linked to the communication line 230.

No limit is imposed as to the medium or the type of communication line 230 as long as the remote server 210 and the customer I/O device 220 can transmit/receive signals. Examples of the communication media for the communication lines 230 are cables, optical fiber lines, and satellite circuits. Examples of the types of the communication line are telephone line network and the Internet.

Referring to FIG. 15, the operation of this embodiment will now be described according to the flowchart shown in FIG. 16.

To start the performance evaluation using this system, a user, for example, a customer or a maintenance engineer who visits the customer, of the performance management system first measures $C_{X1}$ and $C_{e1}$ of the plasma processing apparatus which is delivered to the customer site or is already in operation at the customer site. The value $C_{X1}$ is the loss capacitance between the plasma excitation electrode 4 and the grounded potential positions which are DC grounded measured at a time $t_1$ which is later than a time $t_0$, and the value $C_{e1}$ is the plasma electrode capacitance between the plasma excitation electrode 4 and the susceptor electrode 8 measured at a time $t_1$. The observed values of $C_{X1}$ and $C_{e1}$ are then inputt through the customer I/O device 220 (Step 301) and transmitted to the server 210 via the communication line 230.

The server 210 retrieves from the memory unit 212 data 500 containing $C_{X0}$ and $C_{e0}$, $C_{X0}$ being the reference loss capacitance between the plasma excitation electrode 4 and the grounded potential positions which are DC-grounded measured at the time $t_0$, and $C_{e0}$ being the reference plasma electrode capacitance between the plasma excitation electrode 4 and the susceptor electrode 8 measured at the time $t_0$. Based on these values, the server calculates the absolute value $|\Delta C_{X1}|$ between $C_{X0}$ and $C_{X1}$ (Step 302).

The loss capacitance $C_{X0}$ is the reference loss capacitance set at the delivery site before the plasma processing apparatus is disassembled for the purpose of the transfer. For example, the loss capacitance $C_{X0}$ is set at such a value that 26 times the plasma electrode capacitance $C_{e0}$ is larger than the loss capacitance $C_{X0}$. Preferably, the loss capacitance $C_{X0}$ is set at such a value that 7 times the plasma electrode capacitance $C_{e0}$ is larger than the loss capacitance $C_{X0}$, and, more preferably, the loss capacitance $C_{X0}$ is set at such a value that 5 times the plasma electrode capacitance $C_{e0}$ is larger than the loss capacitance $C_{X0}$.

The server 210 then compares $|\Delta C_X|$ with $C_{X0}$ to evaluate the performance of the plasma processing apparatus. More specifically, the server 210 determines that the plasma processing apparatus satisfies the required level of the performance when $|\Delta C_X|$ is less than 10% of $C_{X0}$. The server 210 determines that the plasma processing apparatus does not satisfy the required level of the performance when $|\Delta C_X|$ is not less than 10% of $C_{X0}$ (Step 303).

Next, the server 210 provides the results of the performance evaluation to both the customer I/O device 220 and the output device 240 located at the location of the supplier (Step 304).

The server 210 transmits print, display, or sound alarm signals to the customer I/O device 220. When the server 210 determines that the required level of performance is maintained, the server 210 outputs through the customer I/O device 220, for example, a message "This apparatus maintains the required performance level. Please continue using." When the server 210 determines that the required level of performance is not maintained, the server 210 outputs through the customer I/O device 220, for example, a message "This apparatus may not be maintained at the required performance level. Please adjust this apparatus according to the manual." These messages may be output for the customer or the maintenance engineer in the form of printing, display on a screen, or sound.

Also, the server 210 transmits print, display, or sound alarm signals to the output device 240 when the server 210 determines that the required level of performance is not maintained. The output device 240 outputs a maintenance command in the form of printing, message display, signal output, or alarm sound.

Preferably, the identification number of the plasma processing chamber is received from the customer I/O device 220 and is output through the customer I/O device 220 in order for the supplier to identify the plasma processing apparatus requiring maintenance. Alternatively, the identification number or phone number of the customer I/O device 220 may be used to determine the identification number of the plasma processing apparatus and to output the results from the output device 240.

As a result, the customer or the maintenance engineer who visits the customer can evaluate the performance of the plasma processing apparatus without actually operating the plasma processing apparatus to deposit layers on substrates and inspecting these substrates.

Moreover, the plasma processing apparatus can be directly evaluated in situ in a shorter period of time instead of by a conventional two-stage evaluation requiring the steps of first depositing the substrate and then evaluating the operation of the plasma processing apparatus based on the deposited substrates. Generally, when the plasma processing apparatus is first installed, the plasma processing apparatus is evaluated by the method requiring deposition on substrates to determine the process recipe for that plasma processing apparatus. Whereas conventional plasma processing apparatuses require evaluation of all the plasma processing chambers, such an evaluation needs to be performed in only one plasma processing chamber of the multi-chamber plasma processing apparatus in this embodiment since the radiofrequency characteristics of that chamber and the other chambers are maintained to be the same.

Thus, the method of this embodiment does not require shutdown of the production line for several days to several weeks to validate and evaluate the performance and operation of the plasma processing apparatus, thereby improving productivity of the production line. Also, the cost for substrates for inspection, cost for processing the substrates for inspection, and labor cost for the workers involved in the adjustment work can be reduced.

Moreover, the malfunctioning of the plasma processing apparatus at the customer site can be immediately detected by the manufacturer, etc., at the delivery site through the maintenance command, providing better repair service to the customer.

The upper limits which constitute the basis for the evaluation information may differ between the server 210 and the customer I/O device 220. For example, the upper limit for the evaluation information transmitted to the customer I/O device 220 may be set at 10% of $C_{X0}$ while the upper limit for the evaluation information transmitted to the output device 240 located at the location of the supplier may be set at 3% of $C_{X0}$. In this manner, the signal indicating that the required performance level is not satisfied is transmitted to the customer I/O device 220 when $|\Delta C_X|$ is not less than 10% of $C_{X0}$ and to the output device 240 located at the location of the supplier when $|\Delta C_{X1}|$ is not less than 3% of $C_{X0}$. When the evaluation standard is tighter at the output device located at the delivery site than at the customer I/O device as in the above, maintenance service can be provided before the performance of the plasma processing apparatus is significantly varied. In other words, the maintenance service can be more preventive.

Fourth Embodiment

Another performance management system for a plasma processing apparatus in accordance with a fourth embodiment will now be described with reference to the drawings.

Figure 17:
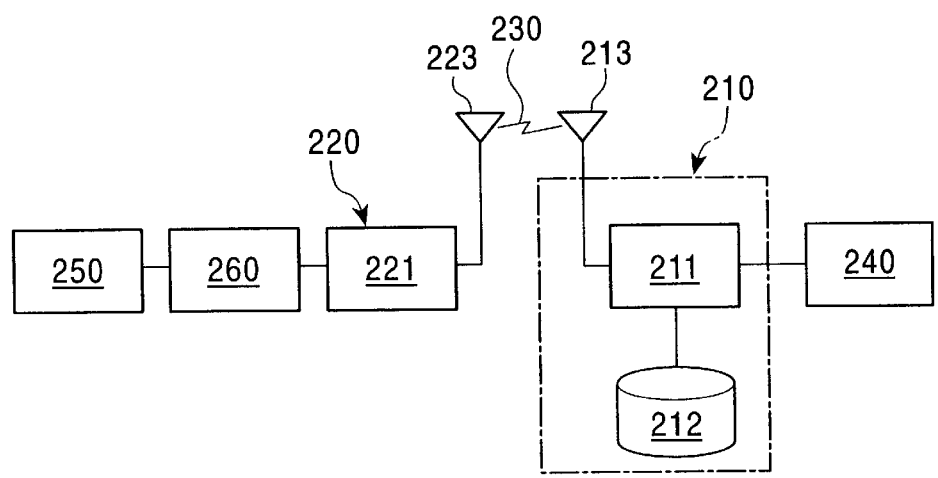
FIG. 17 is a block diagram of a performance management system for a plasma processing apparatus in accordance with a fourth embodiment of the present invention.
Figure 18:
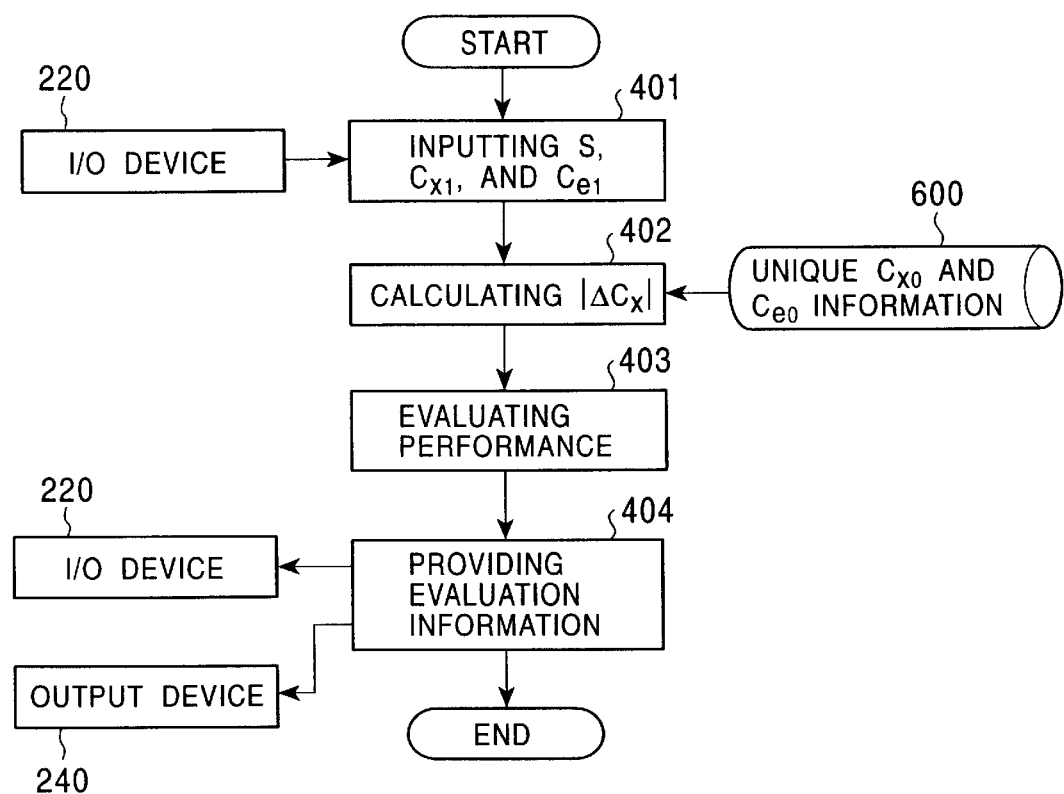
FIG. 18 is a flowchart illustrating a method for providing evaluation information which is prepared by the performance management system shown in FIG. 17.

FIG. 17 is a block diagram of a performance management system for a plasma processing apparatus of this embodiment, and FIG. 18 is a flowchart illustrating steps of providing evaluation information in this performance management system. In these drawings, the components shown in FIGS. 15 and 16 are referred to with the same reference numerals and the description thereof is omitted.

The performance management system shown in FIG. 17 includes a server 210, a customer I/O device 220, a communication line 230 linking the server 210 and the customer I/O device 220, and an output device 240 located at the site of the supplier, the output device 240 being linked to the server 210. The performance management system further includes a capacitance meter 260 for measuring capacitance, the capacitance meter 260 being connected to a plasma processing apparatus 250.

In this embodiment, the output terminal of the capacitance meter 260 is connected to the customer I/O device 220 so that the loss capacitance $C_X$ as the radiofrequency characteristic of the plasma processing apparatus 250 measured using the capacitance meter 260 is directly transmitted to the server 210 via the customer I/O device 220 and the communication line 230 without input by an operator. The customer I/O device 220 is programmed so to read the values measured with the capacitance meter 260 upon the input of the identification number S of a plasma processing chamber.

The procedure in this embodiment will now be described based on the flowchart shown in FIG. 18, with reference to FIG. 17.

A user of this performance management system, for example, a customer or a maintenance engineer who visits the customer, connects the capacitance meter 260 to the customer I/O device 220, and inputs the identification number S of the plasma processing chamber from the customer I/O device 220. The loss capacitance $C_{X1}$ between the electrode connected to a radiofrequency generator and ground potential positions measured at a time $t_1$ and the plasma electrode capacitance $C_{e1}$ between the electrode connected to the radiofrequency generator and a counter electrode measured at the time $t_1$ are measured and automatically input into the customer I/O device 220 from the capacitance meter 260 according to the program stored in the customer I/O device 220 (Step 401).

The identification number S, $C_{X1}$, and $C_{e1}$ are transmitted to the server 210 via the communication line 230.

The server 210 then retrieves from a memory device 212 information 600 containing unique values of $C_{X0}$ and $C_{e0}$ associated with that identification number S, $C_{X0}$ being the loss capacitance between the electrode connected to the radiofrequency generator and the ground potential positions which are DC grounded measured at a time $t_0$ and $C_{e0}$ being the plasma electrode capacitance between the electrode connected to the radiofrequency generator and the counter electrode measured at the time $t_0$. The server 210 calculates the absolute value $|\Delta C_X|$ of the difference between $C_{X0}$ and $C_{X1}$ based on these values (Step 402).

Herein, $C_{X0}$ and $C_{e0}$ stored in the memory device 212 are uniquely associated with the identification number S. In other words, $C_{X0}$ and $C_{e0}$ are the radiofrequency characteristics unique to the individual plasma processing chamber and are actually measured or set during the manufacturing process.

The server 210 compares $|\Delta C_X|$ with $C_{X0}$ to evaluate the performance of the plasma processing apparatus. When $|\Delta C_{X1}|$ is less than 10% of $C_{x0}$, the server 210 determines that the plasma processing apparatus maintains a required level of performance. When $|\Delta C_X|$ is not less than 10% of $C_{X0}$, the server 210 determines that the plasma processing apparatus does not maintain the required level of performance (Step 403).

Next, the server 210 provides the results of the performance evaluation to both the customer I/O device 220 and the output device 240 at the delivery site (Step 404).

The server 210 transmits print, display or sound alarm signals to the customer I/O device 220. When the server 210 determines that the required level of performance is maintained, the server 210 outputs, for example, a message "This apparatus maintains the required level of performance. Please continue using." When the server 210 determines that the required level of performance is not maintained, the server 210 outputs, for example, a message "This apparatus may not maintain the required level of performance. Please adjust this apparatus according to the manual." These messages may be output for the customer or the maintenance engineer in the form of printing, display on a screen, or sound.

Also, the server 210 transmits print, display, or sound alarm signals to the output device 240 when the server 210 determines that the required level of performance is not maintained. The output device 240 outputs a maintenance command by printing or displaying a message or providing a signal or alarm. The server 210 also provides the identification number S of the plasma processing chamber to the output device 240 so that the apparatus requiring the maintenance can be specified at the delivery site.

The performance management system for the plasma processing apparatus according to this embodiment exhibits the same advantages as those in the third embodiment. Since the observed values are stored in connection with the identification numbers S of the plasma processing chambers, the plasma processing chambers can be more precisely controlled. The supplier, such as a manufacturer and so on can immediately specify at its own location the malfunctioning plasma processing chamber.

In a plasma processing apparatus having a plurality of the plasma processing chambers or in a plasma processing system having a plurality of plasma processing apparatuses, it is preferable that the same radiofrequency characteristics be set for these plasma processing chambers so that substantially the same film characteristics are achieved using the same process recipe under the same operating conditions. In this respect, $C_{X0}$ and $C_{e0}$ of the plasma processing chambers are preferably set at the same values. However, $C_{X0}$ and $C_{e0}$ may be set significantly different from one another among these plasma processing chambers depending on various factors at the customer site, etc.

Fifth Embodiment

Another performance management system for a plasma processing apparatus in accordance with a fifth embodiment will now be described with reference to the drawings.

The system configuration of the performance management system in this embodiment is also shown in FIG. 17.

The configuration of this embodiment differs from that of the fourth embodiment in that the server 210 stores maintenance engineer information 601. The maintenance engineer information 601 includes performance levels which includes fault levels having predetermined ranges and names of the service engineers registered according to the fault levels. Table 1 shows an example of the maintenance engineer information 601.

TABLE 1

| Maintenance Engineer Information 601 | | |
|---|---|---|
| $|\Delta C_X|$ | Performance Level | Maintenance Engineer |
| $|\Delta C_X| \geq 100\%$ | Fault level 1 | Engineer A, Engineer B |
| $100\% > |\Delta C_X| \geq 50\%$ | Fault level 2 | Engineer C, Engineer D |
| $50\% > |\Delta C_X| \geq 10\%$ | Fault level 3 | Engineer B, Engineer F |
| $10\% > |\Delta C_X| \geq 3\%$ | Good | Engineer G |
| $3\% > |\Delta C_X|$ | Best | — |

Figure 19:
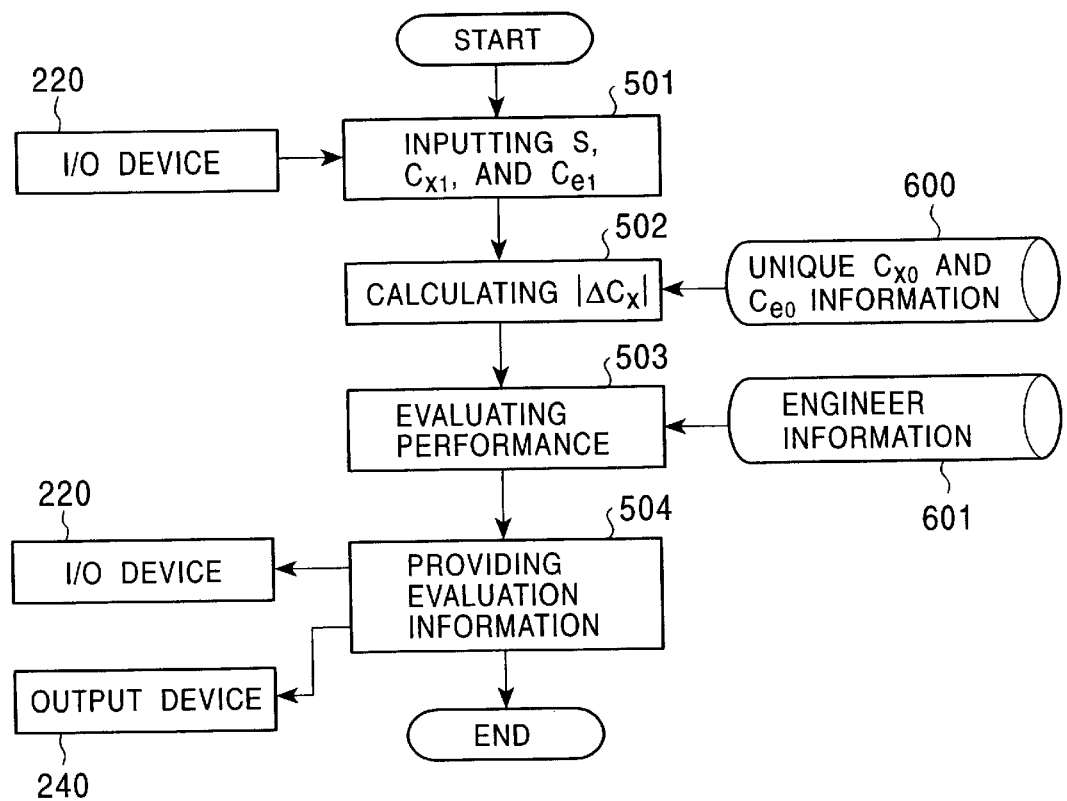
FIG. 19 is a flowchart illustrating a method for providing evaluation information for a plasma processing apparatus in accordance with a fifth embodiment of the present invention.

The procedure in this embodiment will now be described based on the flowchart shown in FIG. 19, with reference to FIG. 17. The description regarding Steps 501 and 502 in the flowchart shown in FIG. 19 are omitted because these steps are the same as Steps 401 and 402, respectively, in FIG. 18.

The server 210 calculates $|\Delta C_X|$ in Step 502 and evaluates the performance level of the plasma processing apparatus with reference to the engineer information 601. When the server 210 determines that the apparatus is in any one of fault levels 1 to 3, the server 210 calls up the maintenance engineer's names associated with that fault level contained in the engineer information 601 (Step 503).

The server 210 provides the relevant performance level to both the customer I/O device 220 and the output device 240 at the delivery site (Step 504).

The relevant performance level is transmitted to the customer I/O device 220 by sending print signals, display signals, or voice signals.

When the performance level is "best", the customer I/O device 220 outputs a message, for example, "This apparatus maintains a required level of performance. Please continue using." When the performance level is "good", the customer I/O device 220 outputs a message "This apparatus still maintains the required level of performance, but will need inspection soon." When the performance level is any one of fault levels 1 to 3, the customer I/O device 220 outputs a message "This apparatus is at fault level 2. Please request your maintenance engineer for adjustment." These messages may be made available to the customer or a service engineer in the form of print-out, display on the screen, or voice.

The server 210 also outputs the performance level, the maintenance engineer's names corresponding to the performance level, and a maintenance command through the output device 240 at the delivery site.

According to the performance management system for the plasma processing apparatus of this embodiment, the maintenance command is output with the fault level and the maintenance engineer's names corresponding to the fault level at the location of the supplier.

Thus, the fault level of the plasma processing apparatus at a distant place can be identified at the location of the supplier, and a maintenance engineer having skill suitable for the fault level can be readily dispatched, thus achieving rapid and adequate maintenance services with an efficient engineer distribution. Accordingly, the maintenance system after installation of the plasma processing apparatus can be operated effectively.

No limit is imposed as to the type of the plasma processing apparatus managed by the management system of this embodiment. The management system of this embodiment can be applied to the plasma processing apparatuses according to the above-described first and second embodiments, to the plasma processing apparatus according to ninth and tenth embodiment described below, and to a plasma processing system of an eleventh embodiment described below.

Sixth Embodiment

Next, a performance validation system of a plasma processing apparatus according to a sixth embodiment of the present invention will be described with reference to the drawings. In the following description, a person who distributes and maintains the plasma processing apparatus is referred to as a "maintenance engineer".

Figure 20:
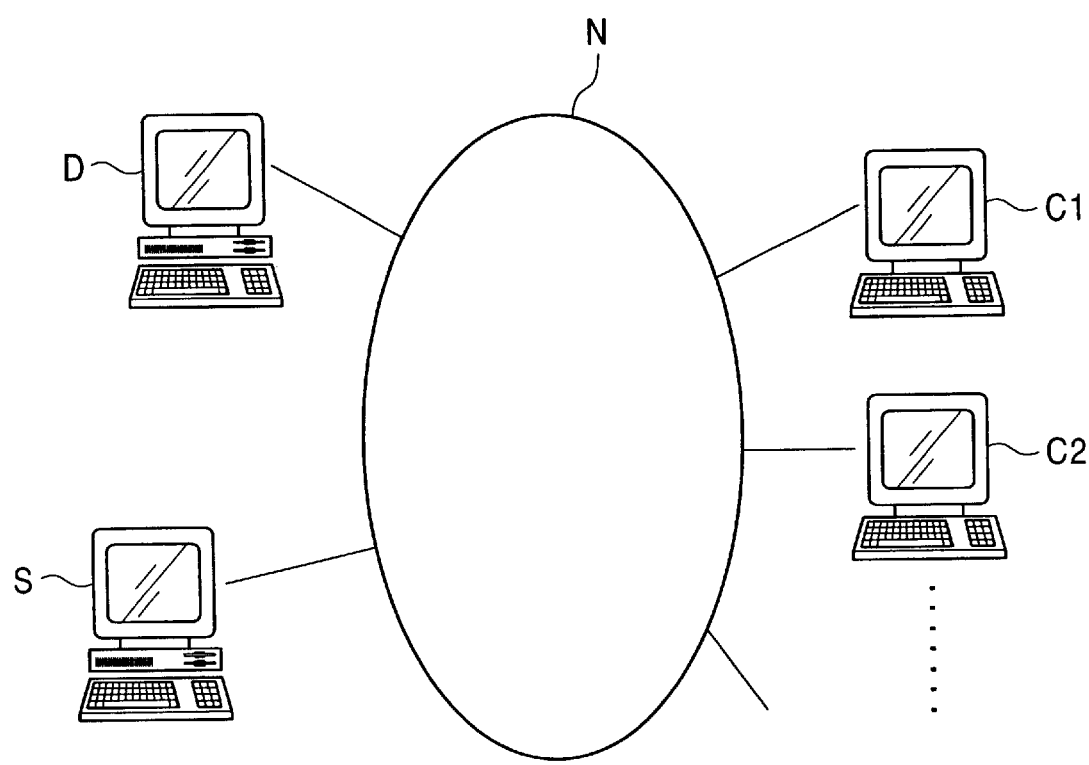
FIG. 20 is a block diagram of a performance management system for a plasma processing apparatus with the present invention.

FIG. 20 is a diagram illustrating the configuration of the performance validation system of the plasma processing apparatus of this embodiment.

Referring to FIG. 20, the performance validation system comprises a customer terminal (client terminal) C1, an engineer terminal (client terminal) C2, a server computer (hereinafter simply referred to as "server") S which functions as operational performance information providing means, a database computer (hereinafter simply referred to as "database") D which stores information, and a public line N. The customer terminal C1 and the engineer terminal C2, the server S, and the database D are linked to one another via the public line N.

The terminals C1 and C2 communicate with the server S using a widespread Internet communication protocol, such as TCP/IP or the like. The customer terminal C1 serves as a customer-side information terminal for validating, via the public line N, the state of the performance of the plasma chamber which the customer purchased from the maintenance engineer. An information web page which is a "plasma chamber performance information page" stored in the server S is provided through the customer terminal C1. The maintenance engineer uploads "$C_{X0}$ information" which is the information on the loss capacitance between an electrode connected to a radiofrequency generator and ground potential positions which are DC-grounded measured at a time $t_0$, and "$C_{e0}$ information" which is the information on the plasma electrode capacitance between the electrode connected to the radiofrequency generator and a counter electrode to the server S through the engineer terminal C2. The "$C_{X0}$ information" and "$C_{e0}$ information" are part of the "performance information". The engineer terminal C2 also receives E-mail sent from the customer through the customer terminal C1.

In this embodiment, the plasma processing apparatus or system has substantially the same structure as those of the first and second embodiments. The structure of the apparatus, such as the number of chambers and the like, can be set as desired.

The server S communicates through a modem when the public line N is an analog line or through a dedicated terminal adapter or the like when the public line N is a digital line such as an integrated services digital network (ISDN).

The server S is a computer that provides performance information. The server S transmits the performance information to the customer terminal C1 using an Internet communication protocol upon request from the customer terminal C1 requesting the display of the information. Herein, each of the customers who purchased the plasma chambers receives a "browsing password" for viewing the performance information before the plasma processing apparatus is delivered to the customer from the maintenance engineer. The password is required when the customer wishes to view operation and maintenance information which is part of the performance information, and the server S sends the operation and maintenance information to the customer terminal C1 only when a registered browsing password is provided.

The above-described "performance information", details of which will be described in a later section, comprises information regarding models of the plasma processing chambers of the plasma processing apparatus or plasma processing system available from the maintenance engineer, information regarding quality and performance of each model in the form of specifications, information regarding parameters indicative of quality and performance of specific apparatuses delivered to customers, and information regarding parameters and maintenance history.

The information regarding quality and performance of specific apparatuses and the information regarding parameters and maintenance history are accessible only from the customers provided with "browsing passwords".

The performance information described above is provided in the form of "operation and maintenance information" and "standard performance information". The operation and maintenance information is a type of information provided from the maintenance engineer or the customer to the server S to indicate the actual state of operation and maintenance. The standard performance information is stored in the database D and serves as a catalog accessible from potential customers. The "standard performance information" is an objective description regarding the performance of the plasma processing performed in the plasma chamber and allows prediction of the deposition state when applied to deposition processes such as plasma-enhanced CVD and sputtering processes.

In this embodiment, the "standard performance information" is stored in the database D.

Upon the request from the customer terminal C1 to view the "performance information", the server S retrieves the requested "standard performance information" from the database D and sends the information to the customer terminal C1 of the customer in the form of a performance information page. When a customer sends a request to view the "performance information" along with the browsing password of the customer, the server S retrieves the requested "standard performance information" from the database D as described above, composes the "performance information" by combining the retrieved "standard performance information" and the "operation and maintenance information" provided from the maintenance engineer through the engineer terminal C2, and sends the "performance information page" to the customer terminal C1 of the customer.

The database D stores the "standard performance information", which is part of the "performance information", according to the models of the plasma chambers of the plasma processing apparatus or plasma processing system, reads out the "standard performance information" in response to a search request sent from the server S, and transmits the retrieved information to the server S. Although only one server S is illustrated in FIG. 20, a plurality of servers are provided in this embodiment. In this respect, it is useful to store general purpose "standard performance information" in the database D instead of these servers in order for the information to be shared among the plurality of servers managed by maintenance engineers from different locations.

Figure 21:
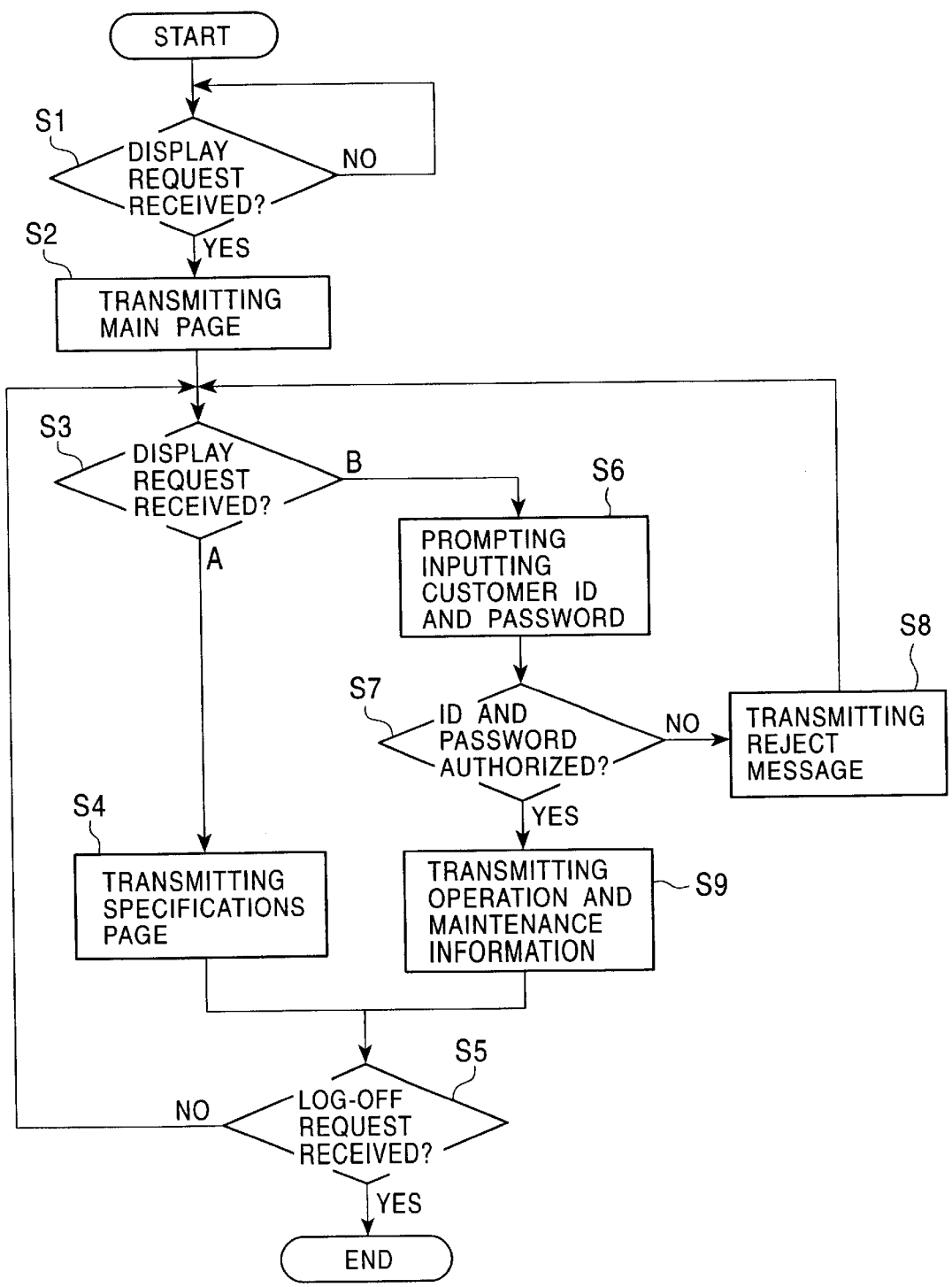
FIG. 21 is a flowchart illustrating processing for providing performance information from a server in the performance validation system of the plasma processing apparatus in accordance with the present invention.

Next, an operation of the performance validation system for the plasma processing apparatus or the plasma processing system having the above-described structure will be explained in detail with reference to the flowchart shown in FIG. 21. The flowchart illustrates the process of providing the "performance information" executed at the server S.

Generally, the maintenance engineer presents, as a reference for purchase, the "standard performance information" contained in the "performance information" of a model of the plasma chamber the maintenance engineer is attempting to sell to the customer. The customer is able to understand the performance of the plasma chamber and possible plasma processes using the plasma chamber through this "standard performance information".

The customer who purchased the plasma processing apparatus of the plasma processing system are provided with the "standard operation information", which serves as the reference during the use of the plasma chambers, and the "operation and maintenance information", which serves as the parameters of the operation. The customer, i.e., the user of the plasma chambers, may validate the operation of the plasma chambers by comparing the "standard performance information" and the "operation and maintenance information" so as to be informed of the state of the plasma processing and to determine whether it is necessary to perform maintenance.

For example, a customer who is considering purchasing a new plasma chamber from the maintenance engineer may access the server S to easily confirm the "standard performance information" of the plasma chamber the customer is intending to purchase as follows.

The customer who desires to view the "performance information" first sends from the customer terminal C1 a request for access to the server S based on an IP address of the server S set in advance.

Upon receiving the request for access (Step S1), the server S transfers a main page CP to the customer terminal C1 (Step S2).

Figure 22:
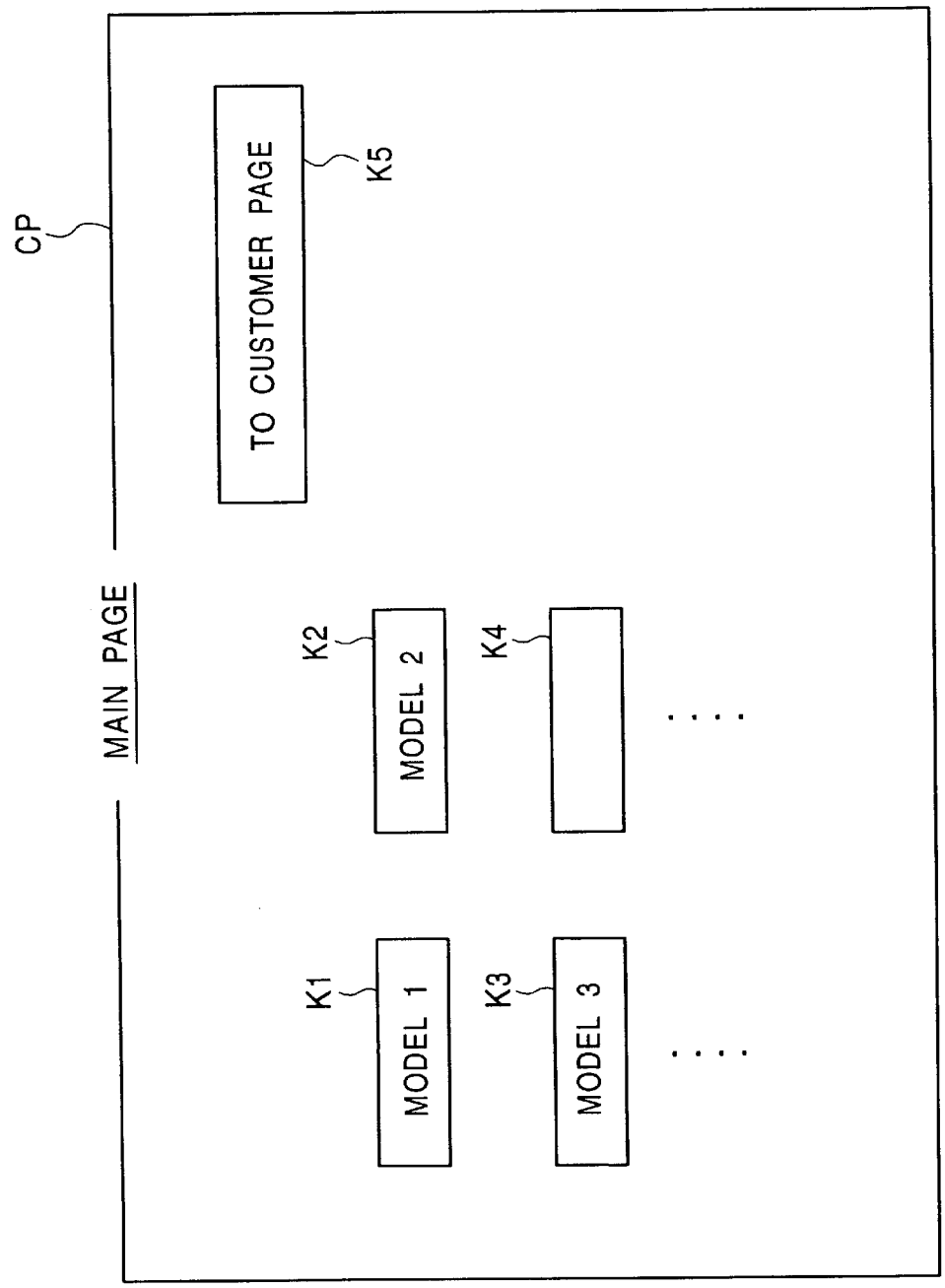
FIG. 22 shows an output form of a main page CP in accordance with the performance validation system of the plasma processing apparatus of the present invention.

FIG. 22 shows an example of the main page CP sent from the server S to the customer terminal C1 through the steps described above. The main page CP comprises model selection buttons K1 to K4 for displaying the "standard performance information" contained in the "performance information" according to models available from the maintenance engineer and a user button K5 for requesting the display of a customer page exclusive to the customer to whom the maintenance engineer delivered the plasma processing chamber.

For example, a customer may select one of the model selection buttons K1 to K4 using a pointing device (for example, a mouse) of the customer terminal C1 so as to specify which model of the plasma chamber the customer desires to obtain the information about. Such a selection is regarded as the request for accessing the "standard performance information" among the "performance information", and a request to that effect is sent to the server S.

Upon receipt of the request (Step S3), the server S sends the customer terminal C1 a subpage containing the requested information on the selected model. That is, when display of "standard performance information" is requested by specifying a model (A in FIG. 21), the server S retrieves data such as "vacuum performance", "gas charge/discharge performance", "temperature performance", "electrical performance of the plasma processing chamber", and the like, and data regarding variations in these parameters effected in the plasma processing apparatus or plasma processing system from the database D and sends the customer terminal C1 a specifications page CP1 shown in FIG. 23 containing these data (Step S4).

Figure 23:
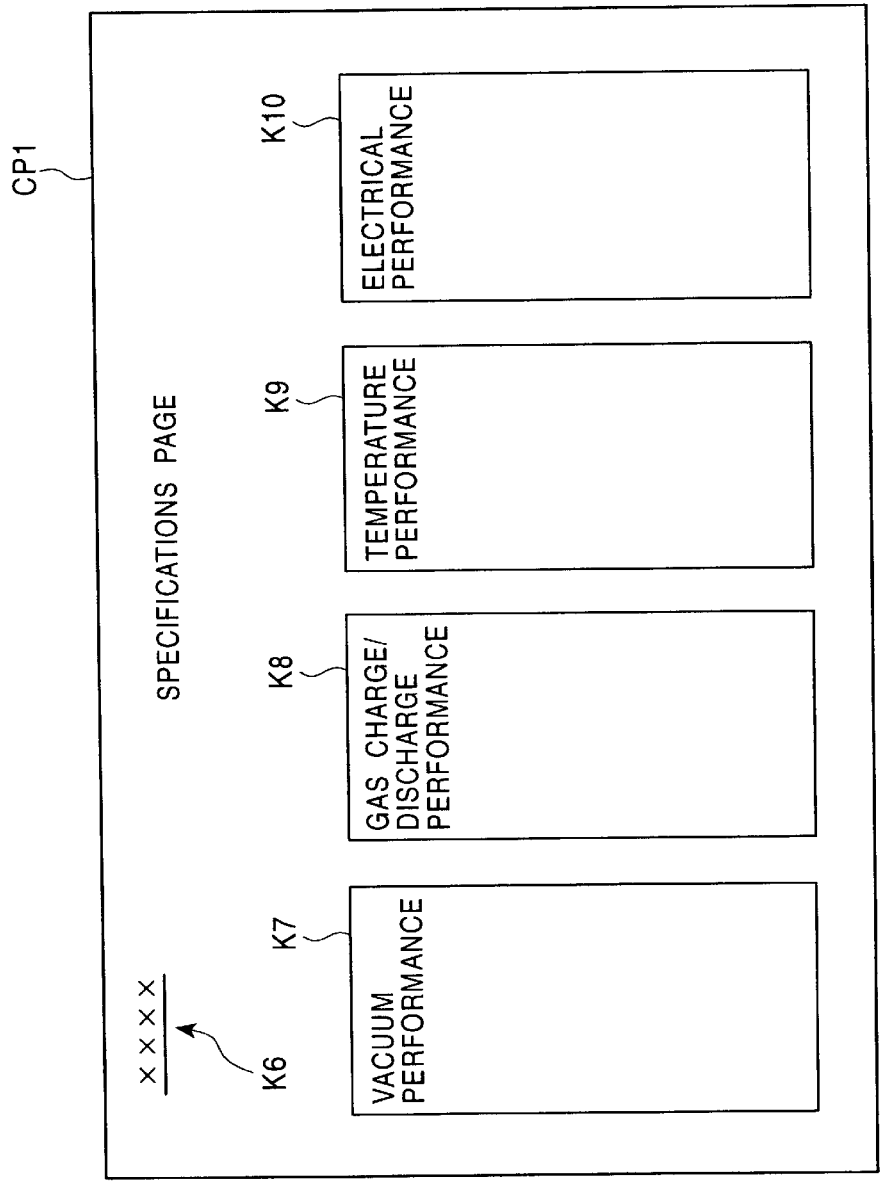
FIG. 23 shows an output form of a subpage CP1 in accordance with the performance validation system of the plasma processing apparatus of the present invention.

As shown in FIG. 23, the specifications page CP1 comprises an apparatus model section K6 indicating the selected model of the apparatus, a vacuum performance section K7, a gas charge/discharge performance section K8, a temperature performance section K9, and an electrical performance section K10 indicating the electrical performance of the plasma processing chamber. These constitute the "standard performance information" of the selected model and each contains the following descriptions.

The vacuum performance section K7 contains below:

ultimate degree of vacuum: $1 \times 10^{-4}$ Pa or less; and operational pressure: 30 tb 300 Pa.

The gas supply/discharge performance section K8 contains below:

maximum gas flow rates:

| | |
|---|---|
| $SiH_4$ | 100 SCCM, |
| $NH_3$ | 500 SCCM, |
| $N_2$ | 2,000 SCCM; and | discharge property: 20 Pa or less at a flow of 500 SCCM.

The temperature performance section K9 contains below:

heater temperature: 200 to 350±10° C.; and chamber temperature: 60 to 80±2.0° C.

Herein, the SCCM (standard cubic centimeters per minute) values represent the corrected gas flow rates at standard conditions (0° C. and 1,013 hPa) and the unit thereof is $cm^3/min$.

A variation in each of the above-described parameters P among the plurality of the plasma chambers constituting the plasma processing apparatus or the plasma processing system is defined by relationship (10B) below:

$$(P_{max} - P_{min})/(P_{max} + P_{min}) \quad (10B)$$

wherein $P_{max}$ represents the maximum value of a particular parameter among the plurality of the plasma processing chambers and $P_{min}$ represents the minimum value of the particular parameter among the plurality of the plasma processing chambers. The upper limit of the variation in the plasma processing apparatus or system is displayed for each of the parameters.

In the electrical performance section K10, the following items are included: a value of the plasma electrode capacitance $C_e$ between the plasma excitation electrode 4 and the susceptor electrode 8 of the plasma processing apparatuses described in the first, second, ninth, and tenth embodiments and the plasma processing system of the eleventh embodiment; a value of the loss capacitance $C_x$ between the plasma excitation electrode 4 and the ground potential positions; the setting ranges of these capacitances; and relationship between $C_x$ and $C_e$. In addition to these, values of resonant frequency f, impedance Z at a power frequency, resistance R of the plasma processing chamber, and reactance X are included in the electrical performance section K10. As the resonant frequency f, a first series resonant frequency $f_0$ of the plasma processing chamber or a series resonant frequency may be used. Here, the first series resonant frequency $f_0$ is measured at an input end of the radiofrequency feeder, and the series resonant frequency is defined by the capacitance between the electrode and the counter electrode. The electrical performance section K10 further includes the setting range of the first series resonant frequency $f_0$ and the relationship between the first series resonant frequency $f_0$ and the power frequency $f_e$.

Furthermore, the specification page CP1 includes a performance guarantee statement such as "we guarantee that each of the parameters is within the setting range described in this page upon the delivery of the plasma chamber".

In this manner, the overall radiofrequency electrical characteristics of the plasma chamber and the variation in the electrical characteristics of the plasma chambers can be presented to a potential purchaser as a novel reference which has never been considered before. The performance information can be printed out at the customer terminal C1 or the engineer terminal C2 to make a hard copy thereof so that the information can be presented in the form of a catalog or specifications describing the performance information containing the above-described detailed information. When settings of the first series resonant frequency $f_0$, the resistance R, the reactance X, the plasma electrode capacitance $C_e$, the loss capacitance $C_x$, and the like, an the performance guarantee statement are presented to a potential purchaser through a terminal such as customer terminal C1, through a catalog, or through a specification, the potential purchaser may judge the performance of the plasma chamber just as if the customer is examining electrical components and may then purchase the plasma chamber from the maintenance engineer based on that judgement.

After the server S completes the transmission of the above-described subpage to the customer terminal C1, the server S waits for the request to display another subpage (Step S3) if a log-off request from the customer terminal C1 is not received (Step S5). If a log-off request from the customer terminal C1 is received by the server S (Step S5), the server S terminates the interaction with the customer terminal C1.

The customer who purchased and obtained the plasma chamber from the maintenance engineer can easily check the "performance information" of the specific plasma chambers of the plasma processing apparatus or system that the customer purchased, by accessing the server S as below.

When the customer and the maintenance engineer enter a sales contract, a customer ID, which is unique to the individual customer and a "customer password (browsing password)" for accessing the "operation and maintenance information" of the plasma processing apparatus or system or the plasma chambers thereof are given to the individual customer by the maintenance engineer. The customer ID may be associated with the serial number of the purchased plasma processing apparatus or system or with the serial number of the plasma chambers constituting the plasma processing apparatus or system. The server S sends the "operation and maintenance information" to the customer terminal C1 only when the registered browsing password is provided.

A customer who desires to access the information selects the user button K5 in the above-described main page CP to send the request for the display of a customer page to the server S.

Figure 24:
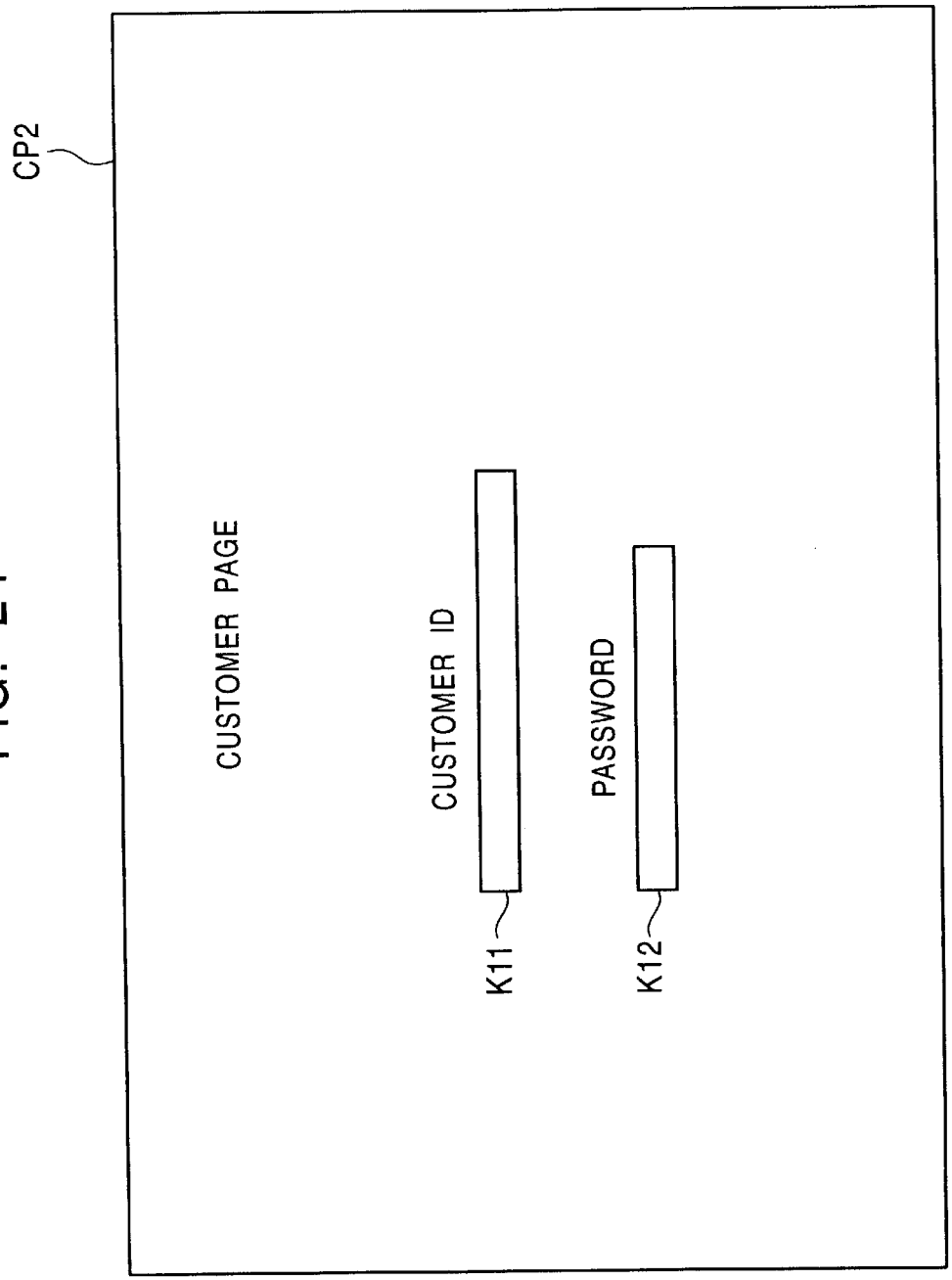
FIG. 24 shows an output form of a subpage CP2 in accordance with the performance validation system of the plasma processing apparatus of the present invention.

Upon receiving the request for the display (Step S3-B), the server S sends a subpage prompting the customer to input the "browsing password" (Step S6). FIG. 24 is an illustration of a customer page CP2. The customer page CP2 comprises a customer ID input field K11 and a password input field K12.

The customer page CP2 prompting the customer to input is displayed at the customer terminal C1. In response to the prompt, the customer enters the "browsing password" and the "customer ID", which are provided from the maintenance engineer, through the customer terminal C1 so as to allow the server S to identify the plasma processing apparatus or system and the plasma chambers thereof that the customer has purchased.

At this stage, the customer enters the customer ID into the customer ID input field K11 shown in FIG. 24 and the browsing password into the password input field K12 shown in FIG. 24. The server S sends the "operation and maintenance information" subpage previously associated with that "browsing password" to the customer terminal C1 (Step S9), only when the server S receives the registered "customer ID" and the "browsing password" from the customer terminal C1 (Step S7).

In other words, the "operation and maintenance information" is accessible only by the specific customer who entered the sales contract for that plasma processing apparatus or system, i.e., who is in possession of the registered "browsing password". A third party using the server S cannot access the "operation and maintenance information". Although the maintenance engineer often exchanges sales contracts with a plurality of customers simultaneously and delivers a plurality of plasma chambers for these customers simultaneously, each of the customers is provided with a "browsing password" unique to the customer, unique to the plasma processing apparatus or system, or unique to each one of the plasma chambers constituting the plasma processing apparatus or system and is capable of individually accessing the "operation and maintenance information" associated with the "browsing password" assigned to that customer.

Thus, it becomes possible to securely prevent confidential information regarding the purchase of the plasma chamber from leaking to other customers. Furthermore, the plasma processing apparatus, the plasma processing system, the plasma processing chambers thereof can be separately identified even when they are delivered simultaneously.

If the server S does not receive a registered "browsing password" (Step S7), a message refusing the access and prompting the customer to reenter the "browsing password" is sent to the customer terminal C1 (Step S8). If the customer erroneously entered the "browsing password", the customer may take this opportunity to reenter a correct password to access the "operation and maintenance information".

When the ID and the password are verified (Step S7), the server S retrieves data corresponding to the requested information from the database D and sends it to the customer terminal C1 in the form of a subpage. That is, when the server S receives a request from the customer terminal C1 requesting display of the "standard performance information" and the "operation and maintenance information" of the specific plasma processing apparatus or system and the plasma processing chambers thereof identified by the customer ID, data such as "vacuum performance", "gas charge/discharge performance", "electrical performance of the plasma processing chamber", and the like are retrieved from the database D by specifying the apparatus model, and a specification page (subpage) CP3 containing these data is sent to the customer terminal C1 (Step S9).

Figure 25:
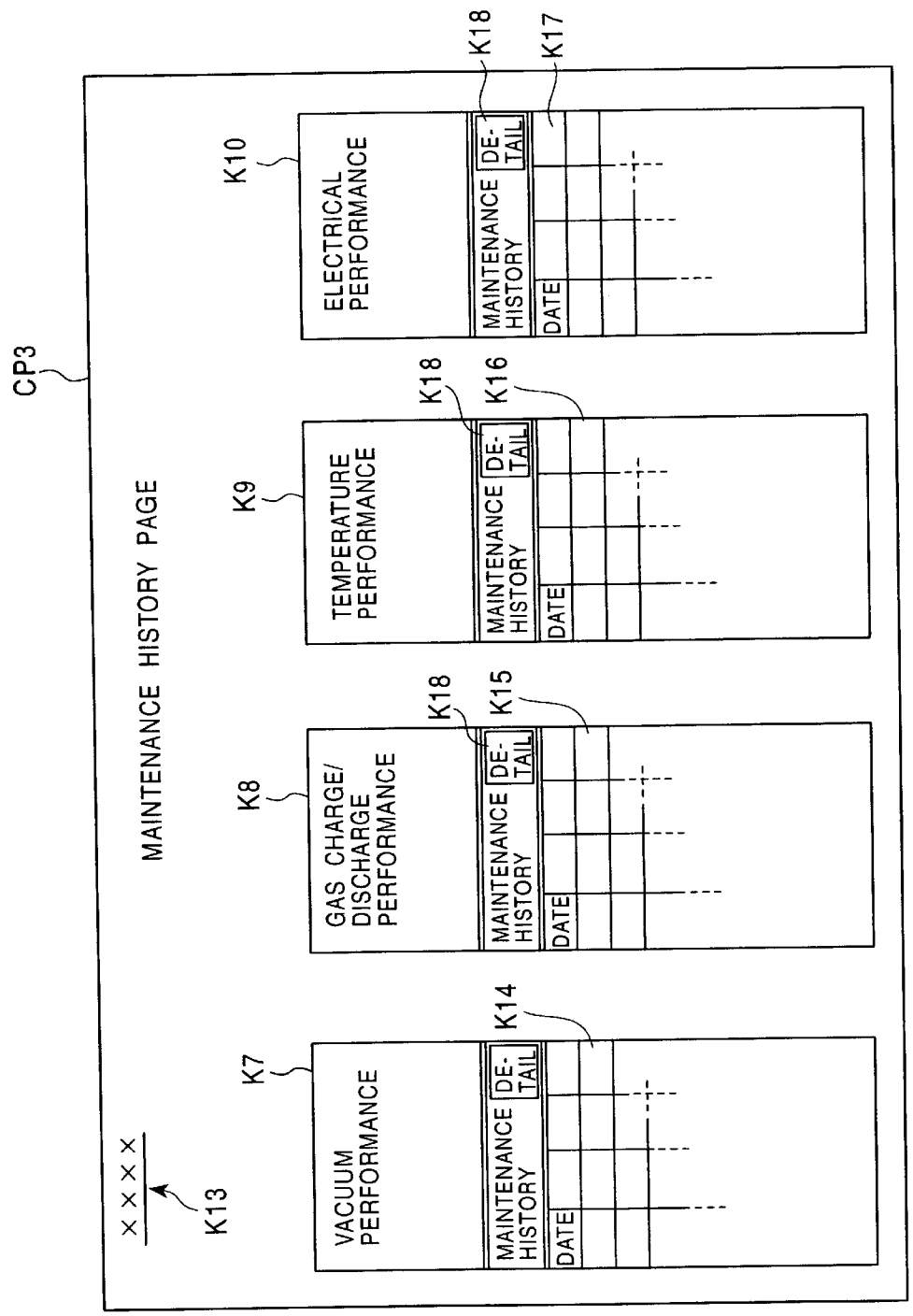
FIG. 25 shows an output form of a subpage CP3 in accordance with the performance validation system of the plasma processing apparatus of the present invention.

FIG. 25 is an illustration of a maintenance history page (subpage) CP3 containing "operation and maintenance information", which is sent from the server S to the customer terminal C1. As shown in FIG. 25, the maintenance history page CP3 comprises a serial number section K13 indicating the serial numbers of the plasma processing apparatus or system and the plasma processing chambers thereof, the vacuum performance section K7, the gas charge/discharge performance section K8, the temperature performance section K9, the electrical performance section K10, a vacuum performance maintenance section K14, a gas charge/discharge performance maintenance section K15, a temperature performance maintenance section K16, and an electrical property maintenance section K17. These sections from K14 to K17 constitute the "operation and maintenance information" of the specific plasma chamber that is purchased.

An example of the description contained in the vacuum performance maintenance section K14 is as follows:

ultimate degree of vacuum: $1.3 \times 10^{-5}$ Pa or less;

operational pressure: 200 Pa.

An example of the description contained in the gas charge/discharge performance maintenance section K15 is as follows:

gas flow rates:

| | |
|---|---|
| $SiH_4$ | 40 SCCM, |
| $NH_3$ | 160 SCCM, |
| $N_2$ | 600 SCCM; and | discharge property: $6.8 \times 10^{-7}$ Pa·m³/sec.

An example of the description contained in the temperature performance maintenance section K16 is as follows:

heater temperature: 302.3±4.9° C.; and chamber temperature: 80.1±2.1° C.

The variation in each of the above-described parameters P among the plurality of plasma processing chambers constituting the plasma processing apparatus or the plasma processing system is defined by relationship (10B) below:

$$(P_{max} - P_{min})/(P_{max} + P_{min}) \tag{10B}$$

wherein $P_{max}$ represents the maximum value of a particular parameter among the plurality of the plasma processing chambers and $P_{min}$ represents the minimum value of the particular parameter among the plurality of the plasma processing chambers. The variation is calculated as above using the measured values and is displayed for each of the parameters P.

A "detail" button K18 is provided in each of the sections K14, K15, K16, and K17. The customer may access the detailed information of the desired section by selecting one of the "detail" buttons K18 provided in the desired section.

When the customer submits a display request by selecting the "detail" button K18, a detailed maintenance page CP4 including detailed information on the maintenance history is transmitted from the server S to the customer terminal C1.

FIG. 26 shows the detailed maintenance page CP4 (subpage) of the electrical performance section K10 transmitted from the server S to the customer terminal C1.

As shown in FIG. 26, the detailed maintenance page CP4 comprises the serial number display sections K13 for displaying the serial numbers of the purchased plasma processing apparatus or system and the plasma chambers thereof, the electrical performance section K10, and the electrical property maintenance section K17. In the electrical property maintenance section K17, the values of the parameters P measured at the time of maintenance and the values of the variation among these measured values of the parameters P are displayed according to the serial numbers of the plasma processing chambers constituting the plasma processing apparatus or system.

The electrical property maintenance section K17 includes measured values of the plasma electrode capacitance $C_e$ between the plasma excitation electrode 4 and the susceptor electrode 8 and the loss capacitance $C_X$ between the plasma excitation electrode 4 and ground potential positions which are DC-grounded, the setting ranges of these capacitances, and the relationship between $C_e$ and $C_X$ described in relation with the plasma processing apparatus of the first, second, ninth and tenth embodiments and the plasma processing system of the eleventh embodiment. In addition to these, the measured values of the resistance R and reactance X of the plasma processing chamber at the power frequency $f_e$ and the first series resonant frequency $f_0$, the setting range of the first series resonant frequency $f_0$, and the relationship between the first series resonant frequency $f_0$ and the power frequency $f_e$ are included in K17.

As shown in FIGS. 25 and 26, in both the maintenance history page CP3 and the detailed maintenance page CP4, the "operation and maintenance information" and the "standard performance information" comprising data such as the "vacuum performance", "gas charge/discharge performance", "temperature performance", "electrical performance", etc. retrieved from the database D, are displayed together. Thus, the customer can view the "operation and maintenance information" while referring to the "standard performance information". The customer may use the "standard performance information" as the reference during use and the "operation and maintenance information" as the parameter indicative of the actual state of the operation. By comparing the "standard performance information" to the "operation and maintenance information", the customer can validate the operation of the plasma processing apparatus or system and the plasma processing chambers thereof, determine whether it is necessary to perform maintenance, and be informed of the state of the plasma processing.

If the server S does not receive a log-off request from the customer terminal C1 after transmission of the sub-pages CP3 and CP4 to the customer terminal C1 (Step S5), the server S transmits an invalid connection message to the customer terminal C1 (Step S8) to prompt reentry of the "customer password" or to wait for the next display request (Step S3). If the server S receives the log-off request from the customer terminal C1 (Step S5), the communication with the customer terminal C1 is terminated.

The performance validation system for a plasma processing apparatus or system according to this embodiment comprises a customer terminal, an engineer terminal, and an information providing means. The customer may request via a public line access to the performance information indicative of the operational performance of the plasma processing apparatus or system the customer purchased from the engineer. The engineer uploads to the information providing means the performance information through the engineer terminal. The information providing means provides the customer terminal with the performance information uploaded through the engineers terminal. The performance information includes the loss capacitance $C_X$ and a variation in the loss capacitance $C_X$ among the plasma processing chambers constituting the plasma processing apparatus or system and can be output as a catalog or specifications document. Thus, the performance information including the performance standard information and operation and maintenance information of the plasma processing chambers constituting the plasma processing apparatus and system is accessible for the customer via public lines as a basis for making a purchasing decisions at the time of purchase or as a reference for evaluating the performance of the plasma processing chambers during the use of the plasma processing apparatus and system.

Moreover, because the performance information includes the information regarding the loss capacitance $C_X$, a variation of the $C_X$, the plasma electrode capacitance $C_e$, and a variation of $C_e$, the basis for determining the operation of the plasma processing chambers of the plasma processing apparatus or system purchased by the customer can be readily provided to the customer. For the customer considering of purchasing a new plasma processing apparatus, the information serves as a basis for making purchasing decisions. The performance information can be output as a catalog or a specification document.

The validation system of this embodiment can be applied to a plasma processing apparatus of any type, for example, a plasma processing apparatus of the first or second embodiments described above, a plasma processing apparatuses of ninth or tenth embodiment described below, and a plasma processing system of eleventh embodiment described below.

Seventh Embodiment

A performance evaluation method of the plasma processing apparatus according to a seventh embodiment of the present invention will now be described with reference to the drawings.

In the performance evaluation method of this embodiment, the plasma processing apparatus according to the first embodiment shown in FIGS. 1 to 8 is evaluated.

This performance evaluation method determines that the plasma processing apparatus maintains a required level of performance when a loss capacitance $C_{X1}$ of the plasma processing chamber after the delivery is less than 26 times the plasma electrode capacitance $C_{e1}$ and that the plasma processing apparatus does not maintain the required level of performance when the loss capacitance $C_{X1}$ is not less than 26 times the plasma electrode loss capacitance $C_{e1}$, wherein the loss capacitance $C_{X1}$ is measured between the plasma excitation electrode and ground potential positions which are DC-grounded and the plasma electrode capacitance $C_{e1}$ is measured between the plasma excitation electrode 4 and the counter electrode 8 which generate a plasma in cooperation with each other. When the required level of performance is not maintained, a corrective action for correcting the loss capacitance $C_{X1}$ is performed such that the loss capacitance $C_{X1}$ is less than 26 times the plasma electrode capacitance $C_{e1}$.

The loss capacitance $C_X$ may be corrected, for example, according to methods (1) to (7) described in the first embodiment.

In this performance evaluation method, the above corrective action can be readily performed; hence, the overall radiofrequency characteristics of the plasma processing apparatus 75 can be readily optimized.

As a result, electrical power from the radiofrequency generator 1 can be effectively fed into the plasma space between the plasma excitation electrode 4 and the susceptor electrode 8 even if the input radiofrequency is higher than 13.56 MHz, which is conventionally used. If the same frequency is supplied, the electrical power will be more efficiently consumed in the plasma space of each plasma processing chamber compared with conventional plasma processing apparatuses. As a result, the processing rate is improved by the higher-frequency plasma excitation. In other words, the deposition rate of the layer is improved in the plasma enhanced CVD or the like.

Since an adequate corrective action is performed based on the results of the performance evaluation method according to this embodiment, input power is effectively supplied into the plasma space, thus preventing undesirable spreading of the plasma. Moreover, uniform plasma treatment is achieved on the substrate 16. When a film is deposited on the substrate 16, the thickness of the film is uniform.

Moreover, feeding of higher radiofrequency enables the plasma potential to reduce, avoiding damage by ions. Thus, the layer quality is improved in layer deposition treatments such as plasma enhanced CVD and sputtering. That is, the higher-wave radiofrequency contributes to improvements in isolation voltage, etching resistance in etching solutions, and density or hardness of the resulting layer. The layer density is represented by, for example, etching resistance in a BHF solution.

After the above corrective action, electrical power with a certain frequency will be more effectively supplied to the plasma space compared with conventional plasma processing apparatus, improving electrical consumption efficiency. Thus, a desired deposition rate and a desired layer property are achieved by reduced power input, resulting in reduced operation costs. Moreover, the processing time is reduced, thus improving productivity and contributing to carbon dioxide emission reduction due to reduced electrical power consumption.

According to the performance evaluation method of this embodiment, the loss capacitance $C_X$ is measured with the RF characteristic meter AN at the installation site of the plasma processing apparatus. The performance of the plasma processing apparatus can be thereby checked and evaluated within a short time. Since no substrate with deposited layers is used for checking, the performance validation and evaluation of the plasma processing apparatus does not require shutdown of the production line for several days to several weeks, thereby improving productivity of the production line.

Since the loss capacitance $C_X$ mainly depends on the mechanical structure, thus individual plasma processing chambers have different loss capacitances. By setting these loss capacitances to the above-described range, the overall radiofrequency characteristics of these plasma chambers can be optimized, achieving stable plasma generation. Consequently, the plasma processing apparatus exhibits improved operation stability.

Because the performance evaluation is performed after the apparatus is disassembled at the engineer site, is transferred to the customer site, and is reassembled at the customer site, the performance of the apparatus can be readily checked for a short time in view of factors which adversely affect the performance, such as misalignment due to vibration during transfer and unsatisfactory reassembling. Moreover, a period from finding to solving the problem can be reduced; hence, the apparatus can be readily used in practice after a reduced amount of installation and set-up time.

Eighth Embodiment

A performance evaluation method for the plasma processing apparatus shown in the second embodiment with reference to FIGS. 11 to 14 will now be described.

This performance evaluation method determines that the plasma processing apparatus maintains a required level of performance when a loss capacitance $C_{X1}$ of the plasma processing chamber after the delivery is less than 26 times the plasma electrode capacitance $C_{e1}$, and that the plasma processing apparatus does not maintain the required level of performance when the loss capacitance $C_{X1}$ is not less than 26 times the plasma electrode loss capacitance $C_{e1}$, wherein the loss capacitance $C_{X1}$ is measured between the plasma excitation electrode and ground potential positions which are DC-grounded and the plasma electrode capacitance $C_{e1}$ is measured between the plasma excitation electrode 4 and the counter electrode 8 which generate a plasma in cooperation with each other, as in the second embodiment. When the required level of performance is not maintained, a corrective action for correcting the loss capacitance $C_{X1}$ is performed such that the loss capacitance $C_{X1}$ is less than 26 times the plasma electrode capacitance $C_{e1}$.

The loss capacitance $C_X$ may be corrected, for example, according to methods (1) to (7) described in the second embodiment.

The performance evaluation method according to the eighth embodiment evaluates whether or not 5 times the plasma electrode capacitance $C_e$" during the plasma emission mode (5×d/δ times the plasma electrode capacitance $C_e$ between the plasma excitation electrode 4 and the counter electrode 8) is larger than the loss capacitance $C_X$ defined as above.

The performance evaluation method for the plasma processing apparatus of this embodiment has substantially the same advantages as those in the seventh embodiment. Moreover, the detachable RF characteristic meter AN is connected to the impedance measuring terminal 61 and the switches SW1 and SW2 having impedances $Z_1$ and $Z_2$, respectively, which are equal to each other, are provided. Thus, the radiofrequency characteristics such as the plasma electrode capacitance $C_e$ and the loss capacitance $C_X$ can be determined only by changing the switches SW1 and SW2 without detaching the plasma processing chamber from the matching circuit 2A.

Moreover, 5×d/δ times the actual interelectrode capacitance $C_e$ is compared with the loss capacitance $C_X$ to evaluate the radiofrequency characteristics of the parallel plate electrodes 4 and 8. Thus, electric power can be more effectively supplied into the plasma emission space, and the power consumption and plasma processing are optimized.

Ninth Embodiment

Figure 27:
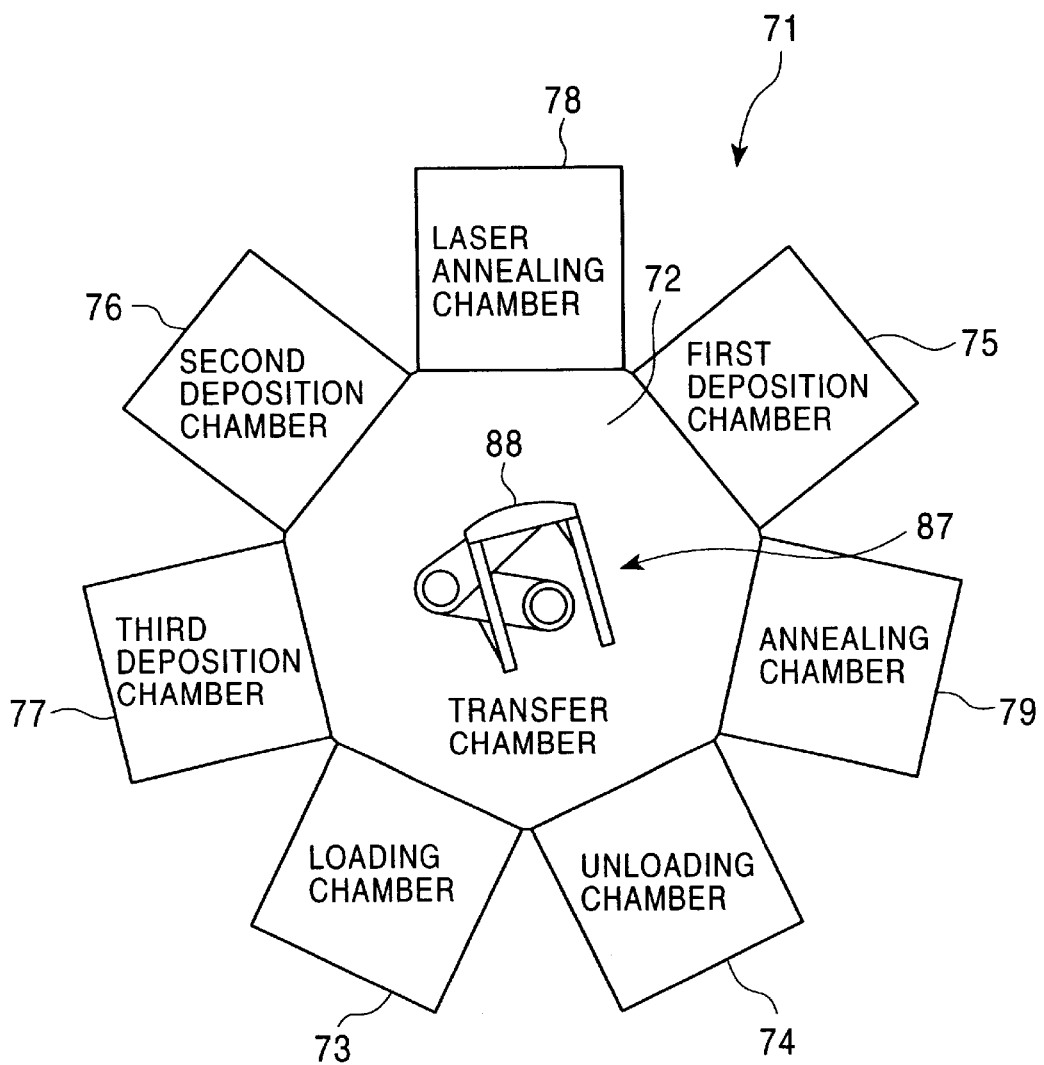
FIG. 27 is a schematic view of a plasma processing apparatus which is used in a performance evaluation method in accordance with a ninth embodiment of the present invention.

FIG. 27 is a schematic view of a plasma processing apparatus 71 which is used in the performance evaluation method in accordance with this embodiment.

This plasma processing apparatus 71 has a plurality of processing chamber units which permit a consecutive treatment of, for example, from the deposition a polycrystalline silicon layer which functions as a semiconductor active layer to the deposition of the gate insulating layer in a top-gate TFT.

In the plasma processing apparatus 71, five processing chamber units, one loading chamber 73, and one unloading chamber 74 are continuously arranged around a substantially heptagonal transfer chamber 72. The five processing chamber units are a first deposition chamber 75 for depositing an amorphous silicon layer, a second deposition chamber 76 for depositing a silicon oxide layer, a third deposition chamber 77 for depositing a silicon nitride layer, a laser annealing chamber 78 for annealing a processed substrate after deposition, and an annealing chamber 79 for performing a heat treatment of the processed substrate.

The first deposition chamber 75, the second deposition chamber 76, and the third deposition chamber 77 have substantially the same configuration as that of the dual-frequency plasma processing apparatus of the first embodiment shown in FIGS. 1 to 8 and may perform different treatments for forming different layers or the same treatment using the same recipe.

The processing chambers 75, 76, and 77 have the same configuration as that of the plasma processing apparatus described in the first embodiment, and detailed description thereof is omitted.

In the deposition of the amorphous silicon layer, the silicon oxide layer, and the silicon nitride layer in the processing chambers 75, 76, and 77, respectively, as shown in FIG. 1, a substrate 16 to be treated is placed on a susceptor electrode 8. A radiofrequency voltage is applied to both a plasma excitation electrode 4 and the susceptor electrode 8 from a radiofrequency generator 1, while a reactive gas is supplied from a gas feeding tube 17 into a chamber space 60 through a shower plate 6 to generate a plasma. The target layer is thereby formed on the substrate 16.

Figure 28:
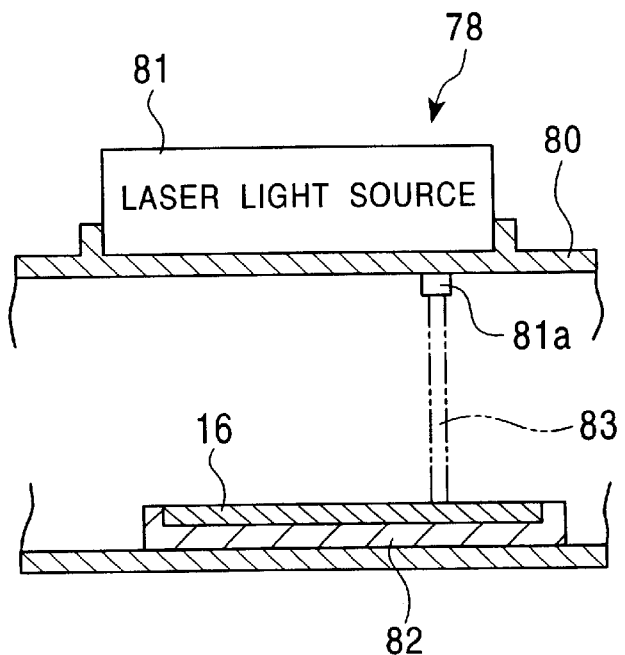
FIG. 28 is a cross-sectional view of a laser-annealing chamber shown in FIG. 27.

Referring to FIG. 28, the laser annealing chamber 78 is provided with a laser light source 81 on the upper wall 80 and a stage 82 for placing the substrate 16 on the bottom wall of the chamber. The stage 82 is horizontally movable in the orthogonal X and Y directions. Spot laser light 83 (shown by chain lines) is emitted from an aperture 81$a$ of a laser light source 81, while the stage 82 holding the substrate 16 horizontally moves in the X and Y directions so that the laser light 83 scans the entire surface of the substrate 16. Examples of the laser light sources 81 are gas lasers using halogen gases, such as XeCl, ArF, ArCl, and XeF.

The laser annealing chamber 78 may have any configuration as long as the spot laser beam from the laser light source can scan the entire surface of the substrate to be treated. Also, in this case, gas lasers using halogen gases, such as XeCl, ArF, ArCl, and XeF can be used as laser light sources. Alternatively, other laser light sources such as a YAG laser may be used depending on the type of the layer to be annealed. Laser annealing may be pulsed laser annealing or continuously oscillating laser annealing. The annealing chamber may have a configuration of, for example, a multistage electrical furnace type.

Figure 29:
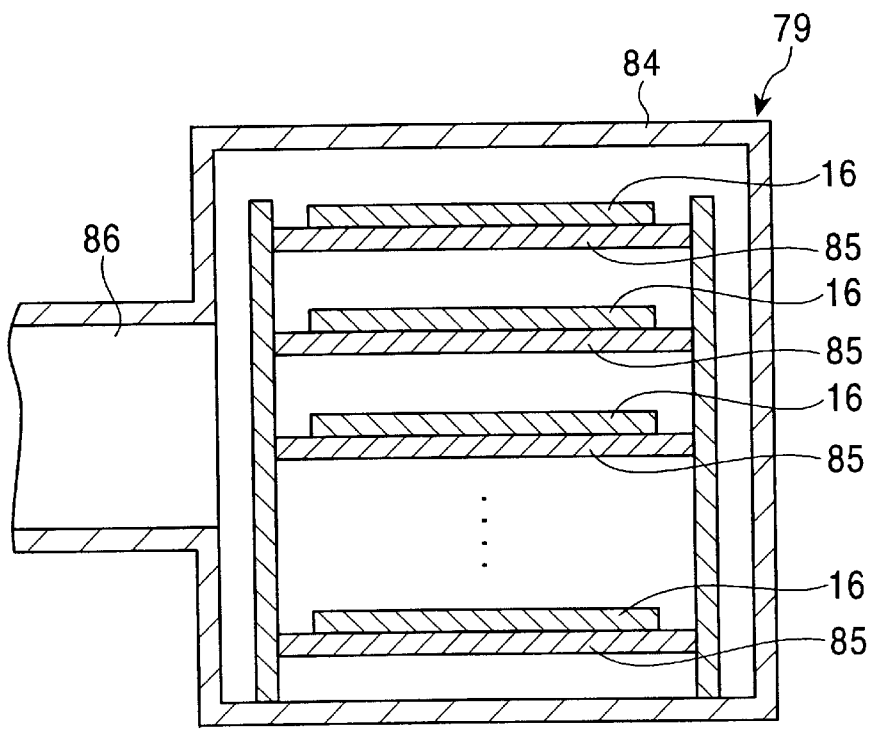
FIG. 29 is a cross-sectional view of an annealing chamber shown in FIG. 27.

Referring to FIG. 29, the annealing chamber 79 is of a multistage electrical furnace type. In the annealing chamber 79, a plurality of substrates 16 is placed on heaters 85 which are vertically arranged in the chamber. These heaters 85 are energized to heat the substrates 16. A gate valve 86 is provided between the annealing chamber 79 and the transfer chamber 72.

Referring to FIG. 27, the loading chamber 73 and the unloading chamber 74 are provided with a loading cassette and an unloading cassette, respectively, which are detachable from these chambers. These cassettes can contain a plurality of substrates 16, that is, the loading cassette contains unprocessed substrates 16 whereas the unloading cassette contains processed substrates 16. A transfer robot 87 for transferring the substrates 16 is placed in the transfer chamber 72 which is surrounded by the processing chamber units, the loading chamber 73, and the unloading chamber 74. The transfer robot 87 is provided with an arm 88 thereon. The arm 88 has an expandable and shrinkable link mechanism and can rotate and vertically move. The substrate 16 is supported and transferred by the end of the arm 88.

In this plasma processing apparatus 71, the operations of the processing chamber units are automatically controlled by a control section, whereas various processing conditions, such as layer deposition conditions, annealing conditions, and heating conditions, and process sequences are controlled by an operator. In the operation of the plasma processing apparatus 71, untreated substrates 16 are set on the loading cassette, and are transferred from the loading cassette into each processing chamber by the transfer robot 87 based on the starting operation by the operator. After the substrates 16 are automatically and sequentially processed in each chamber, the substrates 16 are placed onto the unloading cassette by the transfer robot 87.

In the performance evaluation method for the plasma processing apparatus 71 of this embodiment, a variation $C_{x1r}$ in the loss capacitances $C_{X1}$ of these processing chambers 75, 76, and 77 after the delivery is defined by the maximum $C_{X1max}$ and the minimum $C_{X1min}$ as follows:

$$C_{X1r} = (C_{X1max} - C_{X1min})/(C_{X1max} + C_{X1min})$$

The required level of performance is determined by whether or not the variation $C_{X1r}$ is less than 0.1. That is, the method determine that required level of performance is maintained when the variation $C_{X1r}$ is less than 0.1 and that the required level of performance is not maintained when the variation $C_{X1r}$ is 0.1 or more.

The definition, the measuring method, and the corrective action of the loss capacitance $C_X$ are described in the first embodiment.

In addition to the evaluation of the variation $C_{X1r}$, a variation $C_{e1r}$ of the plasma electrode capacitances $C_{e1}$ of these processing chambers 75, 76, and 77 after the delivery is defined by the maximum $C_{e1max}$ and the minimum $C_{e1min}$ as follows:

$$C_{e1r} = (C_{e1max} - C_{e1min})/(C_{e1max} + C_{e1min})$$

The required level of performance is determined by whether or not the variation $C_{e1r}$ is less than 0.1. That is, the method determine that required level of performance is maintained when the variation $C_{e1r}$ is less than 0.1 and that the required level of performance is not maintained when the variation $C_{e1r}$ is 0.1 or more.

This performance evaluation method facilitates corrective action for differences in radiofrequency characteristics between the processing chambers 75, 76, and 77. Since the loss capacitance $C_X$ and the plasma electrode capacitance $C_e$ of these processing chambers 75, 76, and 77 are controlled within a predetermined range, these processing chambers 75, 76, and 77 consume substantially the same electrical power.

Accordingly, substantially the same result is achieved from a single process recipe for these processing chambers 75, 76, and 77. When layers are formed in these processing chambers 75, 76, and 77, these layers can have substantially the same characteristics, e.g., the thickness, the isolation voltage, and the etching rate. When the variation is controlled to be less than 0.1 under the same deposition conditions in the plasma chambers 75, 76, and 77, the variation in layer thickness can be controlled to be less than ±5%.

As a result, the overall radiofrequency characteristics of the plasma processing apparatus 71 can be optimized so as to generate a stable plasma. Thus, the operations of the processing chambers 75, 76, and 77 of the plasma processing apparatus 71 are stable and uniform. Such a performance evaluation method has not been considered in conventional processes.

The above-mentioned method does not require a determination of process conditions by the relationships between enormous amounts of data on these processing chambers 75, 76, and 77 and the results obtained by evaluation of actually processed substrates.

Thus, in installation of new systems and inspection of installed systems, the time required for obtaining substantially the same results using the same process recipe in these processing chambers 75, 76, and 77 can be significantly reduced by measuring the plasma electrode capacitance $C_e$ and the loss capacitance $C_X$ compared with an inspection method by actual deposition onto the substrate 16. Moreover, according to this inspection method, the plasma processing apparatus 71 can be directly evaluated in situ in a short period of time, instead of a two-stage evaluation, i.e., processing of the substrates and confirmation and evaluation of the operation of the plasma processing apparatus 71 based on the evaluation of the processed substrates. In this embodiment, inspection by layer deposition on substrates is performed to determine the process recipe when the plasma processing apparatus is installed. Since the plasma processing chambers 75, 76, and 77 have the same radiofrequency characteristics, the layer deposition may be performed in only one of the chambers. In the maintenance of the plasma processing apparatus, actual layer deposition is not required because the radiofrequency characteristics of the plasma processing chambers are controlled within the predetermined value. In contrast, in conventional methods performing actual layer deposition on substrates, these plasma processing chambers must be independently evaluated.

Accordingly, the inspection method of this embodiment does not require a shutdown of the production line for several days to several weeks to check and evaluate the operation of the plasma processing apparatus 71. The production line, therefore, has high productivity with reduced expenses for substrates used in the inspection, processing of these substrates, and labor during the inspection operations.

The performance evaluation methods described in the seventh to eighth embodiments are also applicable to the processing chambers 75, 76, and 77. By using both the evaluation based on the comparison of the loss capacitance $C_X$ with the plasma electrode capacitance $C_e$ of each processing chamber and the evaluation based on the variation $C_{X1r}$, the overall radiofrequency characteristics of the processing chambers 75, 76, and 77, including a variation according to chambers, can be readily optimized. These processing chambers 75, 76, and 77 thereby exhibit the same advantages as those in the seventh to ninth embodiments.

Tenth Embodiment

A performance evaluation method in accordance with a tenth embodiment of the present invention will now be described with reference to the drawings.

Figure 30:
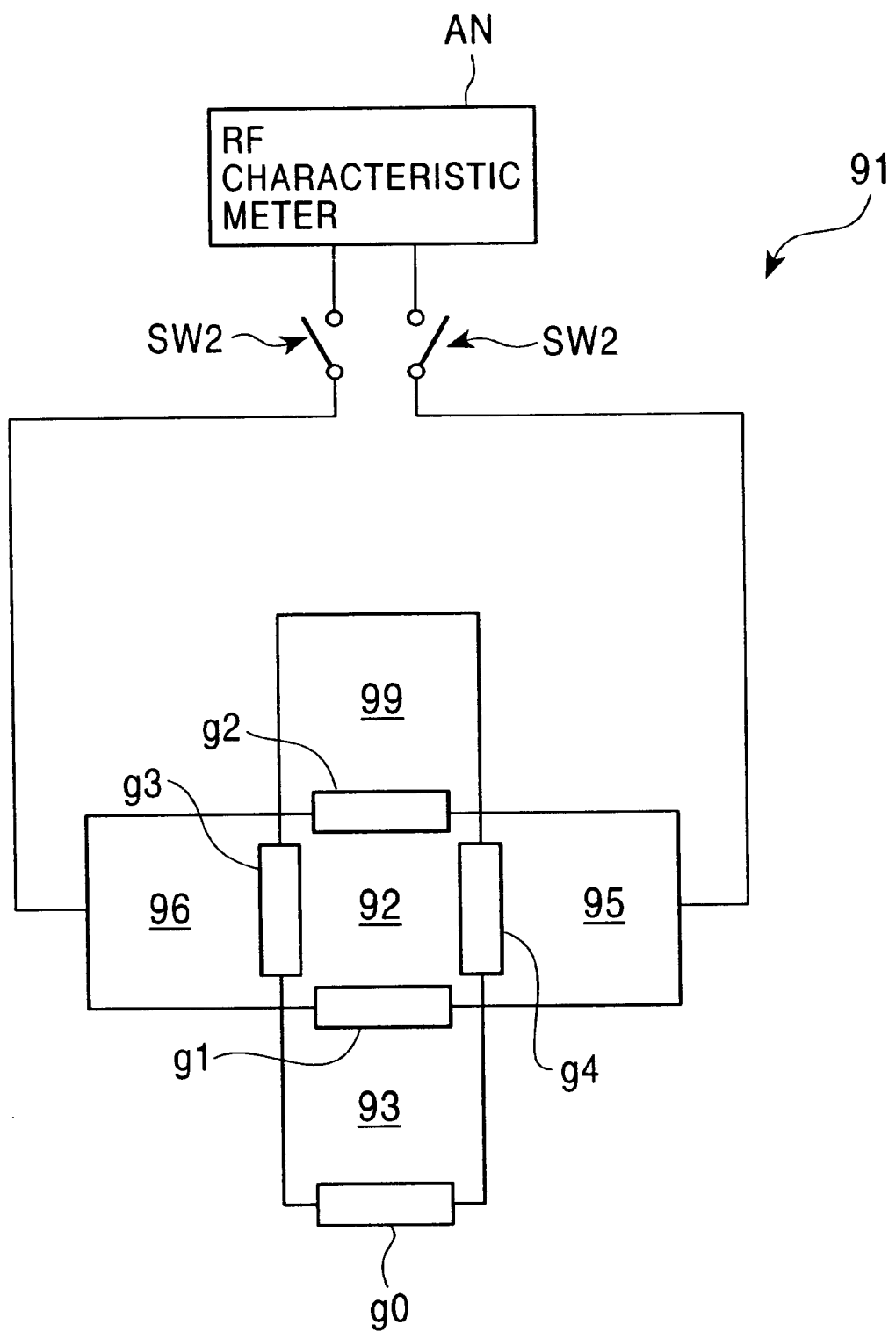
FIG. 30 is a schematic view of a plasma processing apparatus which is used in a performance evaluation method in accordance with a tenth embodiment of the present invention.

FIG. 30 is a cross-sectional view of an outline configuration of a plasma processing apparatus 91 used in this embodiment. The plasma processing apparatus 91 has a load-lock chamber 93, an annealing chamber 99, and processing chambers 95 and 96 which are provided around a substantially square transfer chamber (waiting chamber) 92. The transfer chamber 92 contains a transfer robot for transferring substrates and has gates g1, g2, g3, and g4 at the interfaces to the chambers. The transfer chamber 92, the heating chamber 99, and the processing chambers 95 and 96 are evacuated to high vacuum by individual high-vacuum pumps. The load-lock chamber 93 is evacuated to low vacuum by a low-vacuum pump.

The components of the plasma processing apparatus 91 of this embodiment correspond to those of the plasma processing apparatus 75 of the first embodiment shown in FIGS. 1 to 8 and the plasma processing apparatus 71 of the ninth embodiment shown in FIGS. 27 to 29. That is, the transfer chamber 92 corresponds to the transfer chamber 72, the annealing chamber 99 corresponds to the annealing chamber 79, and the load-lock chamber 93 corresponds to the loading chamber 73 and the unloading chamber 74. The components having the same configurations are not described.

In this plasma processing apparatus 91, a gate g0 is opened to transfer the substrate 16 into the load-lock chamber 93. The gate g0 is closed to evacuate the load-lock chamber 93 by a low-vacuum pump. The gates g1 and g2 are opened to transfer the substrate 16 from the load-lock chamber 93 to the heating chamber 99 by a transfer arm of a transfer robot in the transfer chamber 92. The gates g1 and g2 are closed to evacuate the transfer chamber 92 and the heating chamber 99 using a high-vacuum pump. After the substrate 16 is annealed, the gates g2 and g4 are opened to transfer the annealed substrate 16 to the processing chamber 95 by the transfer arm of the transfer robot. After the substrate 16 is processed in the processing chamber 95, the gates g3 and g4 are opened to transfer the substrate 16 to the plasma chamber 96 by the transfer arm of the transfer robot in the transfer chamber 92. After the substrate 16 is processed in the plasma chamber 96, the gates g1 and g3 are opened to transfer the substrate 16 to the load-lock chamber 93 by the transfer arm of the transfer robot in the transfer chamber 92.

Individual sections are automatically operated by a controller section, although the processing conditions such as layer deposition conditions in these processing chambers and the processing sequence are set by an operator. In the use of this plasma processing apparatus 91, an untreated substrate 16 is placed onto a loading cassette in the load-lock chamber 93 and the operator pushes a start switch. The substrate 16 is sequentially transferred from the loading cassette to processing chambers by the transfer robot. After a series of processing steps are sequentially performed in these processing chambers, the substrate 16 is placed into the unloading (loading) cassette by the transfer robot.

In these processing chambers 95 and 96, as in the second embodiment, the substrate 16 is placed on the susceptor electrode 8, and the radiofrequency generator 1 supplies a radiofrequency power to the plasma excitation electrode 4 and the radiofrequency generator 27 supplies another radiofrequency power to the susceptor electrode 8, while a reactive gas is fed into the plasma chamber 60 from the gas feeding tube 17 via the shower plate 6 to generate a plasma for forming an amorphous silicon layer, a silicon oxide layer, or a silicon nitride layer on the substrate 16.

These plasma processing chambers 95 and 96 are connected to a RF characteristic meter AN by switches SW2, as shown in FIG. 30. A variation $C_{e1r}$ in the plasma electrode capacitances $C_{e1}$ of these plasma processing chambers 95 and 96 after the delivery is defined by the maximum $C_{e1max}$ and the minimum $C_{e1min}$ as follows:

$$C_{e1r}=(C_{e1max}-C_{e1min})/(C_{e1max}+C_{e1min})$$

The required level of performance is determined by whether or not the variation $C_{e1r}$ is less than 0.03. That is, the method determine that required level of performance is maintained when the variation $C_{e1r}$ is less than 0.03 and that the required level of performance is not maintained when the variation $C_{e1r}$ is 0.03 or more.

Also, a variation $C_{x1r}$ in the loss capacitances $C_{x1}$ of these plasma processing chambers 95 and 96 after the delivery is defined by the maximum $C_{X1max}$ and the minimum $C_{X1min}$ as follows:

$$C_{X1r}=(C_{X1max}-C_{X1min})/(C_{X1max}+C_{X1min})$$

The required level of performance is determined by whether or not the variation $C_{X1r}$ is less than 0.03. That is, the method determine that required level of performance is maintained when the variation $C_{X1r}$ is less than 0.03 and that the required level of performance is not maintained when the variation $C_{X1r}$ is 0.03 or more.

The performance evaluation method of this embodiment exhibits the same advantages as those in the ninth embodiment. Moreover, adequate corrective action is performed to these plasma processing chambers 95 and 96 based on the evaluation of the variation $C_{e1r}$ in the plasma electrode capacitances $C_{e1}$ after the delivery. Also, adequate corrective action is performed to these plasma processing chambers 95 and 96 based on the evaluation of the variation $C_{X1r}$ in the loss capacitances $C_{X1}$ after the delivery. Thus, the plasma processing chambers 95 and 96 have substantially the same radiofrequency characteristics, namely, the plasma electrode capacitance $C_e$ and the loss capacitance $C_X$. Since the plasma electrode capacitances $C_e$ and the loss capacitances $C_X$ of these processing chambers 95 and 96 are controlled within a predetermined range, these processing chambers 95 and 96 consume substantially the same electrical power.

Accordingly, substantially the same result is achieved from a single process recipe for these different processing chambers 95 and 96. When layers are formed in these plasma processing chambers 95 and 96, these layers can have substantially the same characteristics, e.g., the thickness, the isolation voltage, and the etching rate. When the variation is controlled to be less than 0.03 under the same deposition conditions in the plasma chambers 95 and 96, the variation in layer thickness can be controlled to be less than ±2%.

With reference to FIG. 7, in the plasma processing apparatus 91 of this embodiment, the impedance measuring terminal 61 is provided at the input end PR of the feed plate 3 in each of the processing chambers 95 and 96, and the RF characteristic meter AN is detachably connected to the impedance measuring terminal 61. Moreover, the matching circuit 2A is disconnected from the processing chambers 95 and 96 by operating the switches SW1 and SW2 (FIG. 11) when the impedance characteristics of the processing chambers 95 and 96 are measured, as in the second embodiment. Thus, the loss capacitance $C_X$ of the processing chambers 95 and 96 can be readily measured without disconnecting the matching circuit 2A from the power supply line.

As described in the second embodiment, the impedance $Z_1$ is also equal to the impedance $Z_2$ in these plasma processing chambers 95 and 96 in this embodiment; hence, switching between the measuring mode of the loss capacitance $C_X$ and the operating mode of the plasma processing apparatus can be readily performed only by operating the switches SW1 and SW2, without connecting and disconnecting the matching circuit 2A and a probe 105 for measuring the impedance shown in FIG. 9. Thus, the measurements of the loss capacitances $C_X$ of these processing chambers 95 and 96 can be efficiently performed, by operating the switches SW1 and SW2.

Since an adequate corrective action is performed for these plasma processing chambers 95 and 96 based on the results of the performance evaluation method according to this embodiment, the radiofrequency characteristics of the parallel plate electrodes 4 and 8 can be directly defined. Thus, input power is effectively supplied into the plasma space, resulting in further improved electrical power consumption and improved processing efficiency in the overall plasma processing apparatus 91.

In this embodiment, the two switches SW1 and SW2 are provided. Since the essential feature in this embodiment is that the impedance from the branch to the measuring point PR is equal to the impedance from the branch to the probe, this requirement may be satisfied using one switch.

The performance evaluation methods described in the seventh to ninth embodiments are also applicable to the processing chambers 95 and 96. By using both the evaluation based on the comparison of loss capacitance $C_X$ with 26 times the plasma electrode capacitance $C_e$ and the above-mentioned evaluation based on the variations $C_{X1r}$ and $C_{e1r}$, the overall radiofrequency characteristics of the processing chambers processing chamber 95 and 96 can be simultaneously optimized. These processing chambers 95 and 96 thereby exhibit the same advantages as those in the seventh to ninth embodiments.

Eleventh Embodiment

A performance evaluation method in accordance with an eleventh embodiment of the present invention will now be described with reference to the drawings.

Figure 31:
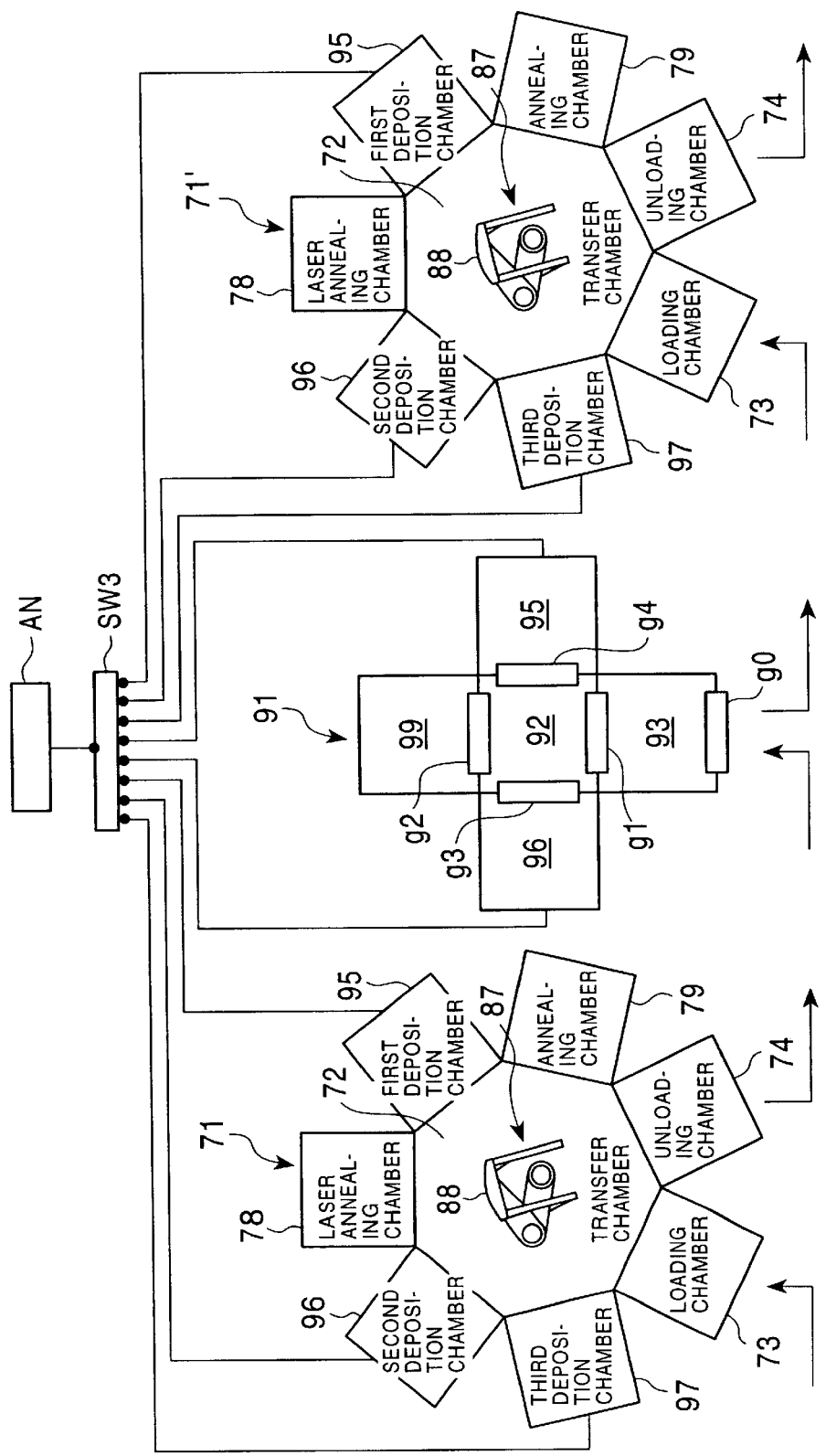
FIG. 31 is a schematic view of a plasma processing system which is used in a performance evaluation method in accordance with an eleventh embodiment of the present invention.

FIG. 31 is a schematic view of an outline configuration of a plasma processing system used in the performance evaluation method of this embodiment.

The plasma processing system of this embodiment is substantially a combination of plasma processing apparatuses 71 and 71' which correspond to the plasma processing apparatus 71 shown in FIG. 27 (see the ninth embodiment) and a plasma processing apparatus 91 which corresponds to the plasma processing apparatus 91 shown in FIG. 30 (see the tenth embodiment). Components having the same functions as in the ninth and tenth embodiments are referred to with the same reference numerals, and a detailed description thereof with reference to drawings has been omitted.

As shown in FIG. 31, the plasma processing system of this embodiment constitutes a part of a production line which includes the plasma processing apparatus 71, the plasma processing apparatus 91, and the plasma processing apparatus 71'. The plasma processing apparatus 71 has three plasma processing chambers 95, 96, and 97. The plasma processing apparatus 91 has two plasma processing apparatuses 95 and 96. The plasma processing apparatus 71' has three plasma processing chambers 95, 96, and 97. These plasma processing chambers 95, 96, and 97 in the plasma processing apparatuses 71, 71", and 91 have substantially the same configuration.

In the plasma processing system of the present invention, for example, a substrate 16, which has been preliminarily treated, is subjected to a first layer deposition treatment in the plasma processing apparatus 95 of the plasma processing apparatus 71, is annealed in the annealing chamber 79, and is annealed in the laser annealing chamber 78. The treated substrate 16 is subjected to second and third layer deposition treatments in the plasma processing chambers 96 and 97.

The substrate 16 is transferred from this plasma processing apparatus 71 and a photoresist is applied thereto by a photolithographic step using another apparatus (not shown).

The substrate 16 is transferred into the plasma processing apparatus 91 and is plasma-etched in the processing chambers 95 and 96. Next, the substrate 16 is transferred to another plasma processing chamber not shown in the drawing and is subjected to a layer deposition treatment therein.

The substrate 16 is transferred into the plasma processing apparatus 91 and is plasma-etched in the processing chambers 95 and 96. Next, the substrate 16 is transferred to another plasma processing chamber not shown in the drawing and is subjected to a layer deposition treatment therein.

Finally, the substrate 16 is subjected to first, second, and third deposition treatments in the plasma processing chambers 95, 96, and 97 of the plasma processing apparatus 71', and is transferred to the subsequent step to complete the steps in the plasma processing system according to this embodiment.

Impedance measuring terminals of the plasma processing chambers 95, 96, and 97 are connected to an RF characteristic meter AN via a switch SW3. In the measurement of the impedance, the switch SW3 connects only one of the plasma chambers 95, 96, and 97 to the RF characteristic meter AN. Coaxial cables have the same length between the impedance measuring terminals of the plasma processing chambers 95, 96, and 97 and the switch SW3 so that the impedances from these impedance measuring terminals to the switch SW3 are the same. A detachable probe of an RF characteristic meter AN is connected to the impedance measuring terminal, as in the third embodiment shown in FIG. 11.

The loss capacitance $C_X$ of each plasma processing chamber 95, 96, or 97 is measured by operating the switch SW3 as in the tenth embodiment. The variation $C_{e1r}$ in the plasma electrode capacitances $C_{e1}$ of these plasma processing chambers 95, 96, and 97 after the delivery is defined by the maximum $C_{e1max}$ and the minimum $C_{e1min}$ as follows:

$$C_{e1r}=(C_{e1max}-C_{e1min})/(C_{e1max}+C_{e1min})$$

The required level of performance is determined by whether or not the variation $C_{e1r}$ is less than 0.03. That is, the method determine that required level of performance is maintained when the variation $C_{e1r}$ is less than 0.03 and that the required level of performance is not maintained when the variation $C_{e1r}$ is 0.03 or more.

Also, the variation $C_{x1r}$ in the loss capacitances $C_{X1}$ of these plasma processing chambers 95, 96, and 97 after the delivery is defined by the maximum $C_{X1max}$ and the minimum $C_{X1min}$ as follows:

$$C_{X1r}=(C_{X1max}-C_{X1min})/(C_{X1max}+C_{X1min})$$

The required level of performance is determined by whether or not the variation $C_{X1r}$ is less than 0.03. That is, the method determine that required level of performance is maintained when the variation $C_{X1r}$ is less than 0.03 and that the required level of performance is not maintained when the variation $C_{X1r}$ is 0.03 or more.

The definition, the measuring method, and the corrective action of the loss capacitance $C_X$ are described above.

The performance evaluation method of this embodiment exhibits the same advantages as those in the ninth and tenth embodiments. Moreover, adequate corrective action is performed to these plasma processing chambers 95, 96, and 97 based on the evaluation of the variation $C_{e1r}$ in the plasma electrode capacitances $C_{e1}$ after the delivery. Also, adequate corrective action is performed to these plasma processing chambers 95 and 96 based on the evaluation of the variation $C_{X1r}$ in the loss capacitances $C_{X1}$ after the delivery. Thus, the plasma processing chambers 95 and 96 have substantially the same radiofrequency characteristics, namely, the plasma electrode capacitance $C_e$ and the loss capacitance $C_X$. Since the plasma electrode capacitances $C_e$ and the loss capacitances $C_X$ of these processing chambers 95 and 96 are controlled within a predetermined range, these processing chambers 95, 96, and 97 consume substantially the same electrical power.

Accordingly, substantially the same result is achieved from a single process recipe for these processing chambers 95, 96, and 97. When layers are formed in these processing chambers 95, 96, and 97, these layers can have substantially the same characteristics, e.g., the thickness, the isolation voltage, and the etching rate. When the variation is controlled to be less than 0.03 under the same deposition conditions in the plasma chambers 95, 96, and 97, the variation in layer thickness can be controlled to be less than ±2%.

As a result, the overall radiofrequency characteristics of the plasma processing system can be optimized so as to generate a stable plasma. Thus, the operations of the processing chambers 95, 96, and 97 of the plasma processing system are stable and uniform. Such a performance evaluation method has not been considered in conventional processes.

The above-mentioned method does not require a determination of process conditions by the relationships between enormous amounts of data on these processing chambers 95, 96, and 97 and the results obtained by evaluation of actually processed substrates.

Thus, in installation of new systems and inspection of installed systems, the time required for obtaining substantially the same results using the same process recipe in these processing chambers 95, 96, and 97 can be significantly reduced by measuring the plasma electrode capacitance $C_e$ and the loss capacitance $C_X$ compared with an inspection method by actual deposition onto the substrate 16. Moreover, according to this inspection method, the plasma processing system can be directly evaluated in situ in a short period of time, instead of a two-stage evaluation, i.e., processing of the substrates and confirmation and evaluation of the operation of the plasma processing system based on the evaluation of the processed substrates. In this embodiment, inspection by layer deposition on substrates is performed to determine the process recipe when the plasma processing system is installed. Since the plasma processing chambers 95, 96, and 97 have the same radiofrequency characteristics, the layer deposition may be performed in only one of the chambers. In the maintenance of the plasma processing apparatus, actual layer deposition is not required because the radiofrequency characteristics of the plasma processing chambers are controlled within the predetermined value. In contrast, in conventional methods performing actual layer deposition on substrates, these plasma processing chambers must be independently evaluated.

Accordingly, the performance evaluation method of this embodiment does not require a shutdown of the production line for several days to several weeks to check and evaluate the operation of the plasma processing system. The production line, therefore, has high productivity with reduced expenses for substrates used in the inspection, processing of these substrates, and labor during the inspection operations.

The performance evaluation methods described in the eighth to ninth embodiments are also applicable to the processing chambers 95, 96, and 97. By using both the evaluation based on the comparison of loss capacitance $C_X$ with 26 times the plasma electrode capacitance $C_e$ and the above-mentioned evaluation based on the variations $C_{X1r}$ and $C_{e1r}$, the overall radiofrequency characteristics of the processing chambers processing chamber 95, 96, and 97 can be simultaneously optimized. These processing chambers 95, 96 and 97 thereby exhibit the same advantages as those in the eighth to ninth embodiments.

As described in the second embodiment, the impedance $Z_1$ is also equal to the impedance $Z_2$ and the impedance from the interlayer 61 to the switch SW3 is identical in these plasma processing chambers 95, 96, and 97 in this embodiment; hence, the measurements of the loss capacitances $C_X$ of these processing chambers 95, 96, and 97 can be efficiently performed, by operating the switches SW1, SW2, and SW3.

In this embodiment, the operation of the switches SW1, SW2, and SW3 may be cooperated with the switching of the plasma processing chambers 95, 96, and 97. The switches SW1 and SW2 may be replaced with one switch in which the impedance from the branch point B to the output terminal position PR is equal to that from the branch point B to the probe.

Figure 32:
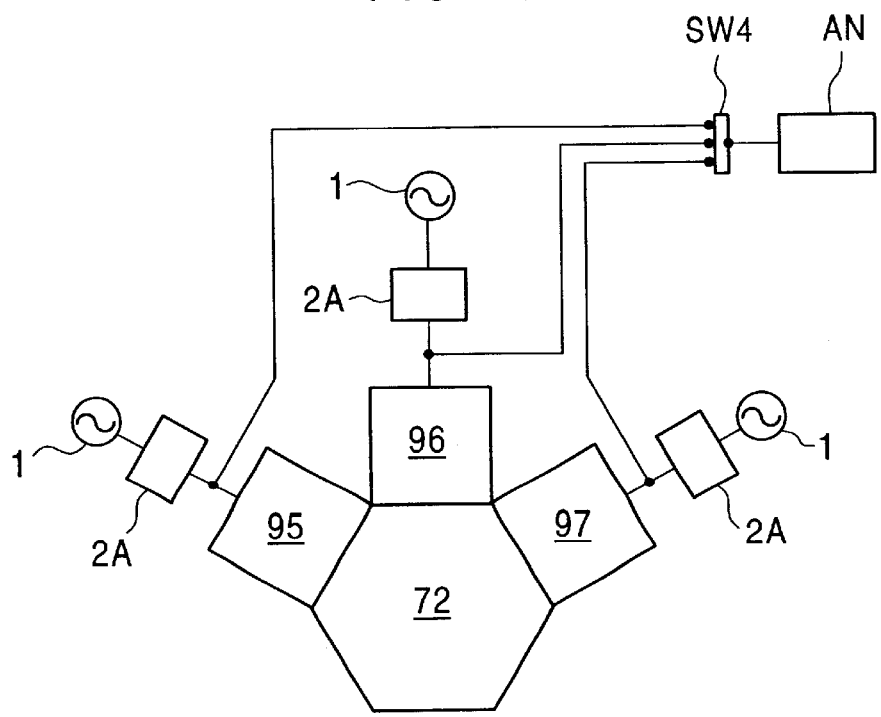
FIG. 32 is a schematic view of a plasma processing apparatus which is used in a performance evaluation method in accordance with the present invention.
Figure 33:
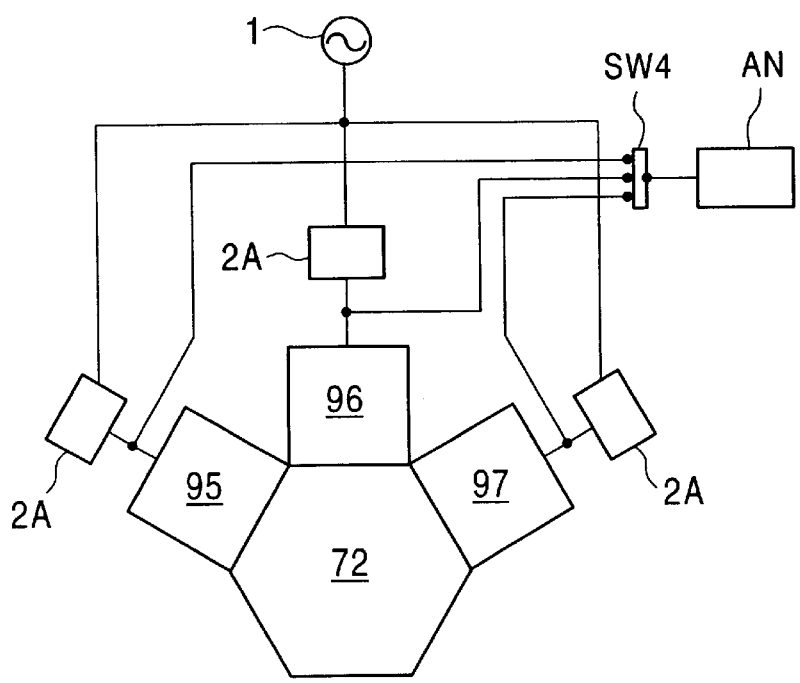
FIG. 33 is a schematic view of a plasma processing apparatus which is used in a performance evaluation method in accordance with the present invention.
Figure 34:
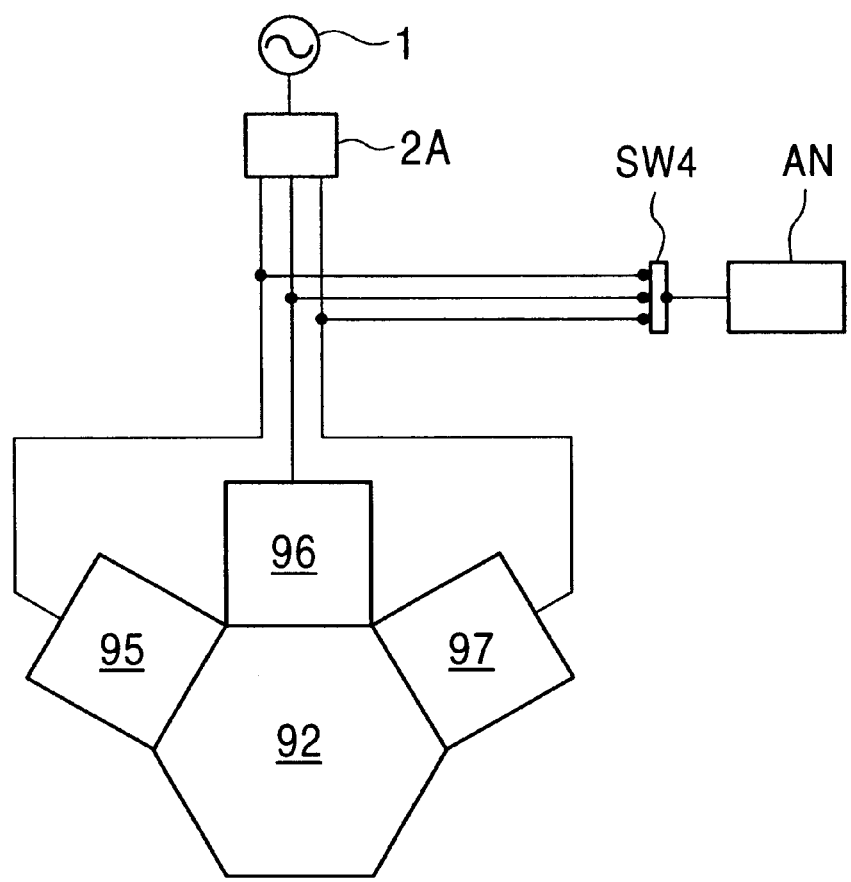
FIG. 34 is a schematic view of a plasma processing apparatus which is used in a performance evaluation method in accordance with the present invention.

In the ninth to eleventh embodiments, as shown in FIG. 32, each of the plasma processing chambers 95, 96, and 97 is provided with a matching circuit 2A and a radiofrequency generator 1. An RF characteristic meter AN is connected to a connection point for every matching circuit 2A via a switch SW4. Alternatively, as shown in FIG. 33, one radiofrequency generator 1 may be connected to three matching circuits 2A for the plasma processing chambers 95, 96, and 97, or as shown in FIG. 34, one matching circuit 2A may be connected to these plasma processing chambers 95, 96, and 97. In such a case, the RF characteristic meter AN is connected to a connection point between each plasma chamber and the matching circuit 2A via the switch SW4.

In the tenth and eleventh embodiment, a combination of the evaluation based on the equations $C_{X1r}=(C_{X1max}-C_{X1min})/(C_{X1max}+C_{X1min})$ and $C_{e1r}=(C_{e1max}-C_{e1min})/(C_{e1max}+C_{e1min})$ is described. Alternatively, the evaluation may be performed based only on the equation $C_{X1r}=(C_{X1max}-C_{X1min})/(C_{X1max}+C_{X1min})$ Twelfth Embodiment A performance management system for a plasma processing apparatus according to a twelfth embodiment of the present invention will now be described with reference to the drawings.

Figure 35:
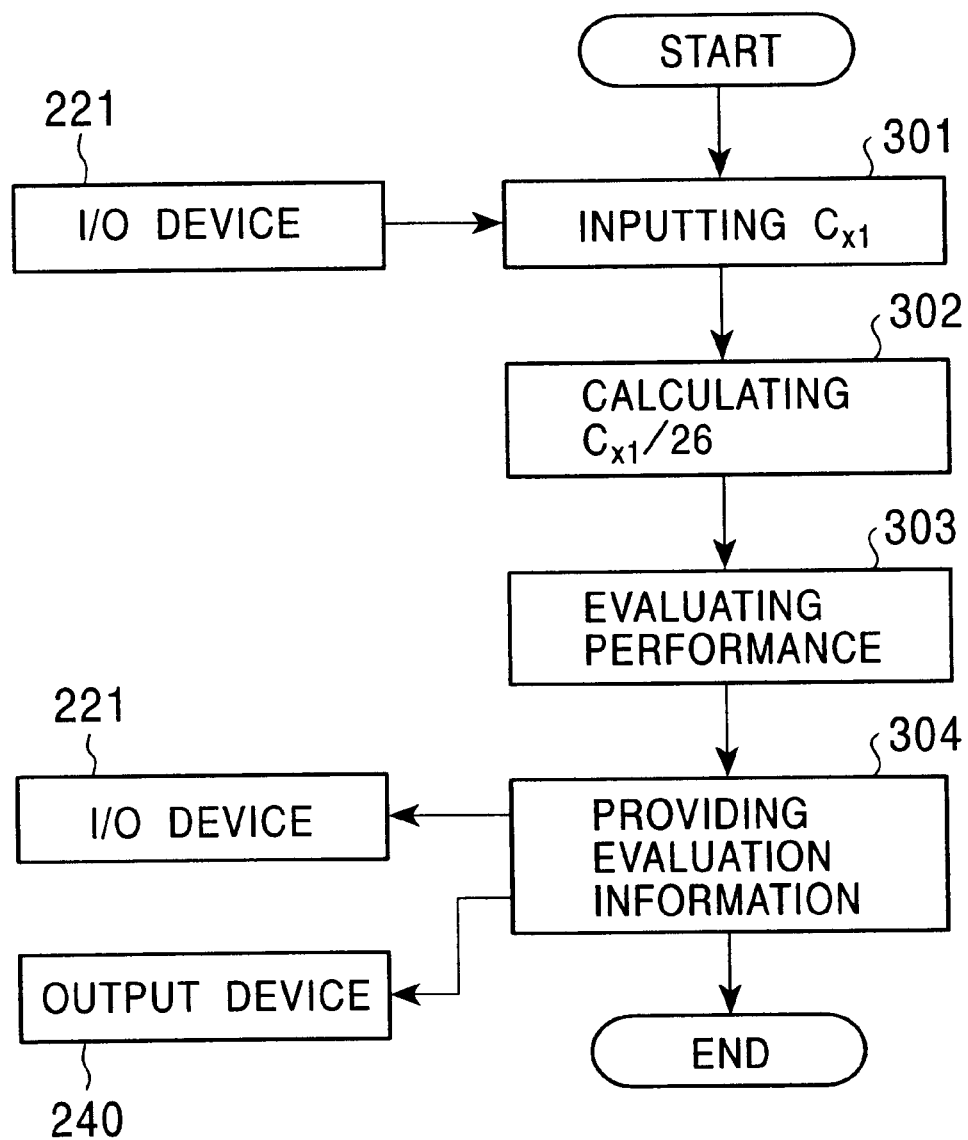
FIG. 35 is a block diagram of a performance management system for a plasma processing apparatus in accordance with a twelfth embodiment of the present invention.

The configuration of the performance management system for the plasma processing apparatus of this embodiment is identical to that of the third embodiment shown in FIGS. 15 and 17. FIG. 35 is a flowchart showing steps for providing evaluation information executed at the performance management system for the plasma processing apparatus of this embodiment.

The performance management system shown in FIG. 17 includes all elements of the system shown in FIG. 15 and a radiofrequency characteristic meter (capacitance meter) 260 connected to a plasma processing apparatus 250. No limit is imposed as to the types of the plasma processing apparatus for which this performance management system is used. For example, the performance management system can be applied to any one of the plasma processing apparatuses according to the first, second, ninth, and tenth embodiments, and the plasma processing system according to the eleventh embodiment.

Now, the operation of the performance management system of this embodiment will be described according to the flowchart in FIG. 35 and with reference to FIGS. 15 and 17.

To start the performance evaluation using this system, a user of this performance management system, for example, a customer or a service engineer visiting the customer, measures a plasma electrode capacitance $C_{e1}$ and a loss capacitance $C_{X1}$ of the plasma processing chamber of the plasma processing apparatus delivered to the customer site or already put into operation at the customer site. The observed values are input through a customer I\O device 220. When the performance management system shown in FIG. 17 is used, the observed values are directly input from a RF characteristic meter 260 connected to the plasma processing apparatus 250.

The input values of $C_{X1}$ and $C_{e1}$ are transmitted to a server 210 via a communication line 230 (Step 301).

The server 210 then calculates $C_{X1}/26$ (Step 302), compares $C_{X1}/26$ with the plasma electrode capacitance $C_{e1}$, and evaluates the performance of the plasma processing apparatus.

When $C_{X1}/26$ is less than the plasma electrode capacitance $C_{e1}$, i.e., when $C_{X1}$ is less than 26 times the plasma electrode capacitance $C_{e1}$, the server determines that the required level of performance is maintained. When $C_{X1}/26$ is not less than the plasma electrode capacitance $C_{e1}$, i.e., when $C_{X1}$ is not less than 26 times the plasma electrode capacitance $C_{e1}$, the server determines that the require level of performance is not maintained (Step 303).

In the plasma processing apparatus or system having a plurality of plasma processing chambers according the ninth to eleventh embodiments, plural values of $C_{X1}$ are input to the server. The server determines that the required level of performance is maintained only when $C_{X1}/26$ is less than the plasma electrode capacitance $C_{e1}$ in every plasma processing chamber. The server otherwise determines that the required level of performance is not maintained.

Next, the server 210 provides the performance evaluation results to both the customer I/O device 220 and an output device 240 located at the delivery site (Step 304).

To the customer I/O device 220, a print command signal, display command signal, or a sound signal are transmitted. For example, a message "This plasma processing apparatus is maintained at the required performance level. Please continue using." and a message "This plasma processing apparatus may not be maintained at the required performance level. Please adjust the apparatus according to the manual." are conveyed to the customer or the service engineer by printing, display on the screen, or sound when the server determines that the required level of the performance is satisfied and that required level of the performance is not satisfied, respectively.

The print command signal, the display command signal, the sound signal, a signal output signal, or a warning sound signal is also transmitted to the output device 240 when the server 210 determines that the required performance level is not satisfied. The output device 240 then either prints, displays, or outputs signals or a maintenance command such as alarm sound. In order to specify at the delivery site which apparatus or system at the customer site requires maintenance, the identification number of the relevant plasma processing chamber is preferably transmitted from the customer I/O device 220 and is preferably output at the output device 240 located at the delivery site Alternatively, the identification number or phone number of the customer I/O device 220 may be used to determine the identification number of the plasma processing chamber and to output the results from the output device 240.

Thus, a customer or a service engineer visiting the customer can immediately evaluate the performance of the plasma processing apparatus according to Evaluation Standard 1 without actually operating the plasma processing apparatus and then inspecting substrates on which the deposition is performed.

Moreover, the plasma processing apparatus can be directly evaluated in situ in a shorter period of time instead of by a conventional two-stage evaluation requiring the steps of first depositing the substrate and then evaluating the operation of the plasma processing apparatus using the deposited substrates. Generally, when the plasma processing apparatus is first installed, the plasma processing apparatus is evaluated by the method requiring deposition on substrates to determine the process recipe for that plasma processing apparatus. Whereas conventional plasma processing apparatuses require evaluation of all the plasma processing chambers, such an evaluation needs to be performed in only one plasma processing chamber in this embodiment since the radiofrequency characteristics of that chamber and the other chambers are maintained to be the same.

Accordingly, the performance of the plasma processing apparatus after delivery can be easily evaluated in a short period of time, and the cycle from detection of defects to performance of corrective action can be shortened. Also, the cost for substrates for inspection, cost for processing the substrates for inspection, and labor cost for the workers involved in the adjustment work can be reduced.

Moreover, the malfunctioning of the plasma processing apparatus located at the customer site can be immediately detected by the supplier such as a manufacturer at its own location through the maintenance command. Thus, better repair service can be provided to the customer.

Thirteenth Embodiment

Now a performance management system for a plasma processing apparatus according to a thirteenth embodiment of the present invention will be described with reference to the drawings.

Figure 36:
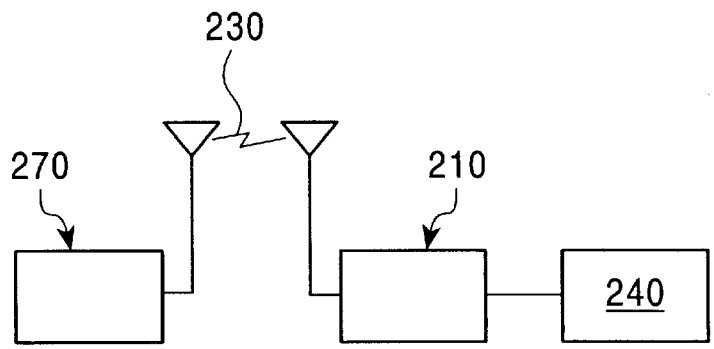
FIG. 36 is a block diagram of a performance management system for a plasma processing apparatus in accordance with a thirteen embodiment of the present invention.
Figure 37:
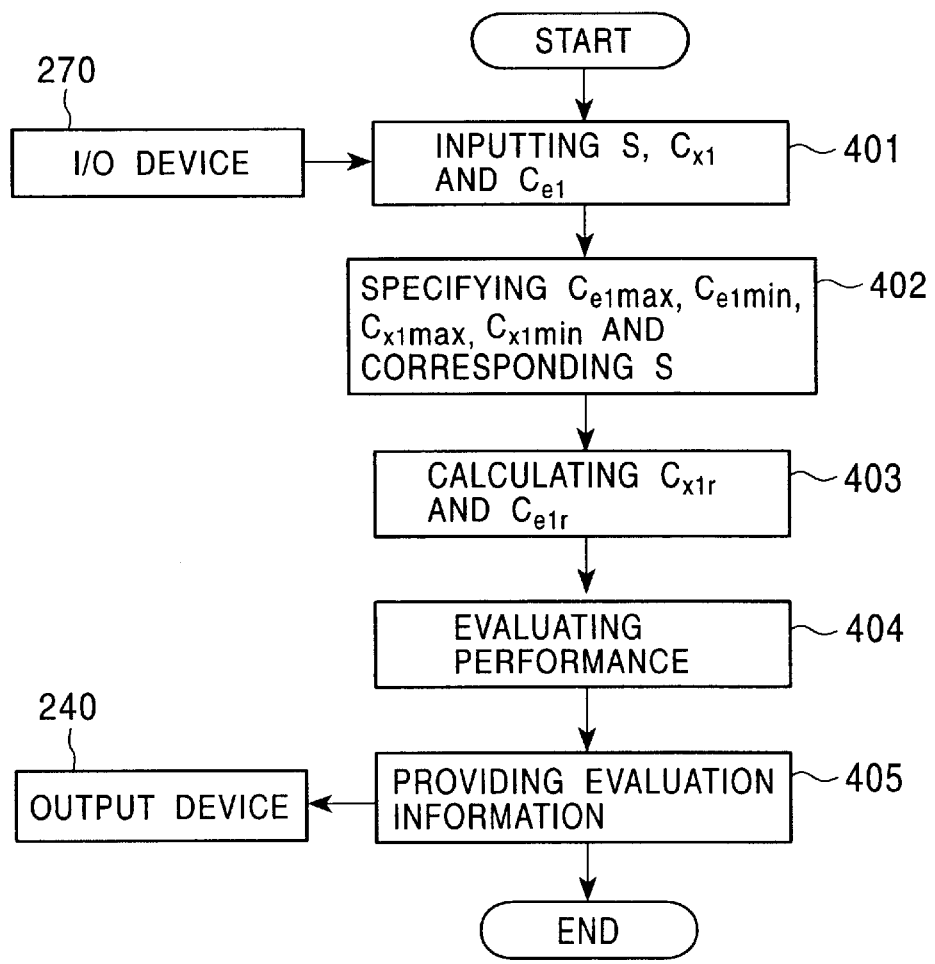
FIG. 37 is a flowchart illustrating a method for providing evaluation information which is prepared by the performance management system shown in FIG. 36.
Figure 38:
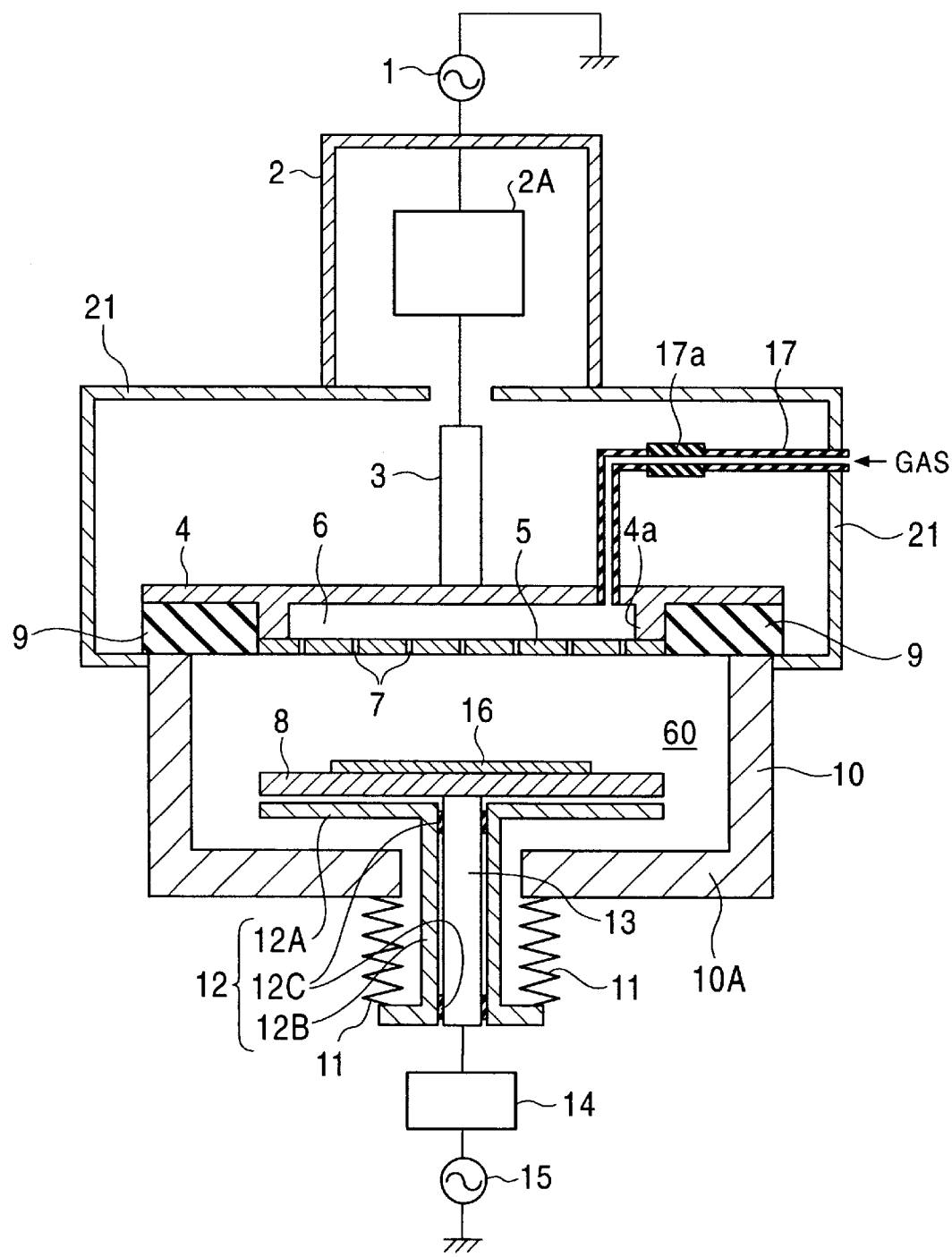
FIG. 38 is a schematic cross-sectional view of a conventional plasma processing apparatus.
Figure 39:
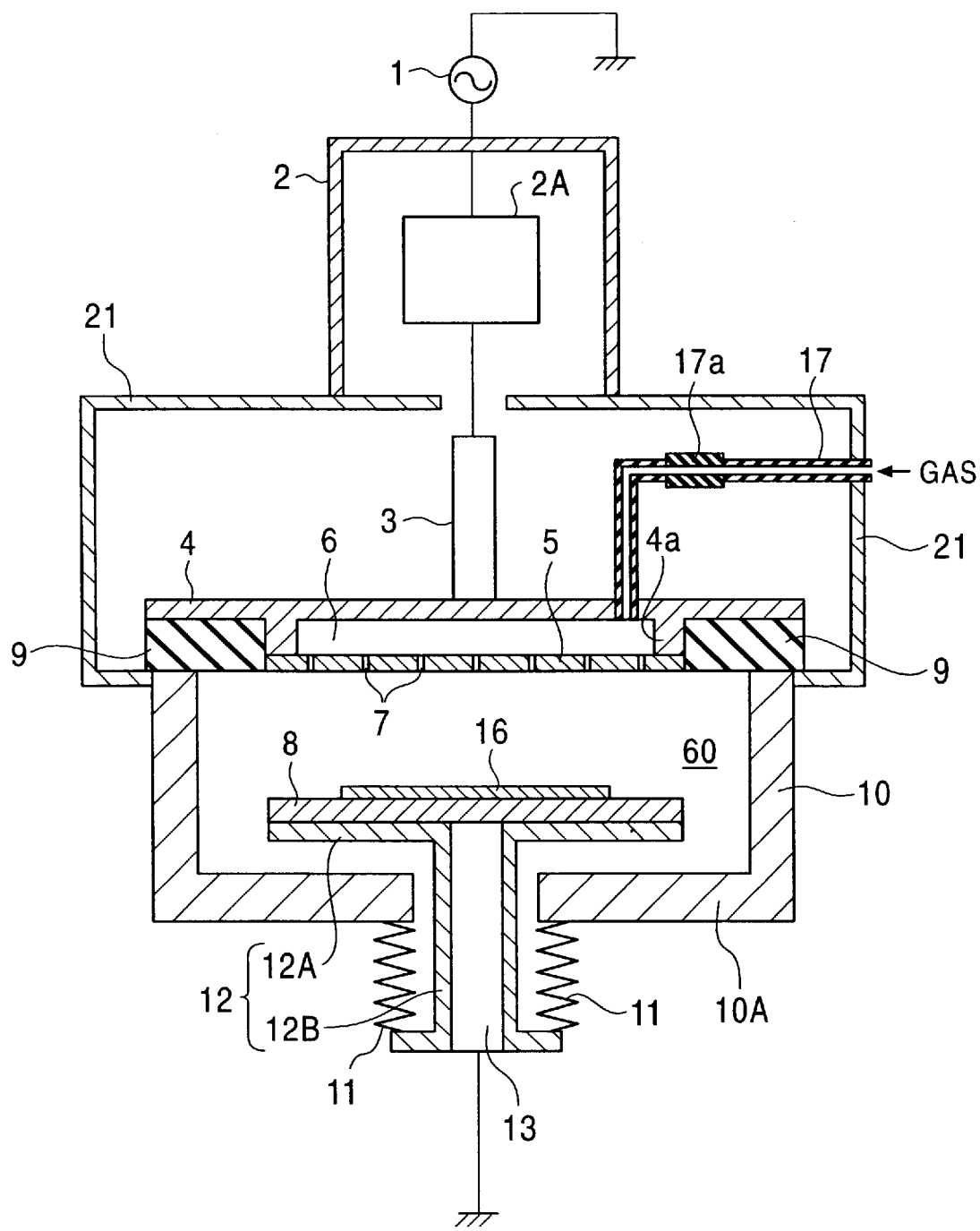
FIG. 39 is a schematic cross-sectional view of another conventional plasma processing apparatus.

FIG. 36 illustrates the configuration of the performance management system for the plasma processing apparatus of this embodiment. FIG. 37 is a flowchart showing steps of providing evaluation information executed in the performance management system. In FIGS. 36 and 37, the components identical to those shown in FIGS. 15, 16, and 35 are referred to by the same reference numerals and the descriptions thereof are omitted.

The performance management system shown in FIG. 36 includes a server 210, a customer I/O device 270, a communication line 230 for linking the server 210 to the customer I/O device 270, and an output device 240 located at the delivery site and linked to the server 210. The management system of this embodiment is for the plasma processing apparatus and system which include a plurality of plasma processing chambers, i.e., the plasma processing apparatus and system of the ninth to eleventh embodiments.

Referring to FIG. 36, the operation of this embodiment will now be described according to the flowchart shown in FIG. 37.

To start the performance evaluation using this system, a user of this performance management system at a customer site, i.e., a customer or a service engineer visiting the customer, inputs through the customer I/O device 270 the identification number S of the plasma processing chamber and the measured values of a plasma electrode capacitance $C_{e1}$ and a loss capacitance $C_{X1}$ as the radiofrequency characteristics of the plasma processing chambers of the plasma processing apparatus.

The identification number S, the plasma electrode capacitance $C_{e1}$, and the loss capacitance $C_{X1}$ are transmitted to the server 210 via the communication line 230 (Step 401).

Alternatively, a RF characteristic meter connected to the plasma processing apparatus may be kept connected to the customer I/O device 270 so that the identification number S of the plasma processing chamber and the measured value of the loss capacitance $C_{X1}$ as the radiofrequency characteristic of the plasma processing chamber are automatically entered.

The server 210 then specifies the maximum value $C_{e1max}$ and the minimum value $C_{e1min}$ among the plasma electrode capacitances $C_{e1}$ of these chambers and the identification numbers S of the relevant plasma processing chambers. The server 210 also specifies the maximum value $C_{X1max}$ and the minimum value $C_{X1min}$ among the loss capacitances $C_{X1}$ of these chambers and the identification numbers S of the relevant plasma processing chambers (Step 402).

Next, variations $C_{e1r}$ and $C_{X1r}$ defined by $C_{e1r}=(C_{e1max}-C_{e1min})/(C_{e1max}+C_{e1min})$ and $C_{X1r}=(C_{X1max}-C_{X1min})/(C_{X1max}+C_{X1min})$ are calculated (Step 403).

The server 210 then compares $C_{e1r}$ with a predetermined value (upper limit), for example, 0.1, to evaluate the performance of the plasma processing apparatus. When $C_{e1r}$ is less than the predetermined value, the server 210 determines that the plasma processing apparatus maintains the required performance level. When $C_{e1r}$ is not less than the predetermined value, the server 210 determines that the plasma processing apparatus does not maintain the required performance level. The server 210 also compares $C_{X1r}$ to a predetermined value, for example, 0.1, to evaluate the performance of the plasma processing apparatus. When $C_{X1r}$ is less than the predetermined value, the server 210 determines that the plasma processing apparatus maintains the required performance level. When $C_{X1r}$ is not less than the predetermined value, the server 210 determines that the plasma processing apparatus does not maintain the required performance level (Step 404).

When the server 210 determines that the required performance level is not satisfied, a maintenance command along with the maximum and minimum values $C_{e1max}$, $C_{e1min}$, $C_{X1max}$, and $C_{X1min}$ and the identification numbers S of the relevant plasma processing chambers is provided as the evaluation information to the output device 240 located at the delivery site (Step 405).

More particularly, the server 210 transmits a print command signal, a display signal, or an alarm sound signal to the output device 240. The maintenance command and the identification numbers S of the relevant plasma processing chambers are output together so that the plasma processing apparatus requiring maintenance can be specified at the delivery site.

According to the performance management system for the plasma processing apparatus of this embodiment, a service engineer or the like at the delivery site can readily identify the defective plasma processing chamber of the plasma processing apparatus.

More particularly, the service engineer or the like at the delivery site such as a manufacturer or a maintenance company can readily evaluate the performance of the plasma processing apparatus according to Evaluation Standard 2 without operating the plasma processing apparatus or system already delivered to the customer and then inspecting the processed substrates.

Moreover, the plasma processing apparatus or system can be directly evaluated in situ in a shorter period of time instead of by a conventional two-stage evaluation requiring the steps of first depositing the substrate and then evaluating the operation of the plasma processing apparatus using the deposited substrates. When an evaluation method requiring deposition on substrates is employed to determine the process recipe at the time of apparatus installation, such an evaluation needs to be performed in only one plasma processing chamber since the radiofrequency characteristics of that chamber and other chambers are maintained to be the same.

Accordingly, the performance of the plasma processing apparatus after delivery can be easily evaluated in a short period of time, and the cycle from detection of defects to performance of corrective action can be shortened. Also, the cost for substrates for inspection, cost for processing the substrates for inspection, and labor cost for the workers involved in the adjustment work can be reduced.

Moreover, malfunctioning of the plasma processing apparatus at the customer site can be immediately detected by the manufacturer, etc., at the delivery site through the maintenance command, providing better repair service to the customer.

EXAMPLES

Comparative Example 1

A plasma processing apparatus of COMPARATIVE EXAMPLE 1 had the structure identical to that shown in FIG. 11. The plasma electrode capacitance $C_e$ between the plasma excitation electrode 4 and the susceptor electrode 8 was set at 25 pF, the loss capacitance $C_X$ between the plasma excitation electrode 4 and the grounded positions was set at 980 pF. The size of the parallel plate electrodes 4 and 8 was 25 cm square. The interelectrode distance was set at 30 mm. The power was set at 1,000 W and a power frequency $f_e$ was set at 40.68 MHz.

Example 1

A plasma processing apparatus of EXAMPLE 1 had the structure identical to that of COMPARATIVE EXAMPLE 1. In EXAMPLE 1, the plasma electrode capacitance $C_e$ between the plasma excitation electrode 4 and the susceptor electrode 8 was set at 37 pF by changing the interelectrode distance to 20 mm. The loss capacitance $C_X$ between the plasma excitation electrode 4 and the grounded positions was set at 980 pF so as to satisfy the relationship 26 $C_e > C_X$. The size of the parallel plate electrodes 4 and 8 was 25 cm square. The power was set at 1,00 W and a power frequency $f_e$ was set at 40.68 MHz.

Example 2

A plasma processing apparatus of EXAMPLE 2 had the structure identical to that of EXAMPLE 1. In EXAMPLE 2, the loss capacitance $C_X$ between the plasma excitation electrode 4 and the grounded positions was set at 250 pF by changing the overlapping area between the susceptor electrode 8 and the upper chamber wall 10a so as to satisfy the relationship $7C_e > C_X$. The size of the parallel plate electrodes 4 and 8 was 25 cm square. The power was set at 1,000 W and a power frequency $f_e$ was set at 40.68 MHz.

Example 3

A plasma processing apparatus of EXAMPLE 3 had the structure identical to that of EXAMPLE 2. In EXAMPLE 3, the loss capacitance $C_X$ between the plasma excitation electrode 4 and the grounded positions was set at 180 pF by changing the material characteristics of the insulator disposed between the susceptor electrode 8 and the upper chamber wall 10a so as to satisfy the relationship $5C_e > C_X$. The size of the parallel plate electrodes 4 and 8 was 25 cm square. The power was set at 800 W and a power frequency $f_e$ was set at 40.68 MHz.

$SiN_X$ layers were deposited at 800 W and 400 W in order to evaluate the performance of the plasma processing apparatuses of EXAMPLES 1 to 3 and COMPARATIVE EXAMPLE 1 as below.

(1) Deposition Rate and Planar Uniformity

The process for evaluating the deposition rate and the planar uniformity included the following:

Step 1: Depositing a $SiN_X$ layer on a 6-inch glass substrate by plasma-enhanced CVD;

Step 2: Patterning a resist layer by photolithography;

Step 3: Dry-etching the $SiN_x$ layer with $SF_6$ and $O_2$;

Step 4: Removing the resist layer by ashing with $O_2$;

Step 5: Measuring the layer thickness using a contact displacement meter;

Step 6: Calculating the deposition rate from the deposition time and the layer thickness; and Step 7: Measuring the planar uniformity at 16 points on the substrate surface.

(2) BHF Etching Rate

Steps 1 and 2: Same as above;

Step 3: Immersing the substrate in a BHF solution ($HF:NH_4F=1:10$) at a temperature of 25° C. for one minute;

Step 4: Rinsing the substrate with deionized water, drying the substrate, and removing the resist layer with a mixture of sulfuric acid and hydrogen peroxide ($H_2SO_4+H_2O_2$);

Step 5: Measuring the unevenness as in Step 5 above; and

Step 6: Calculating the etching rate from the immersion time and the unevenness.

(3) Isolation Voltage

Step 1: Depositing a chromium layer on a glass substrate by sputtering and patterning the chromium layer to form a lower electrode;

Step 2: Depositing a $SiN_X$ layer by plasma-enhanced CVD;

Step 3: Forming an upper electrode as in Step 1;

Step 4: Forming a contact hole for the lower electrode;

Step 5: Probing the upper and the lower electrodes to measure the current-voltage characteristic (I–V characteristic) by varying the voltage to approximately 200 V; and Step 6: Defining the isolation voltage as the voltage V at 100 pA corresponding to 1 $\mu A/cm^2$ in a 100 $\mu m$ square electrode.

These results are shown in Table 2.

TABLE 2

|  | COMPARATIVE EXAMPLE 1 | EXAMPLE 1 | EXAMPLE 2 | EXAMPLE 3 |
| --- | --- | --- | --- | --- |
| Power output (W) | 1,000 | 1,000 | 1,000 | 800 |
| Loss capacitance $C_X$ (pF) | 980 | 980 | 250 | 180 |
| Plasma electrode capacitance $C_e$ (pF) | 25 | 37 | 37 | 37 |

TABLE 2-continued

|  | COMPARATIVE EXAMPLE 1 | EXAMPLE 1 | EXAMPLE 2 | EXAMPLE 3 |
|---|---|---|---|---|
| Deposition rate (nm/min) | 85 | 120 | 430 | 430 |
| Planar uniformity (%) | >±10 | ≦±10 | ≦±5 | ≦±5 |
| BHF etching rate (nm/min) | >200 | ≦200 | ≦200 | ≦200 |
| Isolation voltage (MV/cm) | ≦4 | ≦4 | ≦7 | ≦7 |

These results show that the plasma processing apparatus of EXAMPLE 1 satisfying $26C_e > C_X$ exhibits an improved deposition rate, planar uniformity, BHF etching rate, and isolation voltage. Compared to COMPARATIVE EXAMPLE 1, the deposition rate is improved to more than 100 nm/min, a variation in layer thickness is also improved, and the BHF etching rate is improved to 200 nm/min or less. The layer characteristics are also improved. In the plasma processing apparatus of EXAMPLE 2 satisfying $7C_e > C_X$, the deposition rate is improved by approximately 5 times compared to COMPARATIVE EXAMPLE 1 and the variation in layer thickness is improved to half the variation in EXAMPLE 1. The isolation voltage is also improved. In the plasma processing apparatus of EXAMPLE 3 satisfying $5C_e > C_X$, the same layer characteristics as that of EXAMPLE 2 can be obtained by using 80% output, i.e., even when the power is reduced from 1,000 W to 800 W.

Accordingly, the performance of the plasma processing apparatus is improved by controlling the loss capacitance $C_X$ between the plasma excitation electrode 4 and the ground potential positions.

The results fully demonstrates that the loss capacitance $C_X$ between the plasma excitation electrode 4 and the ground potential positions can be used as the reference for the performance evaluation.

Example 4

A plasma processing apparatus of EXAMPLE 4 was of a multi-chamber type and had the same structure as that shown in FIG. 30. In the plasma processing apparatus of EXAMPLE 4, a variation $C_{e1r}$ in the plasma electrode capacitance $C_e$ defined by the relationship $C_{e1r}=(C_{e1max}-C_{e1min})/(C_{e1max}+C_{e1min})$ wherein $C_{e1max}$ is the maximum value and $C_{e1min}$ is the minimum value among the plasma electrode capacitances $C_{e1}$ of the plurality of plasma processing chambers measured after the delivery of the apparatus was set at 0.09. Moreover, a variation $C_{X1r}$ in the loss capacitance $C_X$ defined by the relationship $C_{X1r}=(C_{X1max}-C_{X1min})/(C_{X1max}+C_{X1min})$ wherein $C_{X1}$ max is the maximum value and $C_{X1min}$ is the minimum value among the loss capacitances $C_{X1}$ of the plurality of plasma processing chambers measured after the delivery of the apparatus was also set at 0.09.

The average plasma electrode capacitance $C_e$ (the plasma electrode capacitance $C_{e1}$ measured after the delivery of the apparatus) was set to 37 pF and the average loss capacitance $C_X$ (the loss capacitance $C_{X1}$ measured after the delivery of the apparatus) was set to 250 pF.

Example 5

A plasma processing apparatus of EXAMPLE 5 was of a multi-chamber type and had the same structure as that shown in FIG. 30. In the plasma processing apparatus of EXAMPLE 5, a variation $C_{e1r}$ in the plasma electrode capacitance $C_e$ among the values $C_{e1}$ measured after the delivery of the apparatus was set to 0.02, and a variation $C_{X1r}$ in the loss capacitance among the values $C_{X1}$ measured after the delivery of the apparatus was set to 0.02. The average plasma electrode capacitance $C_e$ (the plasma electrode capacitance $C_{e1}$ measured after the delivery of the apparatus) was set to 37 pF and the average loss capacitance $C_X$ (the loss capacitance $C_{X1}$ measured after the delivery of the apparatus) was set to 980 pF.

COMPARATIVE EXAMPLE 2

A plasma processing apparatus of COMPARATIVE EXAMPLE 2 was of a multi-chamber type and had the same structure as that shown in FIG. 30. In the plasma processing apparatus of COMPARATIVE EXAMPLE 2, a variation $C_{e1r}$ in the plasma electrode capacitance $C_e$ among the values $C_{e1}$ measured after the delivery of the apparatus was set to 0.11, and a variation $C_{X1r}$ in the loss capacitance among the values $C_{X1}$ measured after the delivery of the apparatus was set to 0.11. The average plasma electrode capacitance $C_e$ (the plasma electrode capacitance $C_{e1}$ measured after the delivery of the apparatus) was set to 37 pF and the average loss capacitance $C_X$ (the loss capacitance $C_{X1}$ measured after the delivery of the apparatus) was set to 180 pF.

The same process recipe was applied to the plasma processing apparatuses of EXAMPLES 4 and 5, and COMPARATIVE EXAMPLE 2 to deposit silicon nitride layers. A variation in the layer thickness among the plasma processing chambers of each apparatus was measured as follows:

Step 1: Depositing a $SiN_x$ layer on a 6-inch glass substrate by plasma-enhanced CVD;

Step 2: Patterning a resist layer by photolithography;

Step 3: Dry-etching the $SiN_x$ layer with $SF_6$ and $O_2$;

Step 4: Removing the resist layer by ashing with $O_2$;

Step 5: Measuring the unevenness in the layer thickness using a contact displacement meter;

Step 6: Calculating the deposition rate from the deposition time and the layer thickness; and Step 7: Measuring the planar uniformity at 16 points on the substrate surface.

Herein, the layer was deposited under the following conditions:

Substrate temperature: 350° C.
$SiH_4$ flow rate: 40 SCCM
$NH_3$ flow rate: 200 SCCM
$N_2$ flow rate: 600 SCCM
Pressure: 150 Pa The results are shown in Table 3.

TABLE 3

|  | Variation in Deposition Rate | Variations in $C_e$ and $C_X$ |
| --- | --- | --- |
| COMPARATIVE EXAMPLE 2 | 6.2% | 0.11 |
| EXAMPLE 4 | 4.9% | 0.09 |
| EXAMPLE 5 | 1.9% | 0.02 |

The results show that the uniformity in the thickness of the layers deposited in these plasma processing chambers is improved and the operation of the plasma processing apparatus is improved by controlling the variations $C_{e1r}$ and $C_{X1r}$ among the plasma electrode capacitances $C_{e1}$ and the loss capacitances $C_{X1}$, respectively, measured after the delivery of the apparatus.

Thus, the variations in $C_{e1}$ and $C_{X1}$ can be used as the parameter for the performance evaluation.

What is claimed is:

1. A performance evaluation method for a plasma processing apparatus, the plasma processing apparatus including a plasma processing chamber including a plasma excitation electrode for exciting a plasma; a radiofrequency feeder, the plasma excitation electrode being connected to the output end of the radiofrequency feeder; a radiofrequency generator for supplying a radiofrequency voltage to the plasma excitation electrode; and a matching circuit having an input terminal and an output terminal, the input terminal being connected to the radiofrequency generator and the output terminal being connected to the input end of the radiofrequency feeder so as to achieve impedance matching between the plasma processing chamber and the radiofrequency generator, the method comprising:

calculating the absolute value of the difference $\Delta C_X$ between a loss capacitance $C_{X0}$ at a time $t_0$ and a loss capacitance $C_{X1}$ at a later time $t_1$ of the plasma processing chamber, the loss capacitances $C_{X0}$ and $C_{X1}$ being measured between the plasma excitation electrode and ground potential positions which are DC-grounded; and determining that the plasma processing apparatus maintains a required level of performance when the absolute value is less than an upper limit and that the plasma processing apparatus does not maintain the required level of performance when the absolute value is not less than the upper limit.

2. A performance evaluation method for a plasma processing apparatus according to claim 1, wherein the upper limit is 10% of the loss capacitance $C_{X0}$.

3. A performance evaluation method for a plasma processing apparatus according to claim 1, wherein the upper limit is 3% of the loss capacitance $C_{X0}$.

4. A performance evaluation method for a plasma processing apparatus according to claim 1, wherein a workpiece is introduced into the plasma processing chamber between the time $t_0$ and the later time $t_1$ to plasma-treat the workpiece.

5. A performance evaluation method for a plasma processing apparatus according to claim 1, wherein an adjustment work including overhaul, parts replacement, and assembly with alignment of the plasma processing chamber is performed between the time $t_0$ and the later time $t_1$.

6. A performance evaluation method for a plasma processing apparatus according to claim 1, wherein disassembly, transfer, and reassembly of the plasma processing chamber are performed between the time $t_0$ and the later time $t_1$.

7. A maintenance method for a plasma processing apparatus, wherein, when the absolute value of the difference $\Delta C_X$ is not less than the upper limit in the performance evaluation method according to claim 1, a corrective action for the loss capacitance $C_X$ is performed.

8. A plasma processing apparatus comprising: a plasma processing chamber including a plasma excitation electrode for exciting a plasma; a radiofrequency feeder, the plasma excitation electrode being connected to the output end of the radiofrequency feeder; a radiofrequency generator for supplying a radiofrequency voltage to the plasma excitation electrode; and a matching circuit having an input terminal and an output terminal, the input terminal being connected to the radiofrequency generator and the output terminal being connected to the input end of the radiofrequency feeder so as to achieve impedance matching between the plasma processing chamber and the radiofrequency generator, wherein the absolute value of the difference $\Delta C_X$ between a loss capacitance $C_{X0}$ at a time $t_0$ and a loss capacitance $C_{X1}$ at a later time $t_1$ is maintained to be less than an upper limit wherein the loss capacitances $C_{X0}$ and $C_{X1}$ are measured between the plasma excitation electrode and ground potential positions which are DC-grounded.

9. A plasma processing apparatus according to claim 8, wherein the absolute value of the difference $\Delta C_X$ is maintained to be less than the upper limit by performing a corrective action of the plasma electrode capacitance when the absolute value of the difference $\Delta C_X$ is not less than the upper limit.

10. A performance validation system for a plasma processing apparatus, the performance validation system comprising:

a plasma processing apparatus comprising a plasma processing chamber including a plasma excitation electrode for exciting a plasma; a radiofrequency feeder, the plasma excitation electrode being connected to the output end of the radiofrequency feeder; a radiofrequency generator for supplying a radiofrequency voltage to the plasma excitation electrode; and a matching circuit having an input terminal and an output terminal, the input terminal being connected to the radiofrequency generator and the output terminal being connected to the input end of the radiofrequency feeder so as to achieve impedance matching between the plasma processing chamber and the radiofrequency generator, wherein the absolute value of the difference $\Delta C_X$ between a loss capacitance $C_{X0}$ at a time $t_0$ and a loss capacitance $C_{X1}$ at a later time $t_1$ is maintained to be less than an upper limit wherein the loss capacitances $C_{X0}$ and $C_{X1}$ are measured between the plasma excitation electrode and ground potential positions which are DC-grounded; and a customer terminal, an engineer terminal, and information providing means, wherein the customer terminal requests browsing of performance information at the time $t_0$ and the later time $t_1$ of the plasma processing apparatus to the information providing means via a public line, the performance information is uploaded by a maintenance engineer to the information providing means through the engineer terminal, and the information providing means provides the performance information uploaded from the engineer terminal to the customer terminal upon the request from the customer terminal.

* * * * *

UNITED STATES PATENT AND TRADEMARK OFFICE
CERTIFICATE OF CORRECTION

PATENT NO. : 6,701,202 B2
DATED : March 2, 2004
INVENTOR(S) : Nakano et al.

It is certified that error appears in the above-identified patent and that said Letters Patent is hereby corrected as shown below:

Title page,
Item [54], Title, change "PERFORMANCE EVALUATION METHOD FOR PLASMA PROCESSING APPARATUS" to -- PERFORMANCE EVALUATION METHOD FOR PLASMA APPARATUS --.
Item [73], Assignee, please add -- Tadahiro Ohmi (JP) --

Signed and Sealed this

Ninth Day of August, 2005

JON W. DUDAS
*Director of the United States Patent and Trademark Office*